US011877408B2

(12) United States Patent
Merenda

(10) Patent No.: US 11,877,408 B2
(45) Date of Patent: Jan. 16, 2024

(54) WATERPROOF STORAGE SYSTEM

(71) Applicant: ADVANCE ACCESS TECHNOLOGIES LLC, New York, NY (US)

(72) Inventor: John T. Merenda, Brooklyn, NY (US)

(73) Assignee: ADVANCED ACCESS TECHNOLOGIES LLC, Brooklyn, NY (US)

( * ) Notice: Subject to any disclaimer, the term of this patent is extended or adjusted under 35 U.S.C. 154(b) by 1250 days.

(21) Appl. No.: 16/358,479

(22) Filed: Mar. 19, 2019

(65) Prior Publication Data

US 2019/0215971 A1 Jul. 11, 2019

Related U.S. Application Data

(60) Division of application No. 14/926,013, filed on Oct. 29, 2015, now Pat. No. 10,237,990, which is a
(Continued)

(51) Int. Cl.
*H05K 5/00* (2006.01)
*B60R 11/02* (2006.01)
(Continued)

(52) U.S. Cl.
CPC ............ *H05K 5/0086* (2013.01); *A45C 11/00* (2013.01); *A45C 13/02* (2013.01); *A45F 5/004* (2013.01);
(Continued)

(58) Field of Classification Search
CPC ....... H05K 5/0086; A45C 11/00; A45C 13/02; A45F 5/004; B60R 11/02; B65H 75/4449;
(Continued)

(56) References Cited

U.S. PATENT DOCUMENTS

| 1,446,410 A | 2/1923 | Bennett et al. |
| 1,904,000 A | 4/1933 | Hoyt |

(Continued)

FOREIGN PATENT DOCUMENTS

| CN | 2414555 Y | 1/2001 |
| CN | 2445522 Y | 8/2001 |

(Continued)

OTHER PUBLICATIONS

IPOD® Player Case with Retrable Stero, <URL:http://www.amazon.com/ipd%ae-player-retractable-stereo-hadphones/dp/b000bt27mo>, retrieved from Internet on May 17, 2012.
(Continued)

*Primary Examiner* — Chun Hoi Cheung
(74) *Attorney, Agent, or Firm* — H&I PARTNERS; C. Andrew Im; Jean-Christophe Hamann

(57) ABSTRACT

A waterproof storage system includes a protective housing member configured to mate with a handheld electronic device. The protective housing member includes at least one accessory station. The accessory station is configured to form between a surface of the protective housing member and a surface of at least one accessory item of the handheld electronic device. The protective housing member includes first and second housing parts. At least one sealing element positioned between the first and second housing parts provides a waterproof seal to protect the components of the waterproof storage system.

9 Claims, 52 Drawing Sheets

Related U.S. Application Data continuation-in-part of application No. 14/740,179, filed on Jun. 15, 2015, now Pat. No. 9,392,349, which is a continuation-in-part of application No. 14/711,735, filed on May 13, 2015, now Pat. No. 9,313,905, which is a continuation of application No. 14/503,467, filed on Oct. 1, 2014, now Pat. No. 9,065,921, which is a continuation of application No. 14/182,645, filed on Feb. 18, 2014, now Pat. No. 8,879,773, which is a continuation of application No. PCT/US2013/038599, filed on Apr. 29, 2013, and a continuation of application No. 13/872,157, filed on Apr. 29, 2013, now Pat. No. 8,774,446, which is a continuation-in-part of application No. 29/430,245, filed on Aug. 23, 2012, now Pat. No. Des. 698,772, said application No. PCT/US2013/038599 is a continuation-in-part of application No. 29/430,245, which is a continuation-in-part of application No. 29/417,184, filed on Mar. 30, 2012, now Pat. No. Des. 667,823.

(60) Provisional application No. 62/072,374, filed on Oct. 29, 2014, provisional application No. 62/012,334, filed on Jun. 14, 2014, provisional application No. 61/639,968, filed on Apr. 29, 2012.

(51) Int. Cl.
| | |
|---|---|
| *A45F 5/00* | (2006.01) |
| *G06F 1/16* | (2006.01) |
| *A45C 11/00* | (2006.01) |
| *B65H 75/44* | (2006.01) |
| *H04M 1/02* | (2006.01) |
| *H04M 1/15* | (2006.01) |
| *H04R 1/10* | (2006.01) |
| *A45C 13/02* | (2006.01) |
| *H04M 1/18* | (2006.01) |
| *H04M 1/60* | (2006.01) |
| *H02J 7/34* | (2006.01) |

(52) U.S. Cl.
CPC .......... *B60R 11/02* (2013.01); *B65H 75/4431* (2013.01); *B65H 75/4434* (2013.01); *B65H 75/4449* (2013.01); *G06F 1/1658* (2013.01); *H04M 1/0258* (2013.01); *H04M 1/15* (2013.01); *H04R 1/1033* (2013.01); *A45C 2011/002* (2013.01); *A45C 2011/003* (2013.01); *A45C 2013/025* (2013.01); *B65H 2701/3919* (2013.01); *H02J 7/342* (2020.01); *H04M 1/185* (2013.01); *H04M 1/6058* (2013.01); *H04R 1/1025* (2013.01)

(58) Field of Classification Search
CPC ............ B65H 75/4431; B65H 75/4434; G06F 1/1658; H04M 1/0258; H04M 1/15; H04R 1/1033
USPC .................................................. 206/320, 305
See application file for complete search history.

(56) References Cited

U.S. PATENT DOCUMENTS

| | | | |
|---|---|---|---|
| 1,958,626 A | 5/1934 | Krantz | |
| 2,013,733 A | 9/1935 | Murphy | |
| 2,211,561 A | 8/1940 | Flannelly | |
| 2,438,515 A | 3/1948 | Mohler | |
| 2,518,071 A | 8/1950 | Rushworth | |
| 2,521,226 A | 9/1950 | Keller | |
| 3,061,234 A | 10/1962 | Morey | |
| 3,144,218 A | 8/1964 | Tepe | |
| 3,374,319 A | 3/1968 | Stahmer | |
| 3,657,491 A | 4/1972 | Ryder et al. | |
| 3,773,987 A | 11/1973 | Davis et al. | |
| 3,782,654 A | 1/1974 | Kasa | |
| 3,984,645 A | 10/1976 | Kresch | |
| 4,384,688 A | 5/1983 | Smith | |
| 4,584,718 A | 4/1986 | Fuller | |
| 4,646,987 A | 3/1987 | Peterson | |
| 4,754,484 A | 6/1988 | Larkin et al. | |
| D301,034 S | 5/1989 | Fujita et al. | |
| 4,942,617 A | 7/1990 | Boylan | |
| 4,989,805 A | 2/1991 | Burke | |
| 5,332,171 A | 7/1994 | Steff | |
| 5,388,155 A | 2/1995 | Smith | |
| 5,422,957 A | 6/1995 | Cummins | |
| 5,511,390 A * | 4/1996 | Mah .................. | A44C 25/00 206/38.1 |
| 5,684,883 A | 11/1997 | Chen | |
| 5,706,353 A | 1/1998 | Arai et al. | |
| 5,724,667 A | 3/1998 | Furuno | |
| D397,246 S | 8/1998 | Hoofnagle et al. | |
| D414,178 S | 9/1999 | Loubert et al. | |
| D427,170 S | 6/2000 | Edwards et al. | |
| D434,739 S | 12/2000 | Hanna et al. | |
| 6,301,487 B1 | 10/2001 | Nakamura | |
| 6,374,126 B1 | 4/2002 | MacDonald, Jr. et al. | |
| 6,438,248 B1 | 8/2002 | Kamimura et al. | |
| 6,439,491 B1 | 8/2002 | Liao | |
| 6,542,757 B2 * | 4/2003 | Bae .................. | H04M 1/15 379/430 |
| RE38,211 E | 8/2003 | Peterson et al. | |
| 6,633,770 B1 * | 10/2003 | Gitzinger .................. | H04M 1/04 224/667 |
| 6,644,582 B1 | 11/2003 | Liao | |
| 6,659,274 B2 * | 12/2003 | Enners .................. | G06F 1/1626 206/811 |
| 6,712,304 B1 | 3/2004 | Taylor | |
| 6,731,956 B2 * | 5/2004 | Hanna .................. | H04M 1/15 379/433.02 |
| 6,733,328 B2 | 5/2004 | Lin et al. | |
| 6,736,346 B1 | 5/2004 | Park | |
| 6,808,138 B2 | 10/2004 | Liao | |
| 6,834,820 B2 | 12/2004 | Wei | |
| 6,851,530 B2 | 2/2005 | Wei | |
| 6,866,219 B2 | 3/2005 | We | |
| 6,871,812 B1 | 3/2005 | Chang | |
| D510,722 S | 10/2005 | Kosiba et al. | |
| 7,001,210 B1 | 2/2006 | Chiang | |
| 7,032,728 B2 | 4/2006 | Harcourt | |
| 7,086,512 B2 * | 8/2006 | Shack .................. | H04M 1/15 242/379 |
| 7,151,912 B1 | 12/2006 | Morrison | |
| 7,180,735 B2 * | 2/2007 | Thomas .................. | G06F 1/182 361/679.56 |
| D543,197 S | 5/2007 | Loughnane | |
| 7,216,665 B1 | 5/2007 | Sims, Jr. | |
| D551,846 S | 10/2007 | Ko et al. | |
| D559,826 S | 1/2008 | Lee | |
| D560,911 S | 2/2008 | Hackbart et al. | |
| 7,399,198 B2 | 7/2008 | Thalheimer et al. | |
| D574,819 S | 8/2008 | Andre et al. | |
| 7,523,883 B2 | 4/2009 | Cheng | |
| D603,603 S | 11/2009 | Laine et al. | |
| 7,648,027 B2 | 1/2010 | Lin et al. | |
| D609,900 S | 2/2010 | Behar et al. | |
| D611,251 S | 3/2010 | Charlwood | |
| 7,681,822 B2 | 3/2010 | Tai | |
| D619,130 S | 7/2010 | Fellig | |
| D622,692 S | 8/2010 | McWilliam et al. | |
| D622,716 S | 8/2010 | Andre et al. | |
| 7,784,727 B1 | 8/2010 | Liao | |
| D623,180 S | 9/2010 | Diebel | |
| D624,114 S | 9/2010 | Ausems et al. | |
| 7,802,746 B2 | 9/2010 | Ito et al. | |
| 7,822,448 B2 | 10/2010 | Lin et al. | |
| D635,131 S | 3/2011 | Roman | |
| 7,909,281 B2 | 3/2011 | Liao | |
| D639,052 S | 6/2011 | Fathollahi | |
| D654,068 S | 2/2012 | Monaco et al. | |

(56) References Cited

U.S. PATENT DOCUMENTS

| | | | |
|---|---|---|---|
| D654,483 S | 2/2012 | Richardson et al. | |
| D654,931 S | 2/2012 | Lemelman et al. | |
| 8,136,751 B2 | 3/2012 | Chen | |
| 8,265,325 B2 | 9/2012 | Park | |
| 8,365,887 B2* | 2/2013 | Fischer | B65H 75/4431 242/378.1 |
| 8,453,835 B2* | 6/2013 | So | A45C 11/22 206/811 |
| 2002/0023814 A1 | 2/2002 | Poutiatine | |
| 2002/0176571 A1* | 11/2002 | Louh | B60R 11/0241 379/455 |
| 2003/0096640 A1 | 5/2003 | Bae | |
| 2003/0157973 A1* | 8/2003 | Yang | H04M 1/15 455/569.1 |
| 2003/0224839 A1* | 12/2003 | Takahashi | H04M 1/15 455/575.2 |
| 2004/0094649 A1 | 5/2004 | Park | |
| 2004/0204165 A1* | 10/2004 | Huang | H04M 1/0258 455/575.1 |
| 2004/0256188 A1 | 12/2004 | Harcourt | |
| 2005/0109869 A1 | 5/2005 | Wei | |
| 2005/0220316 A1* | 10/2005 | Hsiang | H04B 1/385 381/86 |
| 2005/0255898 A1* | 11/2005 | Huang | H04B 1/3877 455/575.8 |
| 2006/0011763 A1 | 1/2006 | Kuo | |
| 2006/0058081 A1* | 3/2006 | Reichenbach | H04M 1/6058 455/575.8 |
| 2006/0281502 A1 | 12/2006 | Chang | |
| 2007/0165371 A1 | 7/2007 | Bradenburg | |
| 2007/0295850 A1 | 12/2007 | Lin | |
| 2008/0080732 A1* | 4/2008 | Sneed | H04R 1/1033 381/370 |
| 2009/0284216 A1* | 11/2009 | Bessa | H02J 7/0044 320/101 |
| 2009/0325648 A1* | 12/2009 | Shi | H04R 1/1075 455/575.2 |
| 2010/0279743 A1 | 11/2010 | Sim | |
| 2011/0031341 A1 | 2/2011 | He | |
| 2011/0130174 A1 | 6/2011 | Kroupa | |
| 2011/0139918 A1 | 6/2011 | Chen | |
| 2011/0170732 A1* | 7/2011 | Parker | H04R 1/1033 381/384 |
| 2011/0233078 A1* | 9/2011 | Monaco | A45C 11/00 206/223 |
| 2012/0114162 A1* | 5/2012 | Zheng | H04M 1/15 381/384 |
| 2012/0224739 A1 | 9/2012 | Cataldo et al. | |
| 2012/0225701 A1 | 9/2012 | Cataldo et al. | |
| 2013/0208937 A1* | 8/2013 | Stern | H04M 1/04 381/332 |
| 2013/0237290 A1 | 9/2013 | Simmons et al. | |
| 2013/0238829 A1* | 9/2013 | Laycock | H04R 1/1033 710/303 |

FOREIGN PATENT DOCUMENTS

| | | |
|---|---|---|
| CN | 2448037 Y | 9/2001 |
| CN | 2453619 Y | 10/2001 |
| CN | 2462624 Y | 11/2001 |
| CN | 2488233 Y | 4/2002 |
| CN | 2489532 Y | 5/2002 |
| CN | 2509787 Y | 9/2002 |
| CN | 2792050 Y | 6/2006 |
| CN | 2843005 Y | 11/2006 |
| CN | 101090278 A | 12/2007 |
| CN | 101090617 A | 12/2007 |
| CN | 201087963 Y | 7/2008 |
| CN | 201123116 Y | 9/2008 |
| CN | 201156758 Y | 11/2008 |
| CN | 101087316 B | 11/2011 |
| WO | 2013074154 A1 | 5/2013 |

OTHER PUBLICATIONS

EarGears Phone Case with Built-in Retractable Headphones, shipping for iPhone 4 platform beginning Apr. 2012, <URL:http://www.ear-gears.com/>.

Sangean DT-220A AM/FM Stereo Pocket Size Radio with Self-Storage Headphones, earliest customer review on Feb. 21, 2004 <URL: http://www.amazon.com/sangean-dt-220a-stereo-self-storage-headphones/dp/b00008aybf>.

Azeca Clip-On Bluetooth Headset with retractable earbud, posted on Mar. 15, 2012, <URL: http://thegeekchurch.com/wp-content/uploads/2012/03/azeca-retractable.png.

www.quirky.com/ideations/165787, Automatic Wire Retractor Phone Case, Mar. 29, 2012, 1 page.

Mophie.com, "juice pack" battery cases for iPhone, Jan. 23, 2012.

* cited by examiner

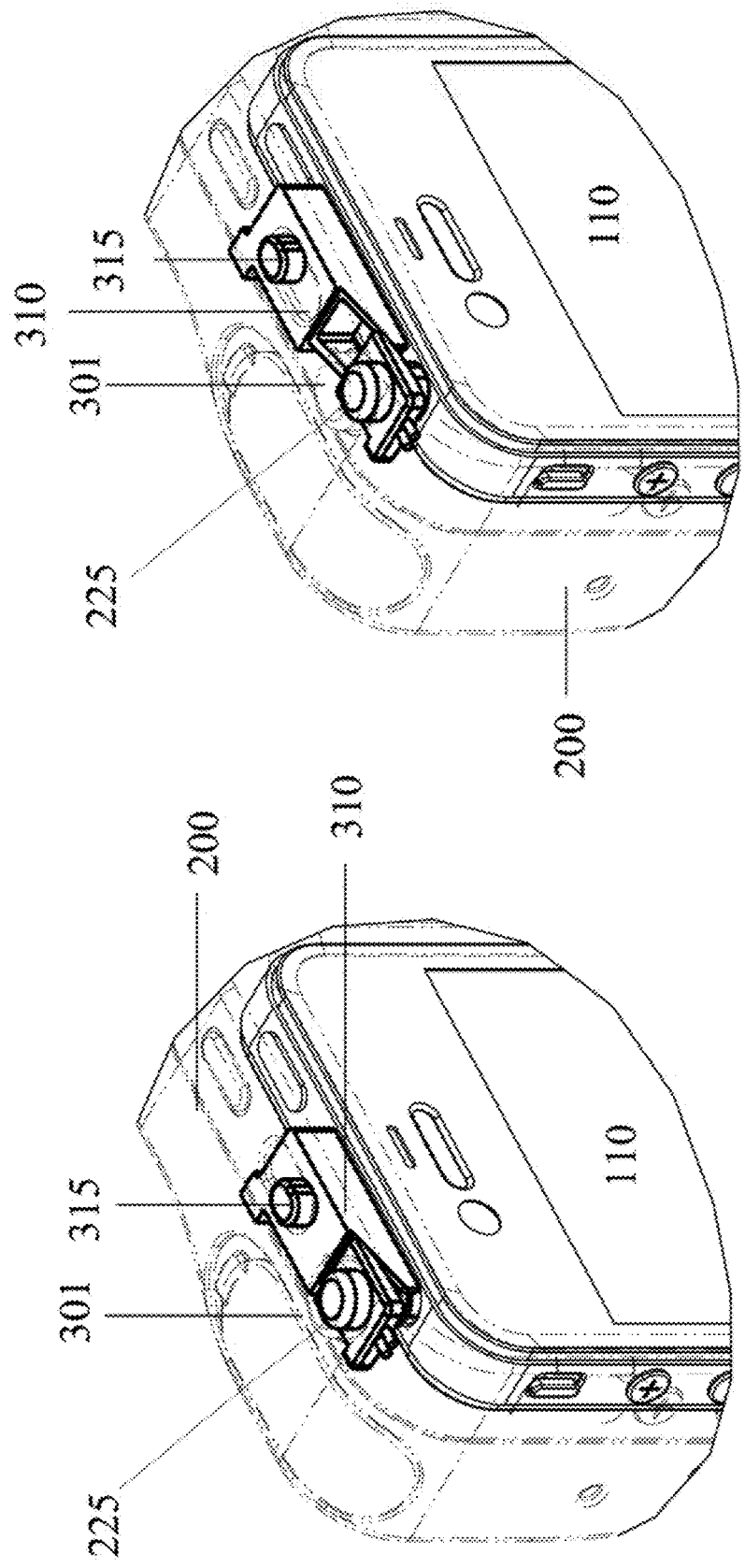

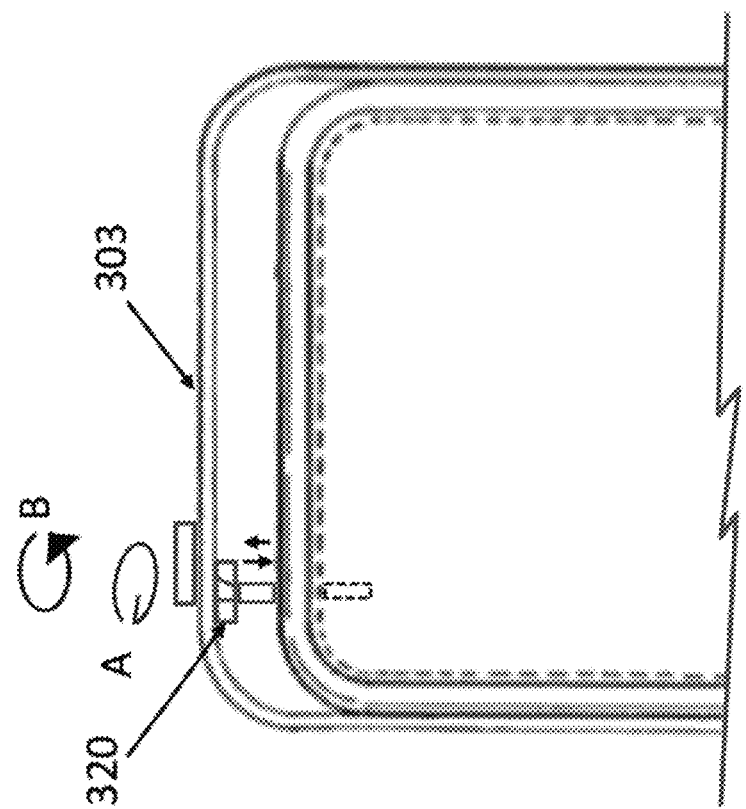
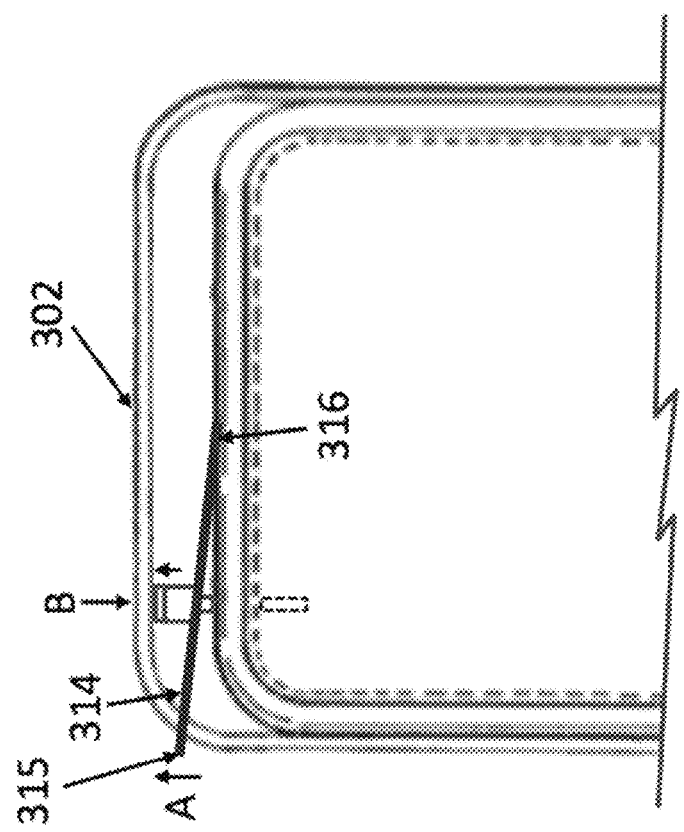

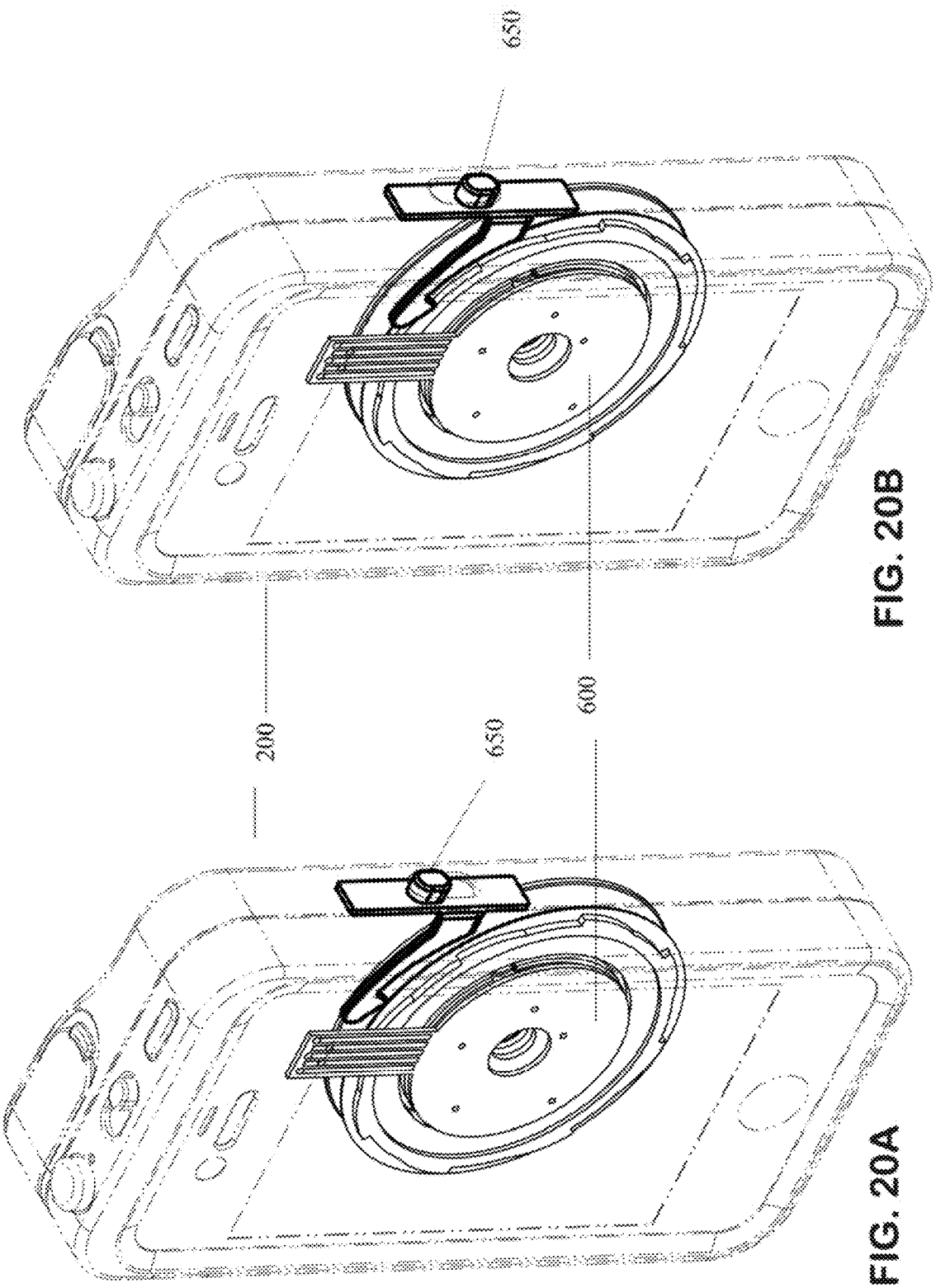

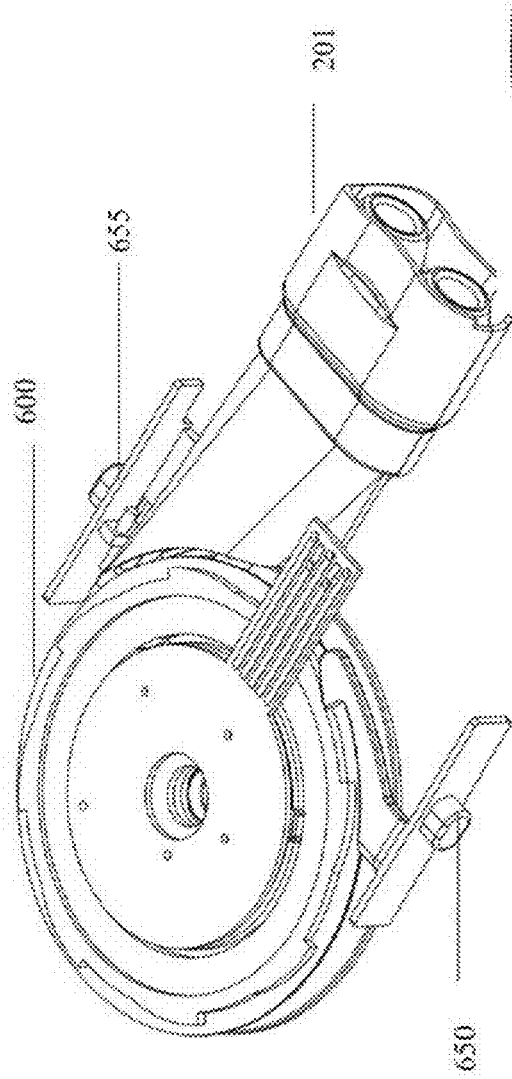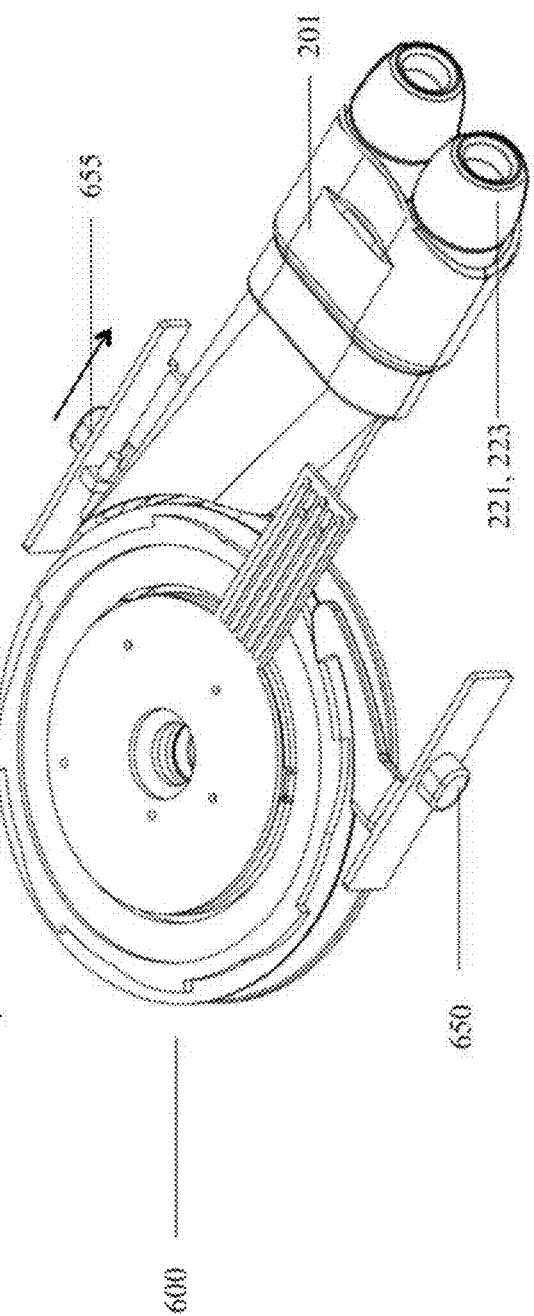

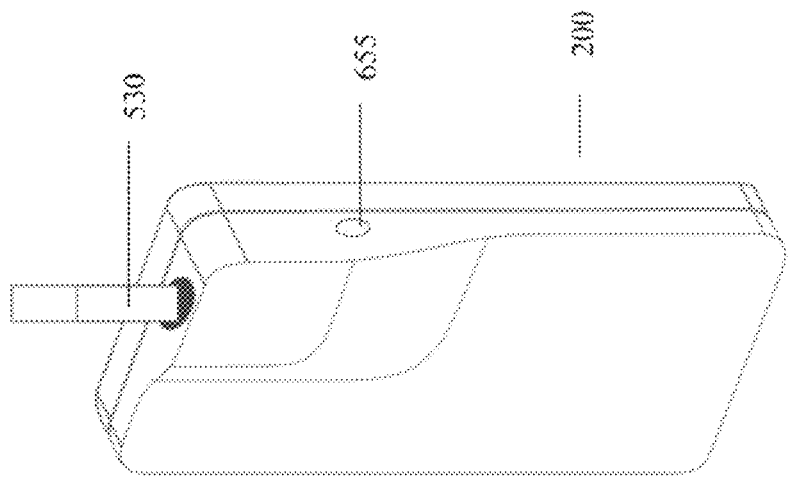
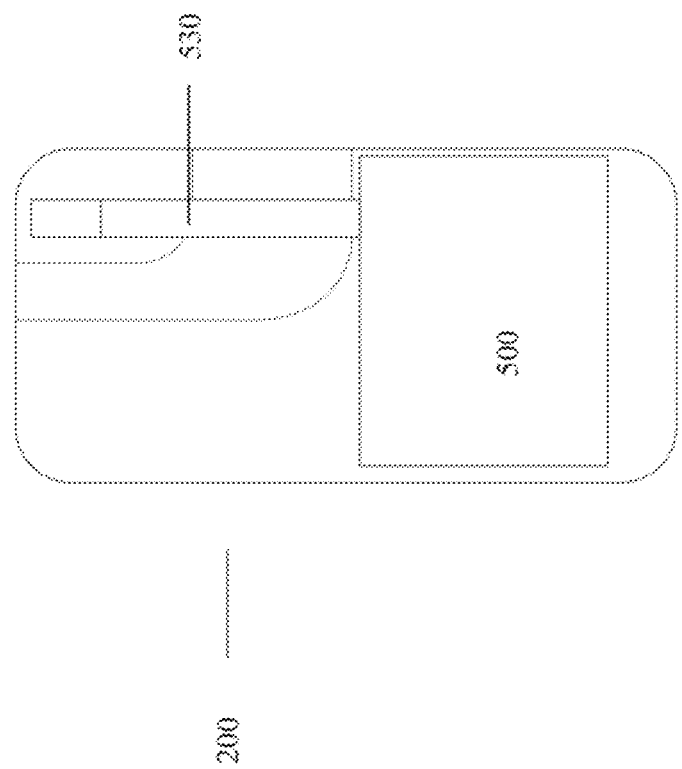

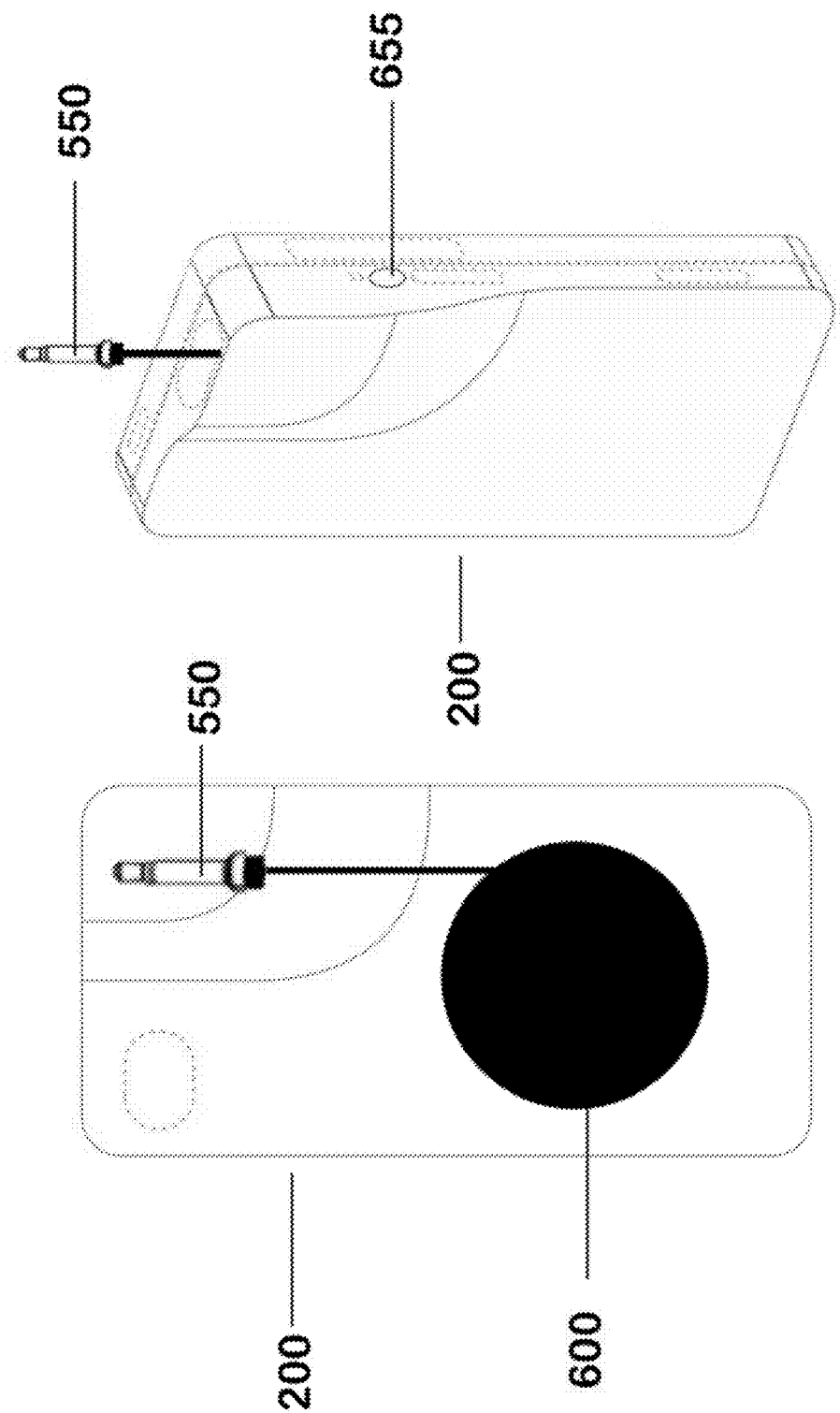

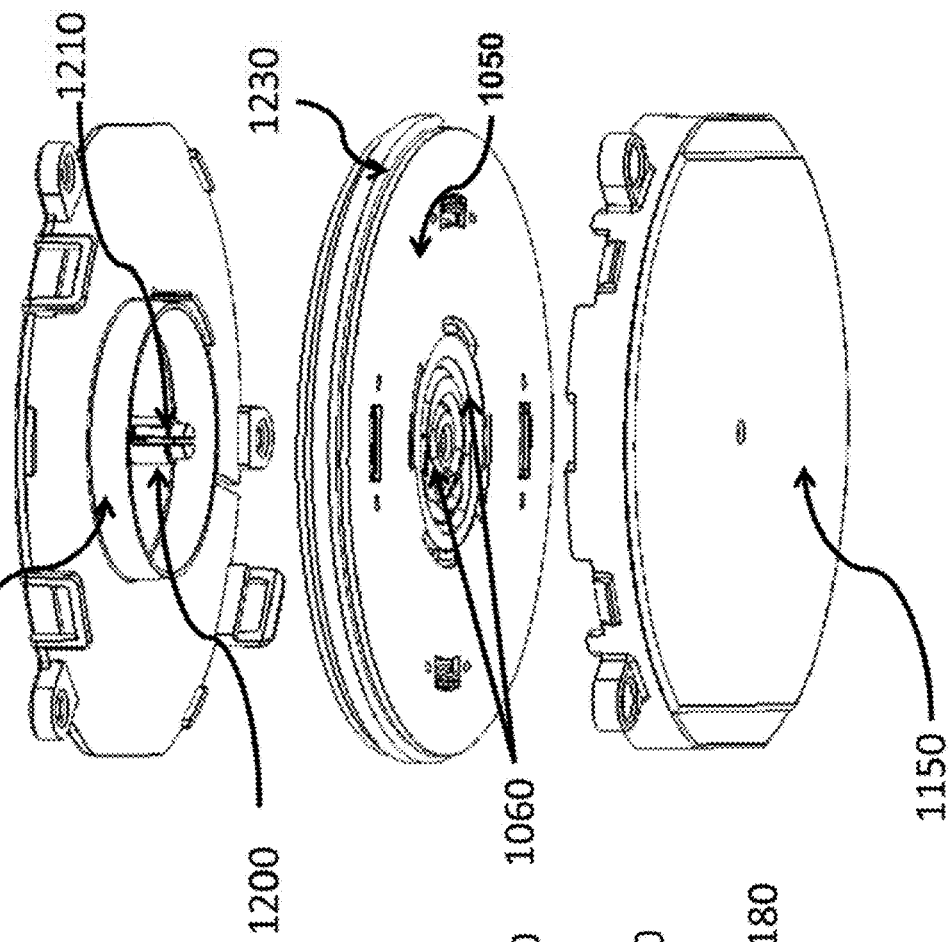
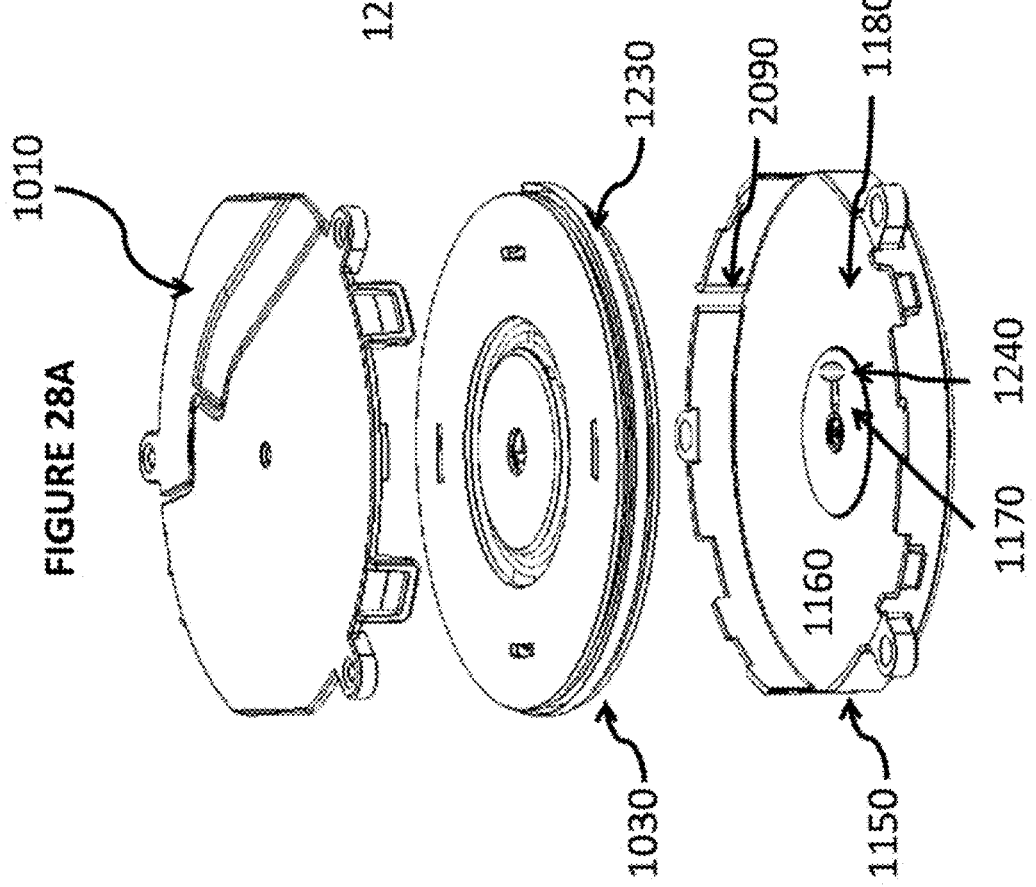

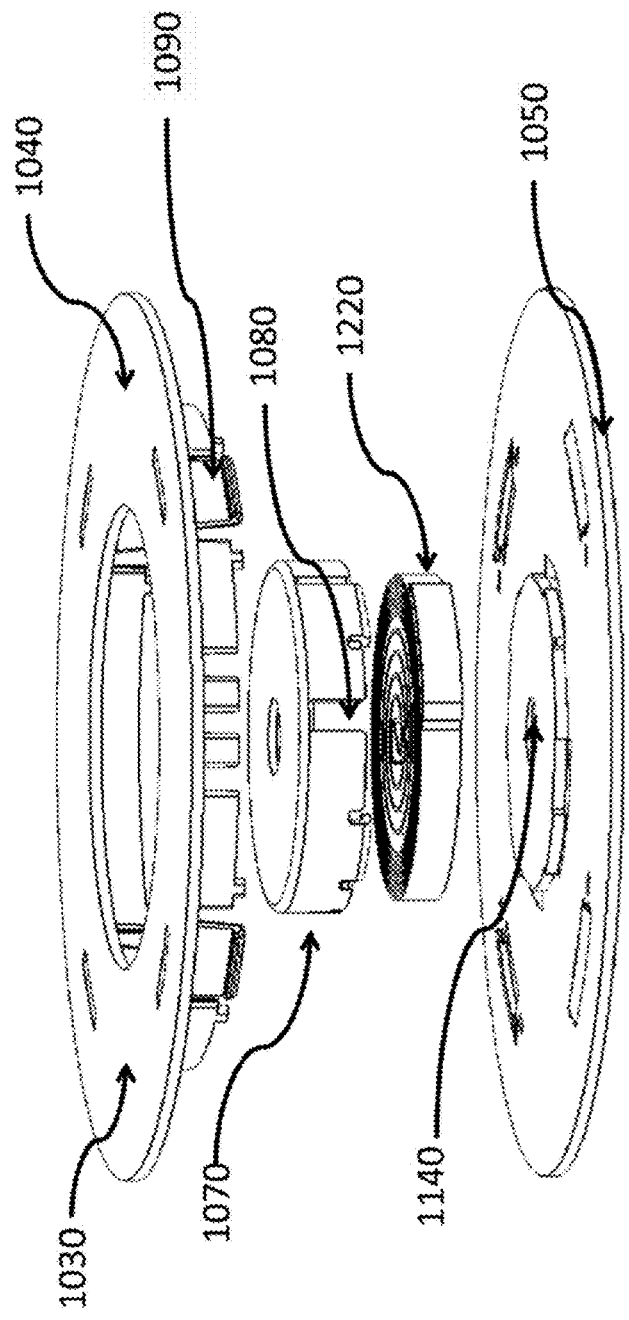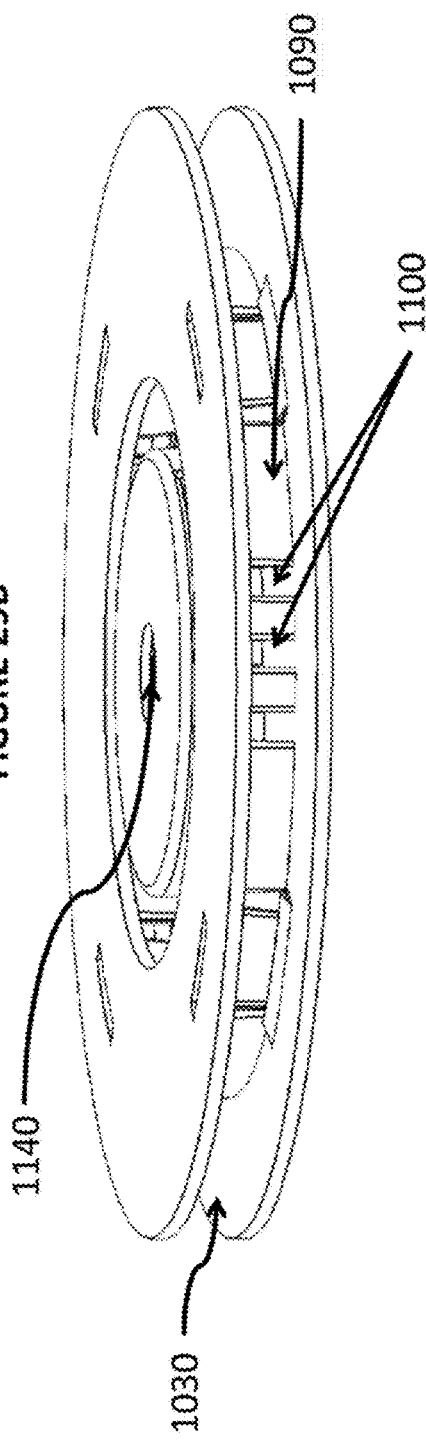

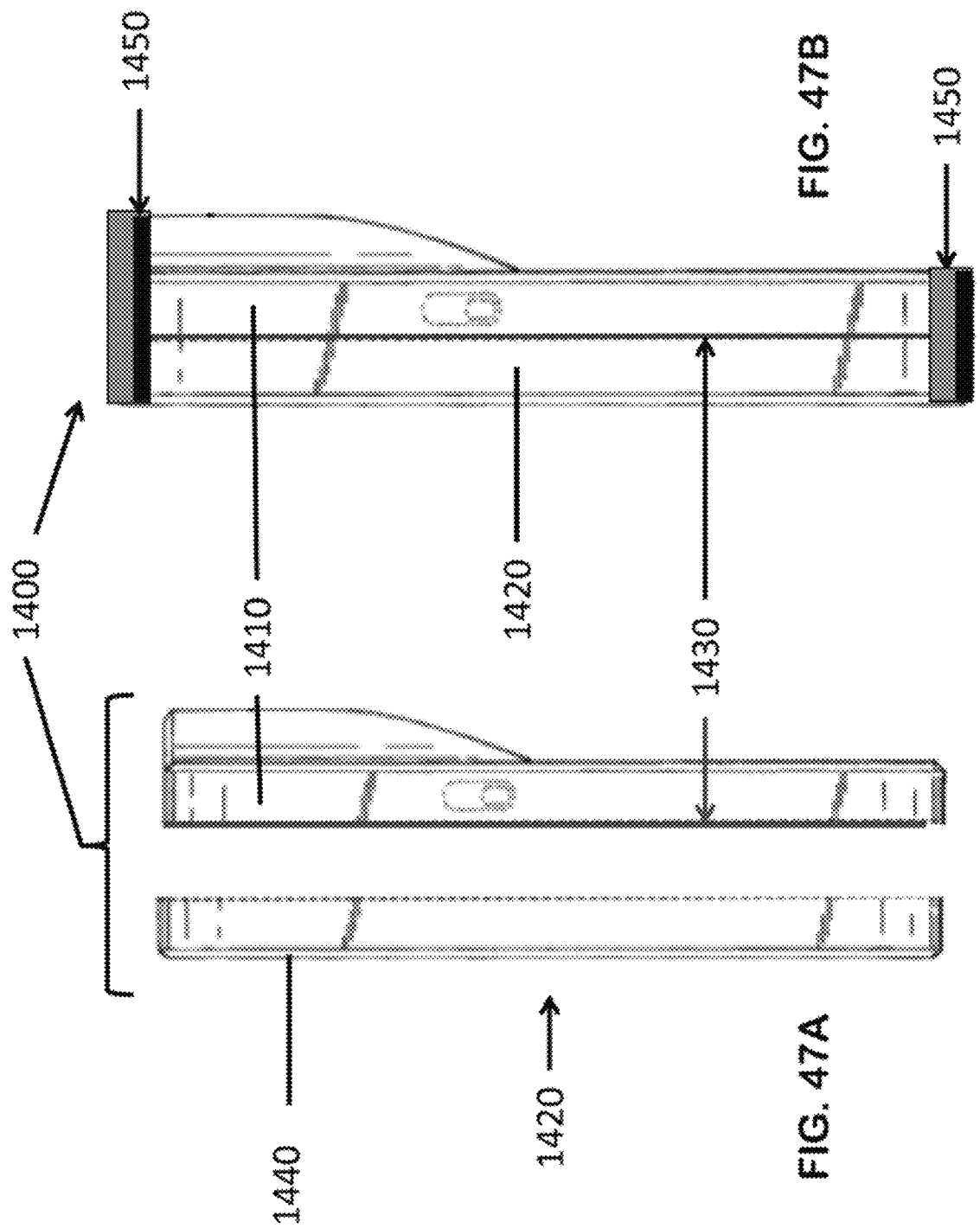

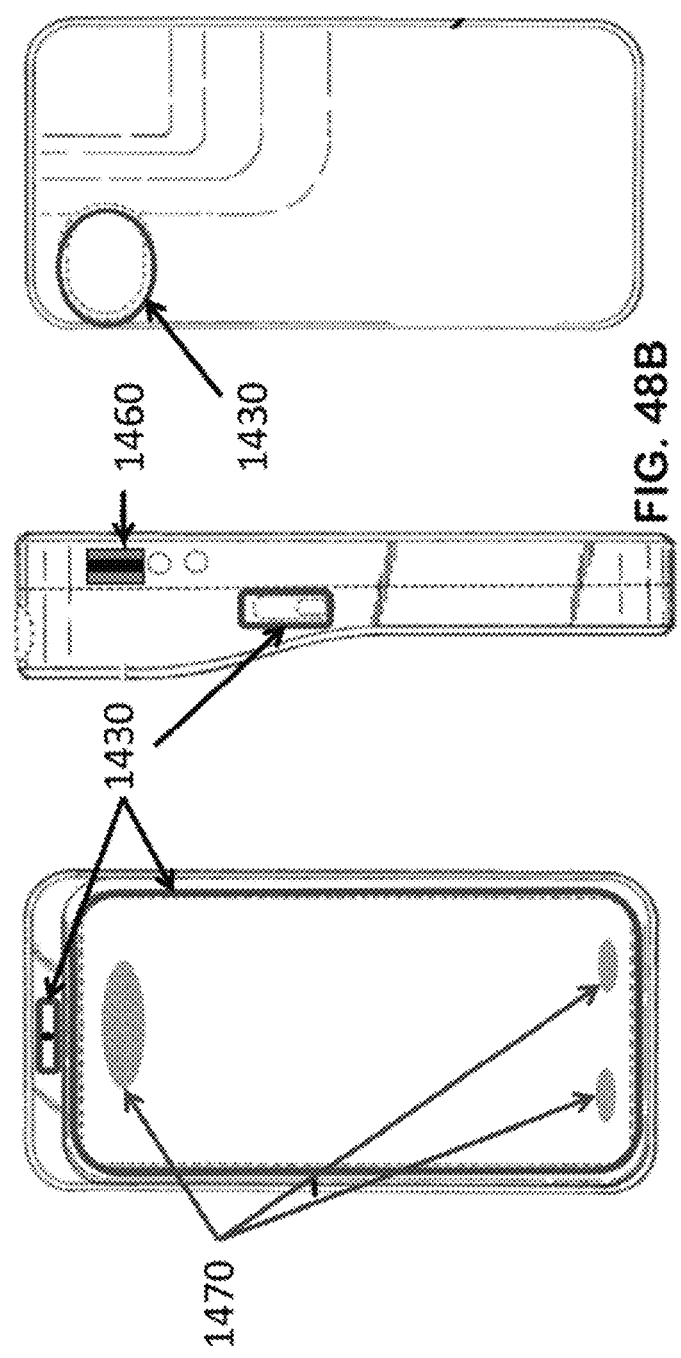
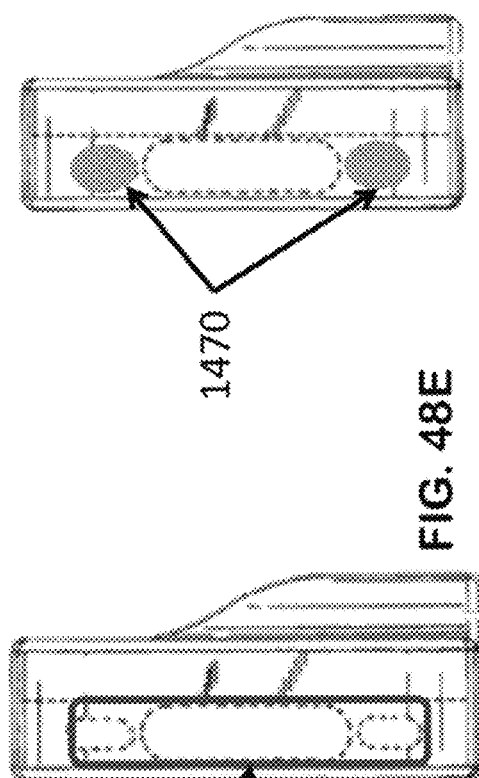
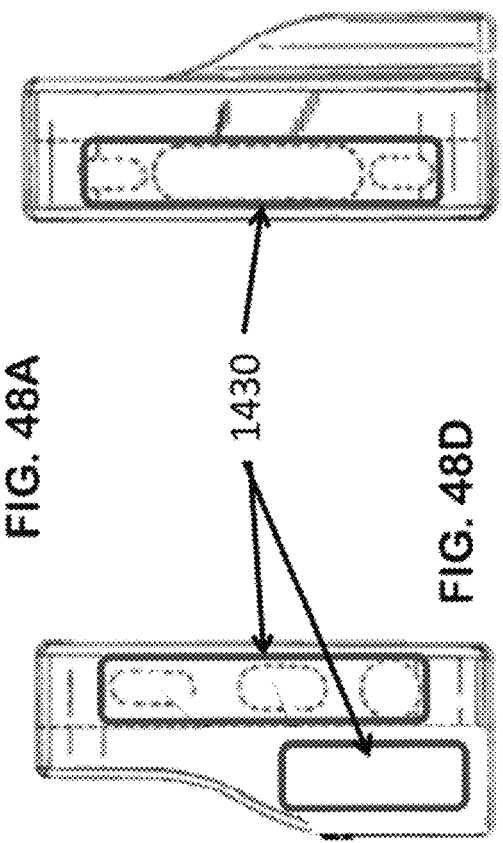
FIG. 48A  FIG. 48B  FIG. 48C
FIG. 48D  FIG. 48E  FIG. 48F

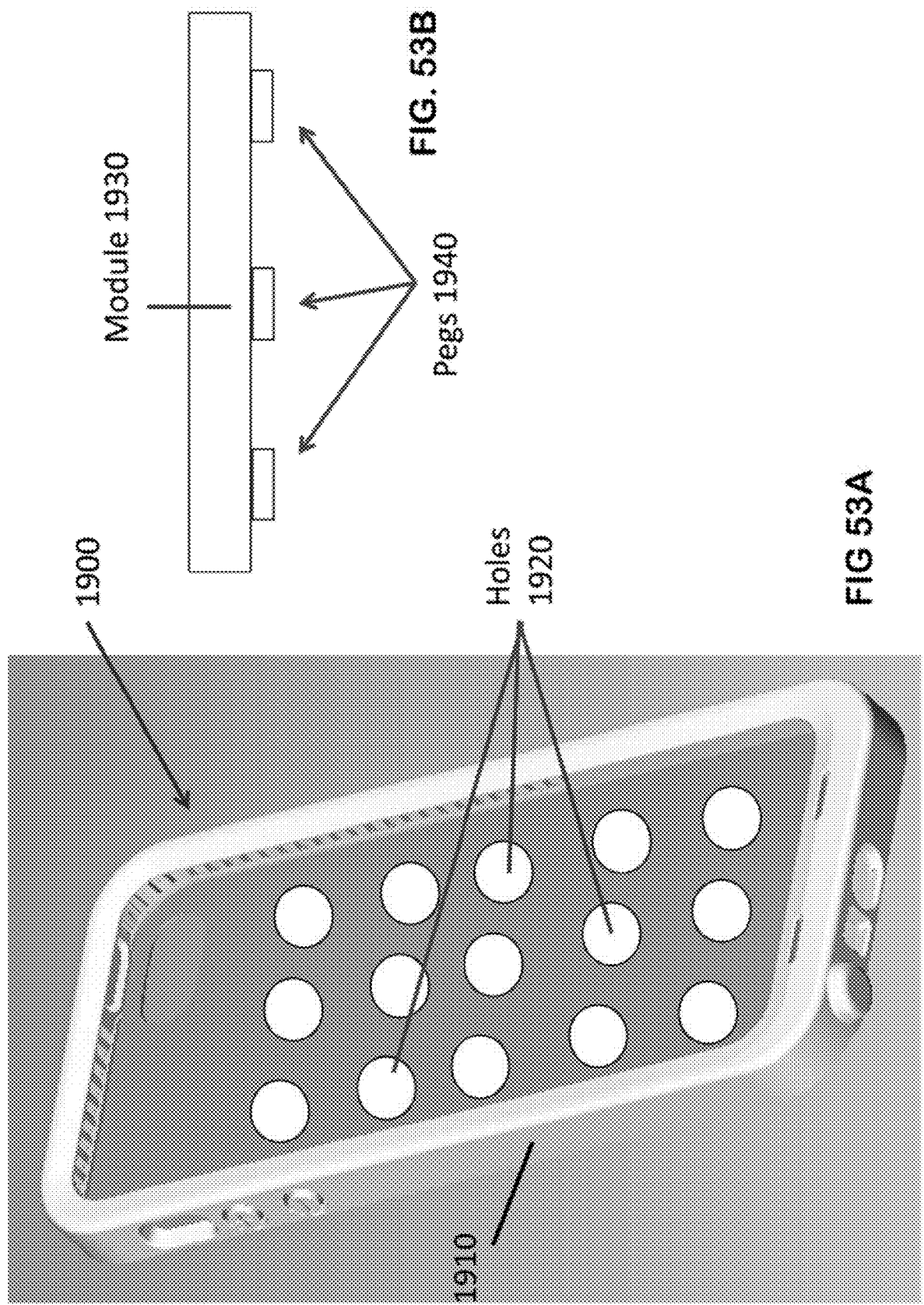

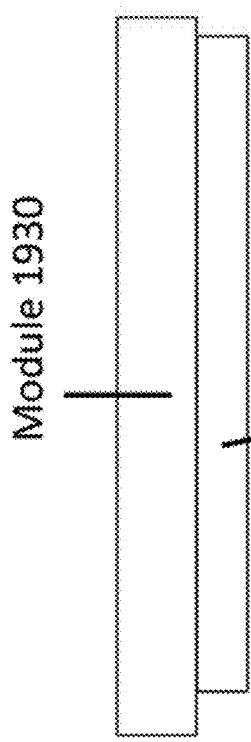
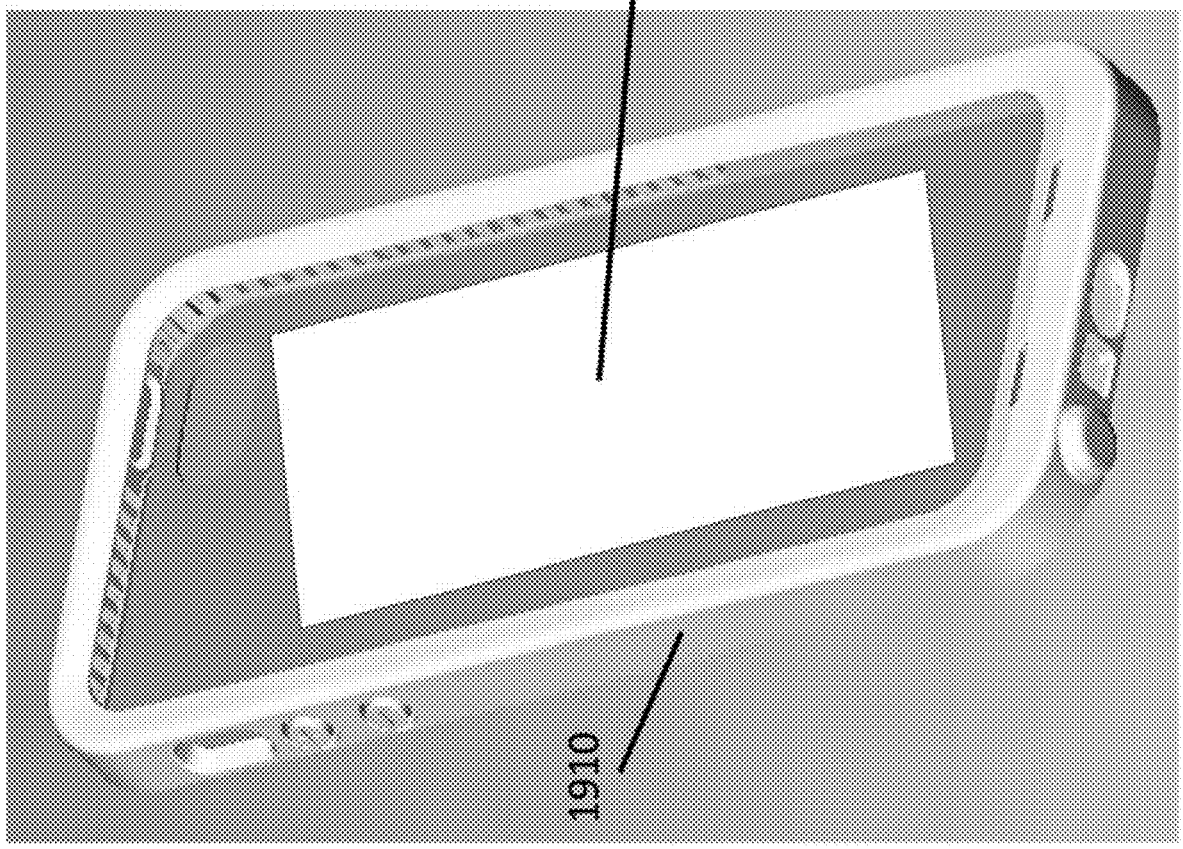
FIG. 54B
FIG. 54A

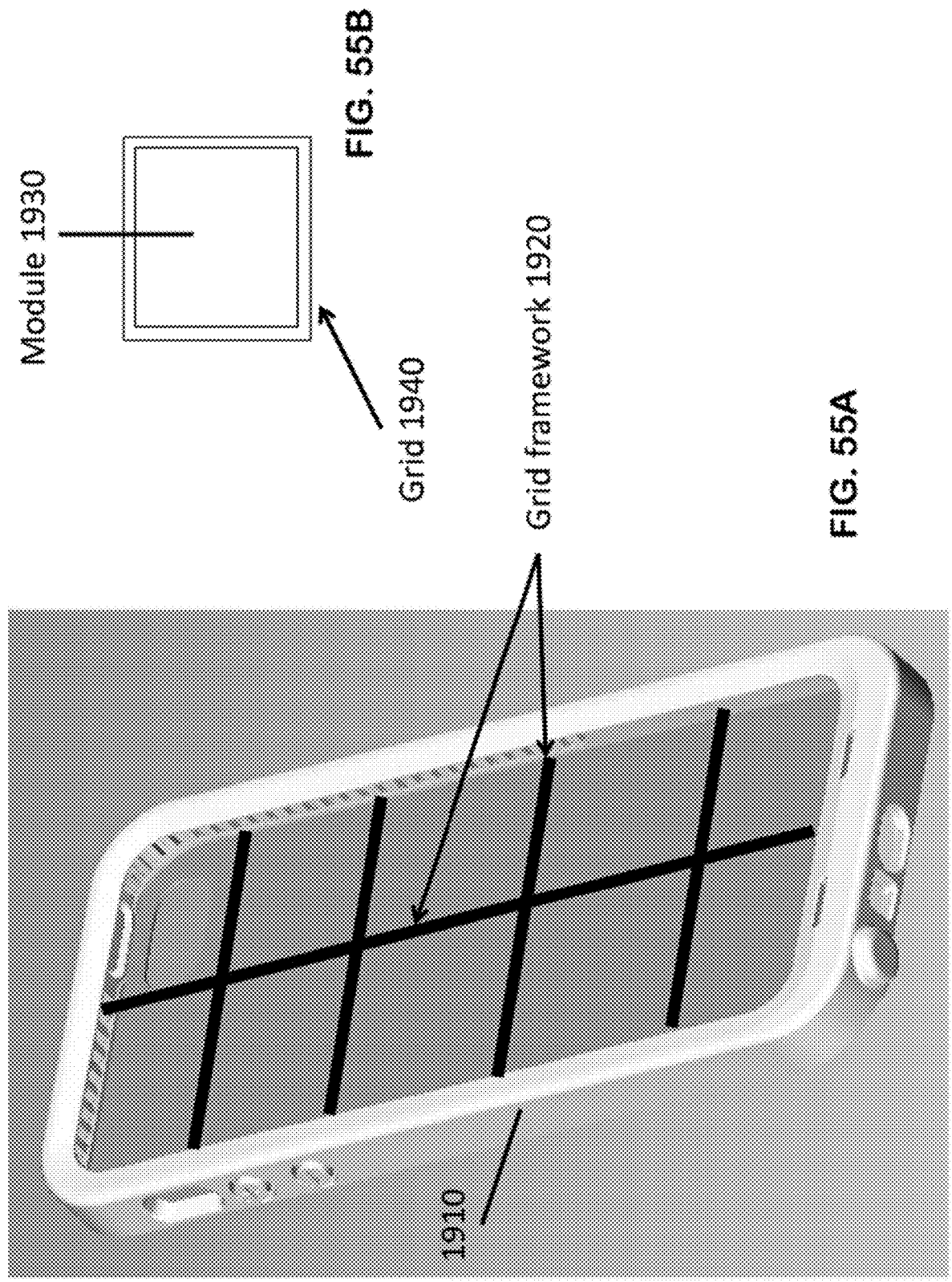

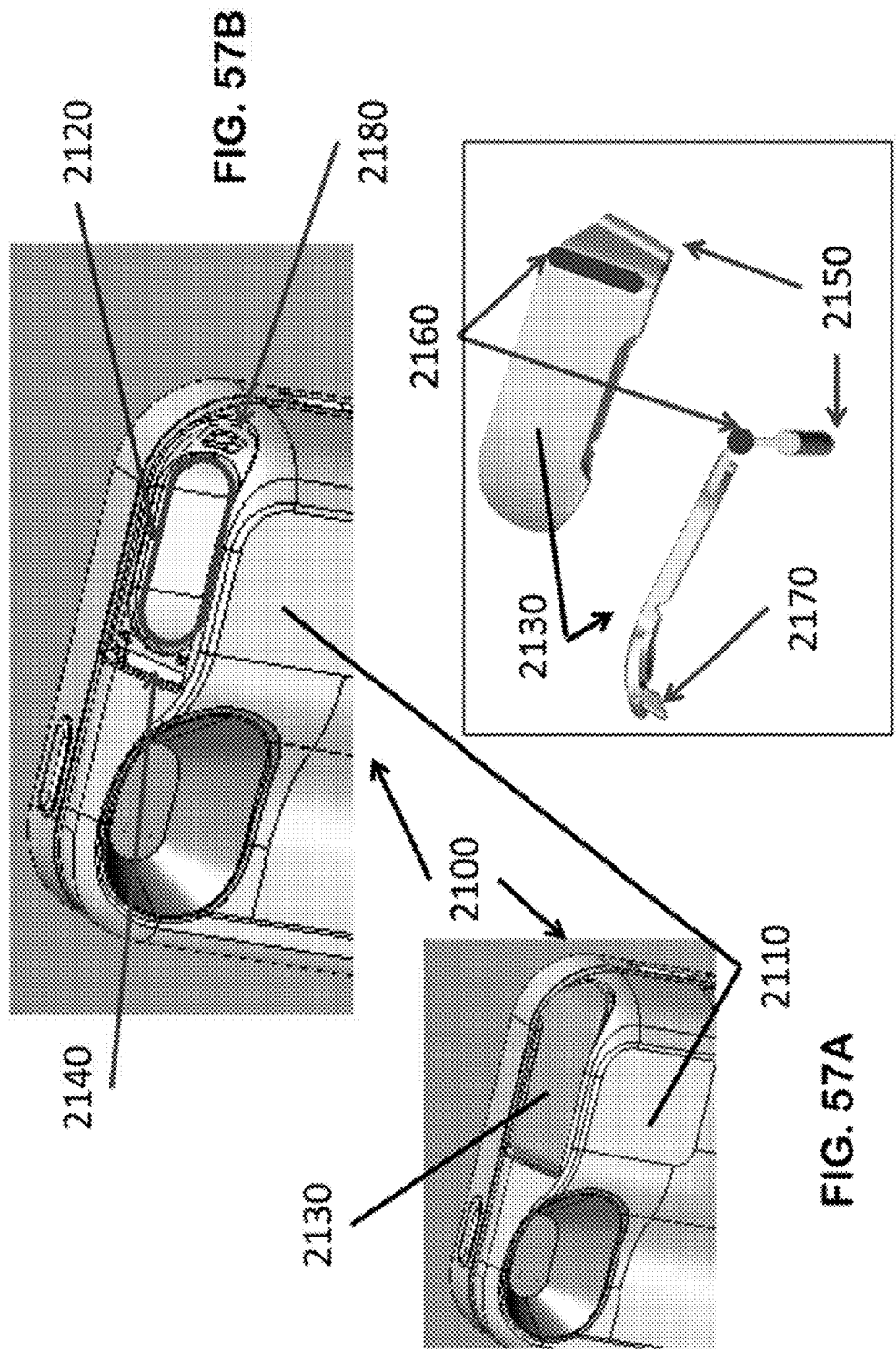

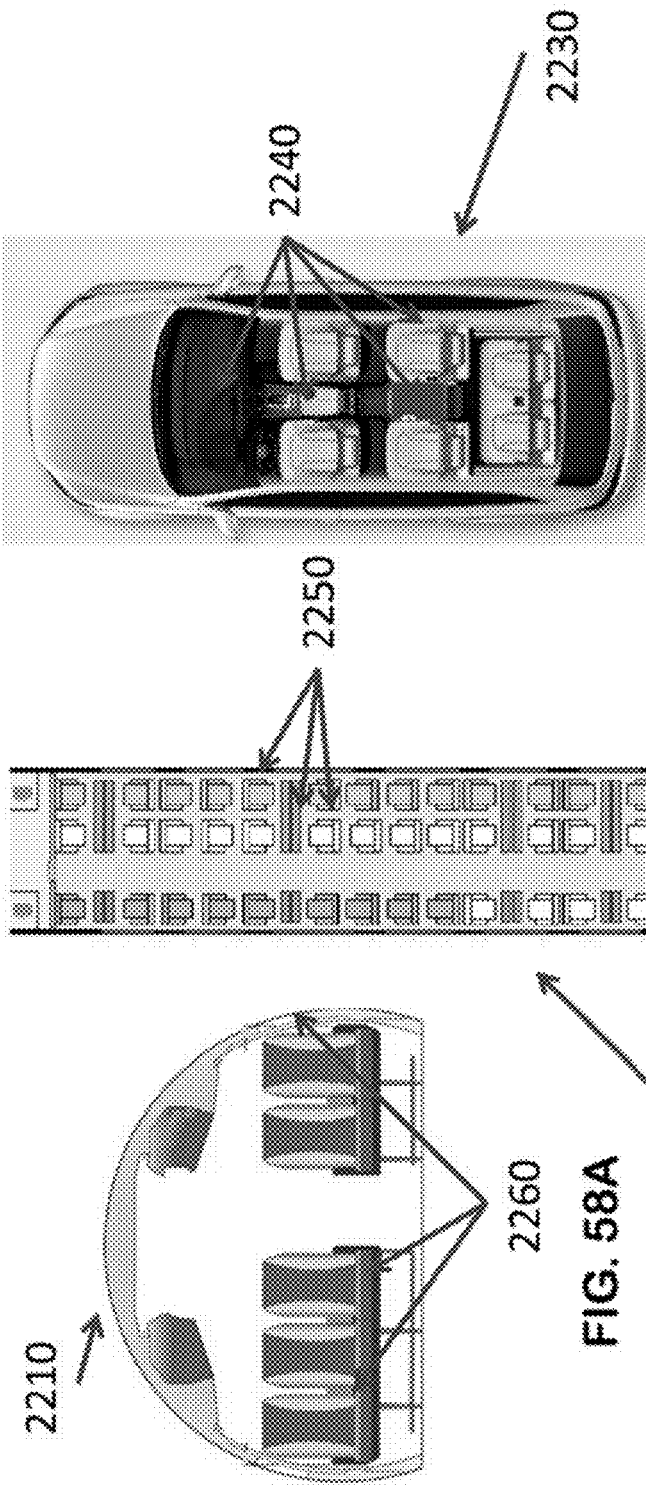
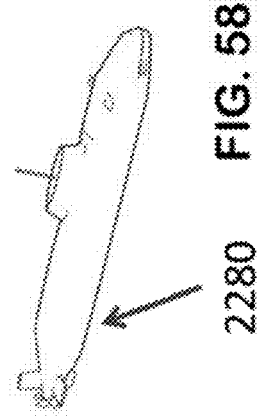
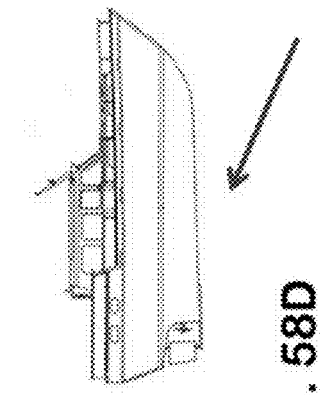

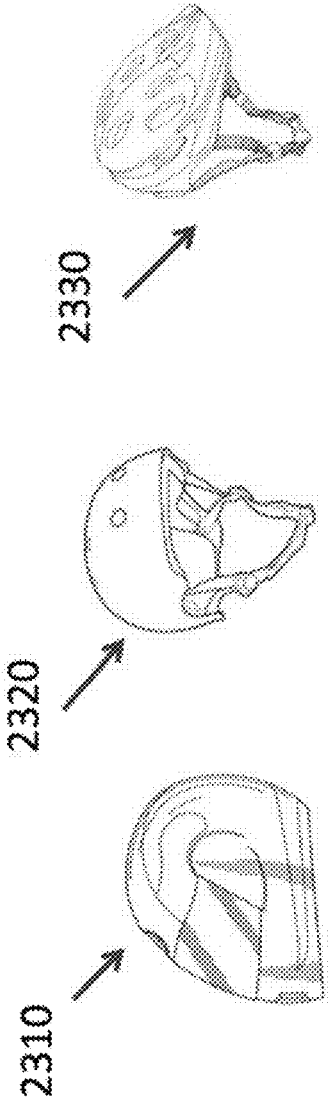
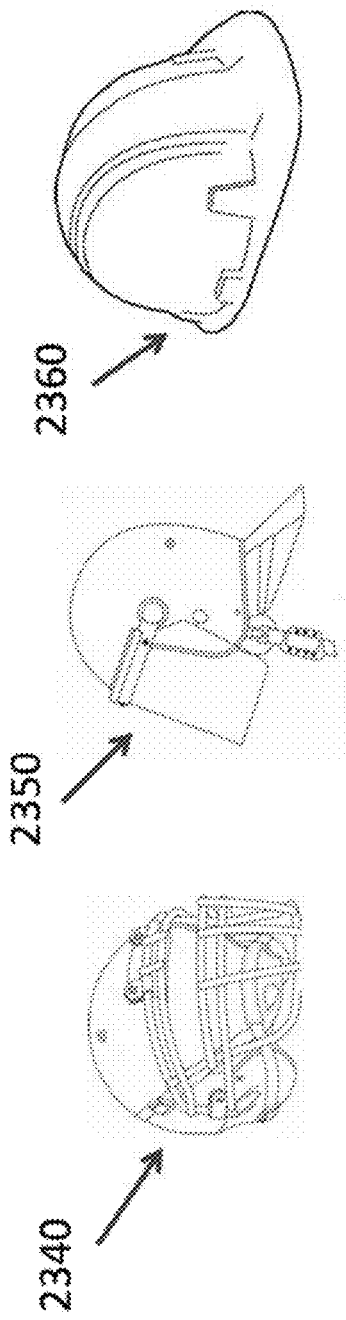

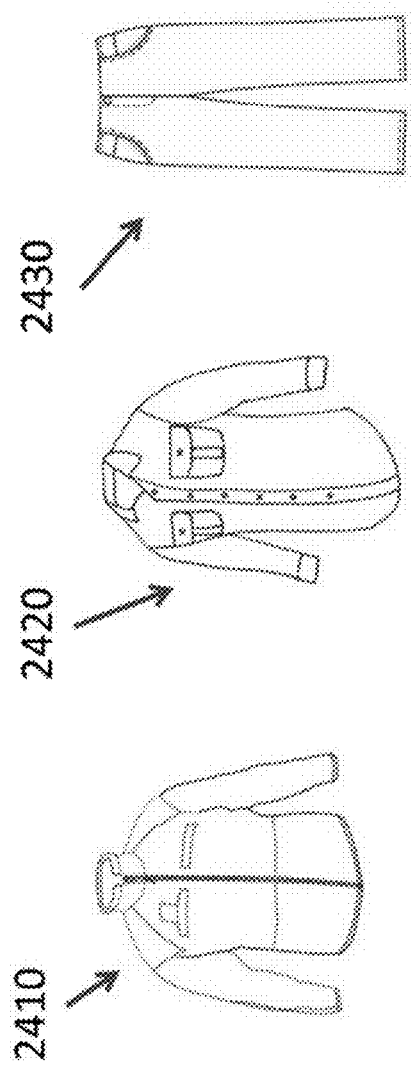
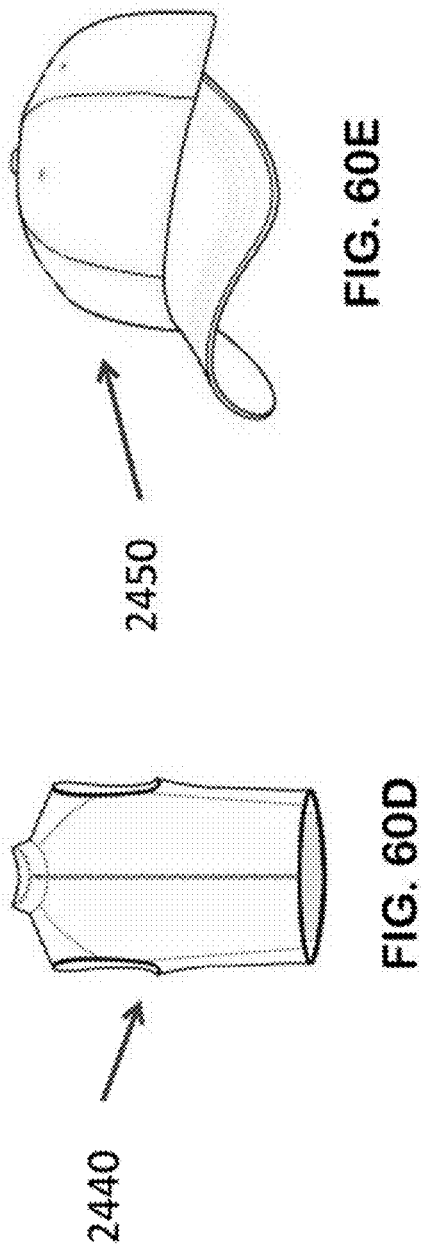

WATERPROOF STORAGE SYSTEM

RELATED APPLICATIONS

The present application is a divisional of U.S. application Ser. No. 14/926,013 filed Oct. 29, 2015, which claims the benefit of U.S. Provisional Application No. 62/072,374 filed Oct. 29, 2014, which is incorporated herein by reference in its entirety.

U.S. application Ser. No. 14/926,013 filed Oct. 29, 2015 is a continuation-in-part of U.S. application Ser. No. 14,740, 179 filed Jun. 15, 2015, which claims the benefit of U.S. Provisional Application No. 62/012,334 filed Jun. 14, 2014, which is incorporated herein by reference in its entirety U.S. application Ser. No. 14/740,179 filed Jun. 15, 2015 is a continuation-in-part of U.S. application Ser. No. 14/711, 735 filed May 13, 2015, which is a continuation of U.S. application Ser. No. 14/503,467 filed Oct. 1, 2014, now U.S. Pat. No. 9,065,921, which is a continuation of U.S. application Ser. No. 14/182,645 filed Feb. 18, 2014, now U.S. Pat. No. 8,879,773, which is a continuation of U.S. application Ser. No. 13/872,157 filed Apr. 29, 2013, now U.S. Pat. No. 8,774,446, which claims the benefit of U.S. Provisional Application No. 61/639,968 filed Apr. 29, 2012, each of which is incorporated herein by reference in its entirety.

U.S. application Ser. No. 13/872,157 filed Apr. 29, 2013, now U.S. Pat. No. 8,774,446, is a continuation-in-part application of U.S. application Ser. No. 29/430,245 filed Aug. 23, 2012, now U.S. Pat. No. D698,772, which is a continuation-in-part application of U.S. application Ser. No. 29/417,184 filed Mar. 30, 2012, now U.S. Pat. No. D667, 823, each of which is incorporated herein by reference in its entirety.

U.S. application Ser. No. 13/872,157 filed Apr. 29, 2013, now U.S. Pat. No. 8,774,446, is a continuation of PCT Application No. PCT//US2013/038599 filed Apr. 29, 2013, which claims the benefit of U.S. Provisional Application No. 61/639,968 filed Apr. 29, 2012 and U.S. application Ser. No. 29/430,245 filed Aug. 23, 2012, now U.S. Pat. No. D698, 772, each of which is incorporated herein by reference in its entirety.

BACKGROUND OF THE INVENTION

Field of the Invention

The present invention relates to a cable retraction system for use with portable electronic devices, more particularly, the present invention provides a retractable storage system incorporating an independent cable retraction system for storing retractable cables and earphones of the portable electronic device.

Description of the Related Art

Handheld electronic devices are becoming more and more popular as consumer goods and are frequently used in performing our daily communication needs. Devices like the iPhone™, iPad™, iPod™, Blackberry™, cell phones, mobile video players, KINDLE™ eReaders, Android™ devices are now intimate parts of daily life. This popularity has created a desire for protective cases well as varieties of choice for aesthetic freshness that enable these devices with a look of consumer-preferred style with modest cost. Additionally these protective cases have become increasingly armored (stronger) to protect against unintended breakage.

For example, U.S. Pat. No. 7,648,027, the entire contents of which are enclosed by reference, describes a protective apparatus to accommodate a portable device, such as a cell phone, with a wire-wrap member attached at the back panel. It does not address the problem of tangled headphone/earbud cable when it is wound in such a manner. The headphone/earbud cable can not only become damaged, but tangles are inadvertently created.

US Patent Pub. No. 2011/0233078, also incorporated herein by reference, describes a holder design for portable devices that also provides a storage compartment for earphones. It uses a spring-loaded type rewinder which can subject the headphone/earbud cable to undue pressure. The spring loaded rewinder can create drastic, uncontrollable speed of the rotating wheel upon release of the spring-loaded mechanism to rewind the cable, thereby damaging and/or shortening the life of the cable. Also, related examples are U.S. Published Application No. 2011/0170732 (Parker), U.S. Pat. No. 6,731,956 (Hanna et al.), and U.S. Published Application No. 2010/0279743 (Sim), the contents of all of which are incorporated herein by reference. Each of these devices utilizes a spring-loaded mechanism to retract the headphone/earbud cable. These spring-loaded devices can create drastic, uncontrollable speed of the rotating wheel or spring reel upon release of the spring-loaded mechanism to rewind/retract the cable, thereby subjecting the cables to undue pressure, and damaging and/or shortening the life of the cable.

Accordingly, the claimed invention proceeds upon the desirability of providing a storage system for handheld electronic device that safely retracts and stores items.

OBJECTS AND SUMMARY OF THE INVENTION

Proposed is a novel carrier system with built-in retractable earphone/earbud system that accommodates a variety of earphone styles and is adaptable for a variety of handheld electronic devices are disclosed.

In accordance with an exemplary embodiment of the claimed invention, an easy to put on carrier case, can be made of molded plastic having a wrap-around side walls, a back panel and an open front aperture for a handheld electronic device to slide into. The back panel being of monolithic construction and having an enlarged compartment built at the top area for inclusion with an earbud station. The earbud station provides secure fixed hosting seats for a pair of pullable or ejectable earbuds/earphones to sit into when not being used. Various apertures are configured in the wrap-around side walls to allow direct access to various buttons on the electronic device.

In accordance with an exemplary embodiment of the claimed invention, a pair of bounded regions or chambers with related wire channels for containing earphone/ear bud cables are configured monolithically and directly in the back panel. Earphones/earbuds with their long cables being wrapped into the chambers, and a channel to allow the plug head to be fixedly held at the earbud station for easily plug in to the headphone jack of a handheld device.

In accordance with an exemplary embodiment of the claimed invention, a middle panel, or cassette member, is configured similarly with a pair of chambers and operable wire channels for containing and guiding earphone/earbud cables.

In accordance exemplary embodiment of the claimed invention, one of the chambers is fixedly mounted with an exterior antenna/transmitter IC chip that provides a secondary amplification for a cell phone signal, providing a solution for limited cell phone signal amplification due to space limitation inside a cell phone (such as an iPhone™ or an iPad™).

In accordance with an exemplary embodiment of the claimed invention, a retractable storage system for a handheld electronic device comprises a protective housing member having a back panel and plurality of side walls forming a bounding member operative shaped and sized to bound the handheld device and enable wrapping around the handheld device. An enlarged compartment is configured proximate the back panel, intersecting with a top side wall of the housing member. The top side wall forms an aperture in connecting with the compartment. An accessory station is mounted inside the compartment and forms aperture structure for arresting and dispensing an accessory item of the handheld device. A removable middle panel is removably mounted inside the housing member, in parallel to the back panel, having a top edge neighboring and below the enlarged compartment. One or more storage chambers are structured on the removable middle panel for storing the accessory item, connecting with one or more channels wherein the channels leading to the accessory station.

In accordance with an exemplary embodiment of the claimed invention, the aforesaid retractable storage system further comprises at least one earphone cable with a earbud and a plug head, and at least one retractable mechanism which is operably mounted inside one of the storage chamber for automatically retracting a cable for storage. The earbud is removably secured in said accessory station, the cable being removably coiled within a spring-biased spool of said retractable mechanism, and a plug head of said cable being connected to a earphone jack of the handheld device, wherein said earphone is pulled from the accessory station with the cable extending from said storage chamber when in use.

In accordance with an exemplary embodiment of the claimed invention, the aforesaid retractable mechanism comprises a friction based braking system to reduce a rotational speed of the spring-biased spool during the retraction of the cable.

In accordance with an exemplary embodiment of the claimed invention, the aforesaid friction based braking system comprises at least one damping pad to reduce the rotational speed of the spring-biased spool during the retraction of the cable.

In accordance with an exemplary embodiment of the claimed invention, the aforesaid retractable storage system comprises a retraction button to control the retractable mechanism to retract the cable.

In accordance with an exemplary embodiment of the claimed invention, the aforesaid retraction button is a spring loaded such that the retraction button remains in or returns to a first position unless the retraction button is moved and held at a second position to retract the cable to the storage chamber.

In accordance with an exemplary embodiment of the claimed invention, the aforesaid retractable storage system comprises a plug head actuation system for operably removing and connecting the plug head of the cable to the earphone of the handheld device.

In accordance with an exemplary embodiment of the claimed invention, the aforesaid retractable storage system comprises an accessory button to dispense the earbud from the accessory station.

In accordance with an exemplary embodiment of the claimed invention, the aforesaid accessory button is a spring loaded such that the accessory button remains in or returns to a first position unless the accessory button is moved and held at a second position to dispense the earbud from the accessory station.

In accordance with an exemplary embodiment of the claimed invention, the aforesaid retractable storage system comprises a pair of earphones, each connected to a separate cable, and two retractable mechanism. Each retractable mechanism is mounted inside its respective storage chamber for automatically retracting is respective cable. Each retractable mechanism is independently controlled such that each cable is independently retractable.

In accordance with an exemplary embodiment of the claimed invention, the aforesaid retractable storage system comprises a first and second retraction buttons to independently control the respective retractable mechanism.

In accordance with an exemplary embodiment of the claimed invention, each aforesaid retraction button is a spring loaded such that each retraction button remains in or returns to a first position unless each retraction button is moved and held at a second position to retract the respective cable to the respective storage chamber.

In accordance with an exemplary embodiment of the claimed invention, the aforesaid retractable storage system comprises a headphone cable with an audio plug and a headphone plug, and a retractable mechanism which is operably mounted inside a storage chamber for automatically retracting the headphone cable for storage. The headphone plug is removably secured in the accessory station. The headphone cable is removably coiled within a spring-biased spool of the retractable mechanism. The audio plug head is connected to a earphone jack of the handheld device. The headphone plug is pulled from the accessory station with the cable extending from the storage chamber for use with a headphone.

In accordance with an exemplary embodiment of the claimed invention, the aforesaid retractable storage system comprises a retraction button to control the retractable mechanism to retract said headphone cable.

In accordance with an exemplary embodiment of the claimed invention, the aforesaid retractable storage system comprises a pair of earphones, each connected to a separate magnetized cable. Each magnetized cable is magnetically attracted to each other to form a single cable which can be removably coiled within the same spring-biased spool of the retractable mechanism. The earphone is pulled from the accessory station with the single cable extending from the storage chamber and peelable into two separate cables when in use.

In accordance with an exemplary embodiment of the claimed invention, the aforesaid accessory item is at least one of the following: a lip balm, a lipstick, a cigarette or a cigar. The aforesaid retractable storage system further comprises an accessory button to dispense the accessory item from the storage chamber through the accessory station.

In accordance with an exemplary embodiment of the claimed invention, the aforesaid retractable storage system comprises at least one battery mounted inside a storage chamber for charging at least an accessory item or the handheld device. The accessory station is a charging station which is electrically connected to the battery to charge the accessory item stored within the charging station.

In accordance with an exemplary embodiment of the claimed invention, the aforesaid accessory item is a wireless earbuds or e-cigarettes. The aforesaid retractable storage system further comprises an accessory button to dispense the accessory item from the charging station.

In accordance with an exemplary embodiment of the claimed invention, the aforesaid accessory station comprises a station adapter configured with elastic material to adjust the aperture size of the accessory station.

In accordance with an exemplary embodiment of the claimed invention, the aforesaid retractable storage system comprises a plurality of colored LEDs to display a logo, advertisement or aesthetically pleasing patterns on the back panel of the housing member. The handheld electronic device is operably connected to the LEDs to control and change the patterns, logo or advertisement displayed by the LEDs.

In accordance with an exemplary embodiment of the claimed invention, a retractable storage system for a handheld electronic device comprises a protective housing member, at least one cable with a plug head and an end piece, and at least one retractable mechanism to retract and store the cable. At least one accessory station configured to dispense and store the end piece of the cable. The retractable mechanism comprises a groove track system to control a rotational movement of the retractable mechanism. The groove track system further comprises a groove track component to enable and disable the rotational movement of the retractable mechanism. Preferably, the aforesaid groove track component is at least one ball bearing.

In accordance with an exemplary embodiment of the claimed invention, the aforesaid retractable mechanism comprises a first area, a second area and a third area. The first area is configured to store a retractable length of the cable. The second area is configured to store an excess portion of the cable. The third area is configured to store a power spring. Preferably, the aforesaid the first area and the aforesaid second area are coplanar on a single plane with the third area.

In accordance with an exemplary embodiment of the claimed invention, the aforesaid retractable storage system further comprises electrical contacts or slip rings to electrically connect at least two sections of the cable.

In accordance with an exemplary embodiment of the claimed invention, the aforesaid end piece is located in a first section of the cable and the aforesaid plug head is located in a second section of the cable. The electrical contacts or slip rings is configured to move or rotate the first section of the cable independent of the second section of the cable while maintaining an electrical connection.

In accordance with an exemplary embodiment of the claimed invention, the aforesaid groove track component is activated in response to the cable being pulled from the retractable mechanism. Preferably, the cable is a flat cable.

In accordance with an exemplary embodiment of the claimed invention, the aforesaid retractable storage system further comprises a plug head actuation system. The plug actuation system comprises a component to operably remove or connect the plug head of the cable to a port of the handheld electronic device. Preferably, the aforesaid end piece is one of the following accessory items: an earbud, earphone, headphone or audio plug.

In accordance with an exemplary embodiment of the claimed invention, the aforesaid retractable storage system further comprises one or more storage chambers. Preferably, at least one battery mounted inside one of the storage chambers to charge the handheld electronic device.

In accordance with an exemplary embodiment of the claimed invention, a retractable storage system for a handheld electronic device, comprises at least one cable with a plug head and an end piece, at least one retractable mechanism for retracting and storing the cable, and a plug head actuation system. The plug head actuation system comprises a component to operably remove or connect the plug head of the cable to a port of the handheld electronic device. The component is configured to drive the plug head to lift or lower the plug head from a port of the handheld electronic device. The retractable mechanism comprises a first area, a second area and a third area. The first area is configured to store a retractable length of the cable. The second area is configured to store an excess portion of the cable. The third area is configured to store a power spring. Preferably, the conductors within the cable are constructed in a co-planar, single plane arrangement. The first area and the second area of the retractable mechanism are coplanar on a single plane with the third area.

In accordance with an exemplary embodiment of the claimed invention, the aforesaid retractable mechanism comprises a groove track system to control a rotational movement of the retractable mechanism. The groove track system further comprises a groove track component to enable and disable the rotational movement of the retractable mechanism. Preferably, the groove track component is at least one ball bearing. The end piece is one of the following accessory items: an earbud, earphone, headphone or audio plug.

In accordance with an exemplary embodiment of the claimed invention, the aforesaid retractable storage system further comprises one or more storage chamber. Preferably, at least one battery mounted inside one of the storage chambers to charge the handheld electronic device.

In accordance with an exemplary embodiment of the claimed invention, a retractable storage system for a handheld electronic device comprises a protective housing member, at least one cable with a plug head and an end piece, and at least one retractable mechanism to retract and store the cable. At least one accessory station configured to dispense and store the end piece of the cable. The cable comprises at least three conductors constructed in a generally co-planar, single plane arrangement.

In accordance with an exemplary embodiment of the claimed invention, the aforesaid cable is configured to be peelable in at least two sections. Preferably, the cable comprises a reinforcing element to increase a tensile strength of the cable.

In accordance with an exemplary embodiment of the claimed invention, the aforesaid cable comprises a microphone. The microphone further comprises a housing with a control button configured to operate at least one of the following functions of the handheld electronic device: playing, pausing, forwarding, rewinding, skipping, volume controlling and call answering.

In accordance with an exemplary embodiment of the claimed invention, the aforesaid retractable storage system further comprises a plug head actuation system comprising a component to operably remove or connect the plug head of the cable to a port of the handheld electronic device.

In accordance with an exemplary embodiment of the claimed invention, the aforesaid retractable mechanism comprises a first area, a second area and a third area. The first area is configured store the retractable length of the cable. The second area is configured to store an excess portion of the cable. The third area is configured to store a power spring. Preferably, the first area and second area of the retractable mechanism are coplanar on a single plane with the third area.

In accordance with an exemplary embodiment of the claimed invention, the aforesaid retractable mechanism comprises a groove track system to control a rotational movement of the retractable mechanism. The groove track system further comprises a groove track component to enable and disable the rotational movement of the retractable mechanism. Preferably, the groove track component is at least one ball bearing.

In accordance with an exemplary embodiment of the claimed invention, a retractable storage system for a handheld electronic device comprises a protective housing member operative shaped and sized to bound the handheld electronic device and enable wrapping around the handheld electronic device. At least one accessory station is structured on the housing member, and has an aperture to arrest and dispense an accessory item. At least one storage chamber is structured on the housing member to store the accessory item. The protective housing member comprises a first housing part and a second housing part which combine to form one protective housing member.

In accordance with an exemplary embodiment of the claimed invention, the aforesaid first housing part comprises at least one accessory station and at least one storage chamber. The second housing part is operably secured to the handheld electronic device. The first housing part is removable so that the second housing part is usable as a stand-alone protective housing for the handheld electronic device.

In accordance with an exemplary embodiment of the claimed invention, the aforesaid retractable storage system comprises a door or lid configured to cover the aperture of at least one accessory station.

In accordance with an exemplary embodiment of the claimed invention, the aforesaid retractable storage system comprises a slot or compartment structured on the protective housing member to store the door or lid.

In accordance with an exemplary embodiment of the claimed invention, the aforesaid retractable storage system comprises at least one cable with a plug head and an end piece.

In accordance with an exemplary embodiment of the claimed invention, the aforesaid retractable storage system comprises at least one retractable mechanism mounted inside at least one storage chamber to retract and store at least one cable.

In accordance with an exemplary embodiment of the claimed invention, the aforesaid retractable storage system comprises a plug head actuation system comprising a component to operably connect or disconnect an electrical signal between the plug head of the cable to a port of the handheld electronic device.

In accordance with an exemplary embodiment of the claimed invention, a retractable storage system for a handheld electronic device comprises a housing comprising two housing parts. A first housing part and a second housing part couple to form a single housing. At least one accessory station is structured on the housing, and has an aperture to arrest and dispense an accessory item. One or more storage chambers are structured on the housing to store the accessory item. The first housing part and the second housing part couple to form a waterproof and weatherproof seal to protect the handheld electronic device from water, moisture, dust and debris.

In accordance with an exemplary embodiment of the claimed invention, the aforesaid retractable storage system comprises one or more channels structured on the housing to receive a sealing element to provide an airtight, waterproof, seal or bond. The sealing element is one of the following: a gasket, a rubber edge or a compressible foam.

In accordance with an exemplary embodiment of the claimed invention, the aforesaid retractable storage system comprises a transparent membrane or protective screen cover secured on the housing proximate to a front screen of the handheld electronic device allowing a user to interface with and access touch screen features of the handheld electronic device through the transparent membrane or protective screen cover.

In accordance with an exemplary embodiment of the claimed invention, the aforesaid retractable storage system comprises a coupling element to secure the sealing element between the first housing part and the second housing part.

In accordance with an exemplary embodiment of the claimed invention, the aforesaid coupling element is one of the following: a hinged door, a clasping mechanism, a snap-down or snap-in element.

In accordance with an exemplary embodiment of the claimed invention, the aforesaid housing comprises one or more control elements to operate a corresponding control of the handheld electronic device. Each control element comprises a molded overlay to seal the control element and to enhance usability of the control element by a user.

In accordance with an exemplary embodiment of the claimed invention, the aforesaid housing comprises a sound membrane material located around acoustic apertures or sound ports of the handheld electronic device. The sound membrane material is configured to allow transmission of sound to and from the handheld electronic device through the housing and to remain impermeable to liquid.

In accordance with an exemplary embodiment of the claimed invention, a retractable storage system for a handheld electronic device comprises a protective housing member and at least one cable with a plug head and an end piece. At least one accessory station to dispense and store the end piece of the cable. One or more storage chambers are structured on the protective housing member to store an accessory item. At least one retractable mechanism operably mounted inside one of the storage chambers to retract and store the cable. The retractable mechanism comprises a groove track system to control a rotational movement of the retractable mechanism. The groove track system comprises a groove track component to enable and disable the rotational movement of the retractable mechanism. The groove track component is at least one pin, rod or latch.

In accordance with an exemplary embodiment of the claimed invention, the aforesaid retractable storage system comprises electrical contacts or slip rings to electrically connect at least two sections of the cable.

In accordance with an exemplary embodiment of the claimed invention, the aforesaid end piece is located in a first section of the cable and the plug head is located in a second section of the cable. The electrical contacts or slip rings are configured to move or rotate the first section of the cable independent of the second section of the cable while maintaining an electrical connection.

In accordance with an exemplary embodiment of the claimed invention, the aforesaid groove track component is activated in response to the cable being pulled from the mechanism.

The above and other aspects, features and advantages of the present invention will become apparent from the following description read in conjunction with the accompanying drawings, in which like reference numerals designate the same elements.

BRIEF DESCRIPTION OF THE DRAWINGS

FIGS. 13A-B are exemplary illustrative views of an operative wedge-actuation system for removing and re-installing an audio jack element (3.5 mm type or other) from the electronic device in accordance with an exemplary embodiment of the claimed invention;

FIG. 14 is an exemplary illustrative view of an operative lever-actuation system for removing and re-installing an audio jack element from the electronic device in accordance with an exemplary embodiment of the claimed invention;

FIG. 15 is an exemplary illustrative exemplary view of an operative twist-actuation system for removing and re-installing an audio jack element from the electronic device in accordance with an exemplary embodiment of the claimed invention;

FIGS. 20A-B are perspective views of a retractable storage system with a retractable mechanism engaged and disengaged, respectively, for retracting a cable in accordance with an exemplary embodiment of the claimed invention;

FIGS. 24A-B are exploded perspective view of the retractable mechanism for storing and housing earphone cables with a retraction button to control the retraction mechanism and an accessory button to dispense a pair of earbuds from an accessory station in accordance with an exemplary embodiment of the claimed invention;

FIGS. 25A-B are back view and perspective view of a retractable storage system for storing, charging and dispensing e-cigarette in accordance with an exemplary embodiment of the claimed invention;

FIGS. 26A-B are back view and perspective view of a retractable storage system for storing and dispensing a headphone plug/cable for use with a standard headphone in accordance with an exemplary embodiment of the claimed invention;

FIGS. 28A-B are exploded top and bottom perspective views of the cable retractor in accordance with an exemplary embodiment of the claimed invention;

FIG. 29A is an exploded perspective view of the reel of the cable retractor in accordance with an exemplary embodiment of the claimed invention;

FIG. 29B is a perspective view of the reel of the cable retractor in accordance with an exemplary embodiment of the claimed invention;

FIGS. 47A-B are side views of the weatherproof housing system in accordance with an exemplary embodiment of the claimed invention;

FIGS. 48A-F are front, side, back and top views of the weatherproof housing system in accordance with an exemplary embodiment of the claimed invention;

FIGS. 53A-55B are views of a retractable storage system with interchangeable modules in accordance with an exemplary embodiment of the claimed invention;

FIGS. 57A-C are perspective views of the door slot in accordance with an exemplary embodiment of the claimed invention;

FIGS. 58A-E are perspective views of the cable retraction system mounted with the interior of vehicles in accordance with exemplary embodiment of the claimed invention; and FIGS. 59A-F are perspective views of the cable retraction system mounted within helmets in accordance with exemplary embodiment of the claimed invention; and FIGS. 60A-E are perspective views of the cable retraction system mounted within clothing in accordance with exemplary embodiment of the claimed invention.

DETAILED DESCRIPTION OF THE EMBODIMENTS

Figure 2:
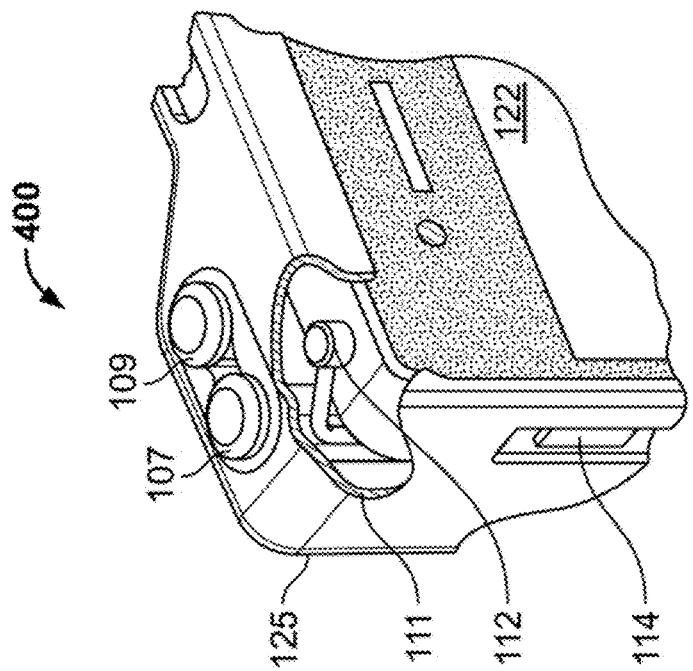
FIG. 2 is an enlarged partially cut-away view of the upper side of the compartment area for earphone/earbud station in accordance with an exemplary embodiment of the claimed invention.

Reference will now be made in detail to embodiments of the claimed invention. Wherever possible, same or similar reference numerals are used in the drawings and the description to refer to the same or like parts or steps. The drawings are in simplified form and are not to precise scale. For purposes of convenience and clarity only, directional (up/down, etc.) or motional (forward/back, etc.) terms may be used with respect to the drawings. These and similar directional terms should not be construed to limit the scope of the invention in any manner.

It will be understood that the phrases earbud and earphone, singularly or in plural form, may be used interchangeably and without limitation, such that earbud(s) or an earphone(s) system or element can be understood to operate in accordance with this inventive disclosure.

For simplicity and clarity of illustration, the drawing figures illustrate the general manner of construction, and description and details of well-known features and techniques may be omitted to avoid unnecessarily obscuring the invention.

The terms "first," "second," "third," "fourth," and the like in the description and the claims, if any, may be used for distinguishing between similar elements and not necessarily for describing a particular sequential or chronological order. It is to be understood that the terms so used are interchangeable. It is also understood, that the phrases embodiment or version may be used interchangeably and without undue limitation. There is no restriction such that an embodiment is more or less restrictive or definitive than a version of the present invention. Furthermore, the terms "comprise," "consisting of", "include," "have," and any variations thereof, are intended to cover non-exclusive inclusions, such that a process, method, article, apparatus, or composition that comprises a list of elements is not necessarily limited to those elements, but may include other elements not expressly listed or inherent to such process, method, article, apparatus, or composition.

It is contemplated and intended that the operative embodiments or versions of the claimed invention may be readily modified to any suitable handheld devices of any size that provides an audio output or interconnection system and thus may take earbud/earphone jacks; for clarity reason, the examples are given based on IPOD™ or IPHONE™ but will be understood to apply to any hand-held device, cell phone, smart phone, computer, laptop, tablet, ereader or otherwise without limitations. The case shapes may be molded with metal, rubber, plastic, or of any other formable material or combination of materials having variable module(s) of elasticity. Thus, a rigid plastic bottom may be co-molded with a more flexible plastic side wall, and a slick-slippery sided guide channel portions. A variety of colors and material patterns may be used for styles and fashions.

Figure 1:
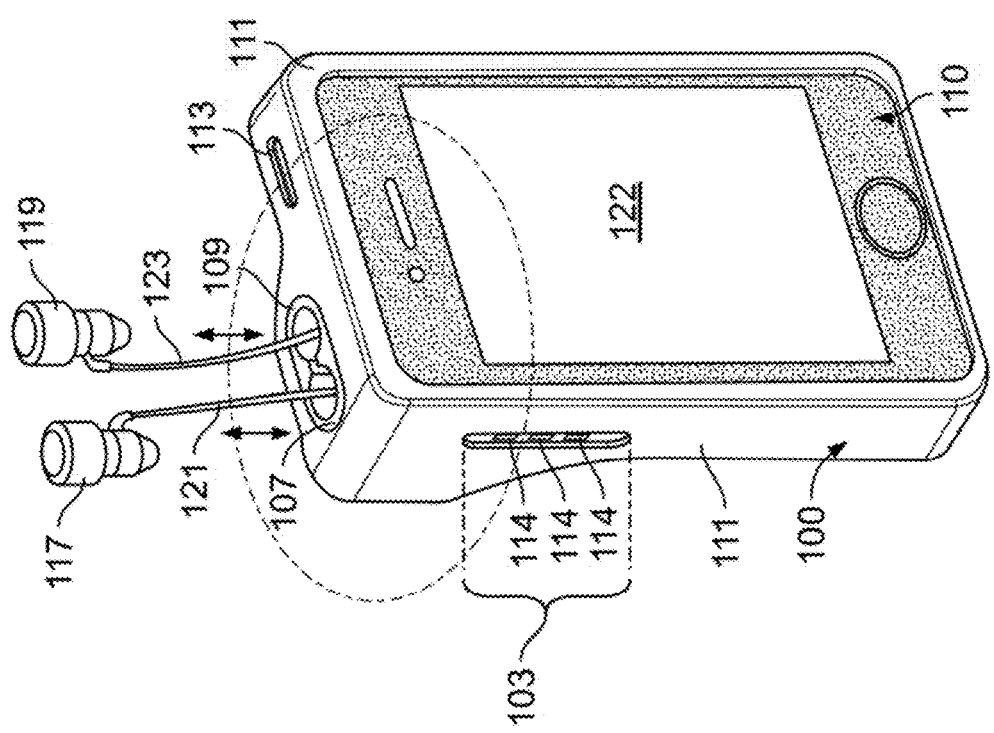
FIG. 1 is a perspective view of a retractable storage system housing a handheld device in accordance with an exemplary embodiment of the claimed invention.

In reference to FIGS. 1 and 2, handheld electronic device system 110, for example, an IPOD™/IPHONE™ is contained inside the housing 111 of carrier case 100. In accordance with an exemplary embodiment of the claimed invention, housing 111 is made of a thin layer of plastic, leather material, rubber or other moldable and flexible durable and light material, provides a protective layer for device 110 from scratching and other damages. Housing 111 is built in variety of shapes and sizes to tightly match the various designs of handheld devices and is not limited to the shapes shown. For example, it can be rectangular and with sufficient thickness to match an iPHONE™, or it can be square to match a KINDLE™ eReader. It can also provide a personalized and customized pattern or color for a user to have a feel of fashion or personal decoration. Various apertures 103, 113 on the side wall or top side of the case 100 can be configured to accommodate access to various buttons of the electronic device 110, such as power button 120, volume control button 114, and ports, such as USB port.

In accordance with an exemplary embodiment of the claimed invention, carrier case 100 does not have a front panel, allowing full direct access to the front screen 122 of device 110. Especially for touch screen devices, this front opening is functionally convenient, yet elegant in style. The edge of side walls of housing 111 is slightly curved as a retaining lip to increase the holding grip on device 110. Alternatively, the side walls of housing 111 is a rubberized surface to increase the holding grip on device 110.

Figure 3:
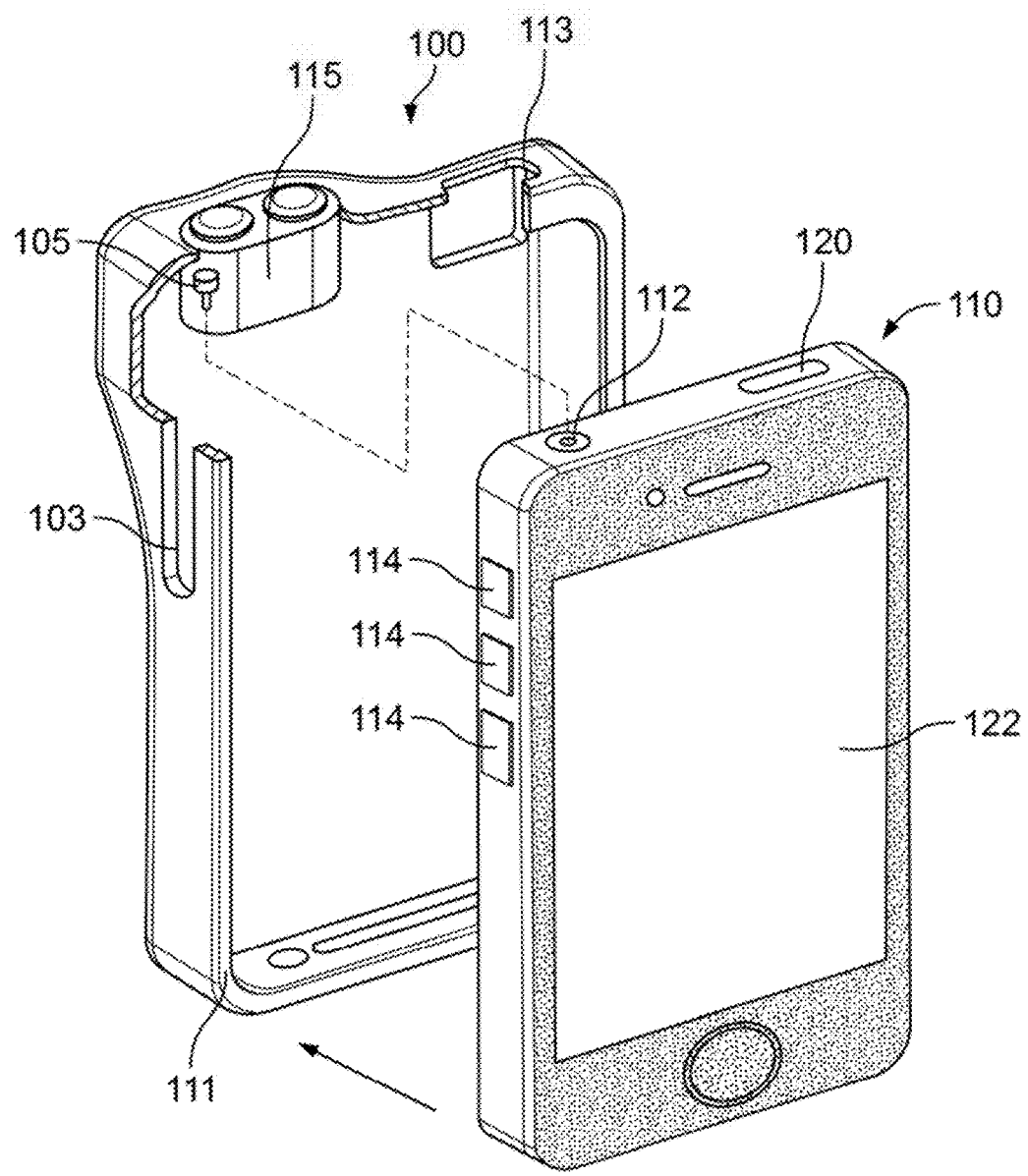
FIG. 3 is an exploded perspective view of a retractable storage system for storing earphone cables and a handheld electronic device for assembling together in accordance with an exemplary embodiment of the claimed invention.
Figure 4:
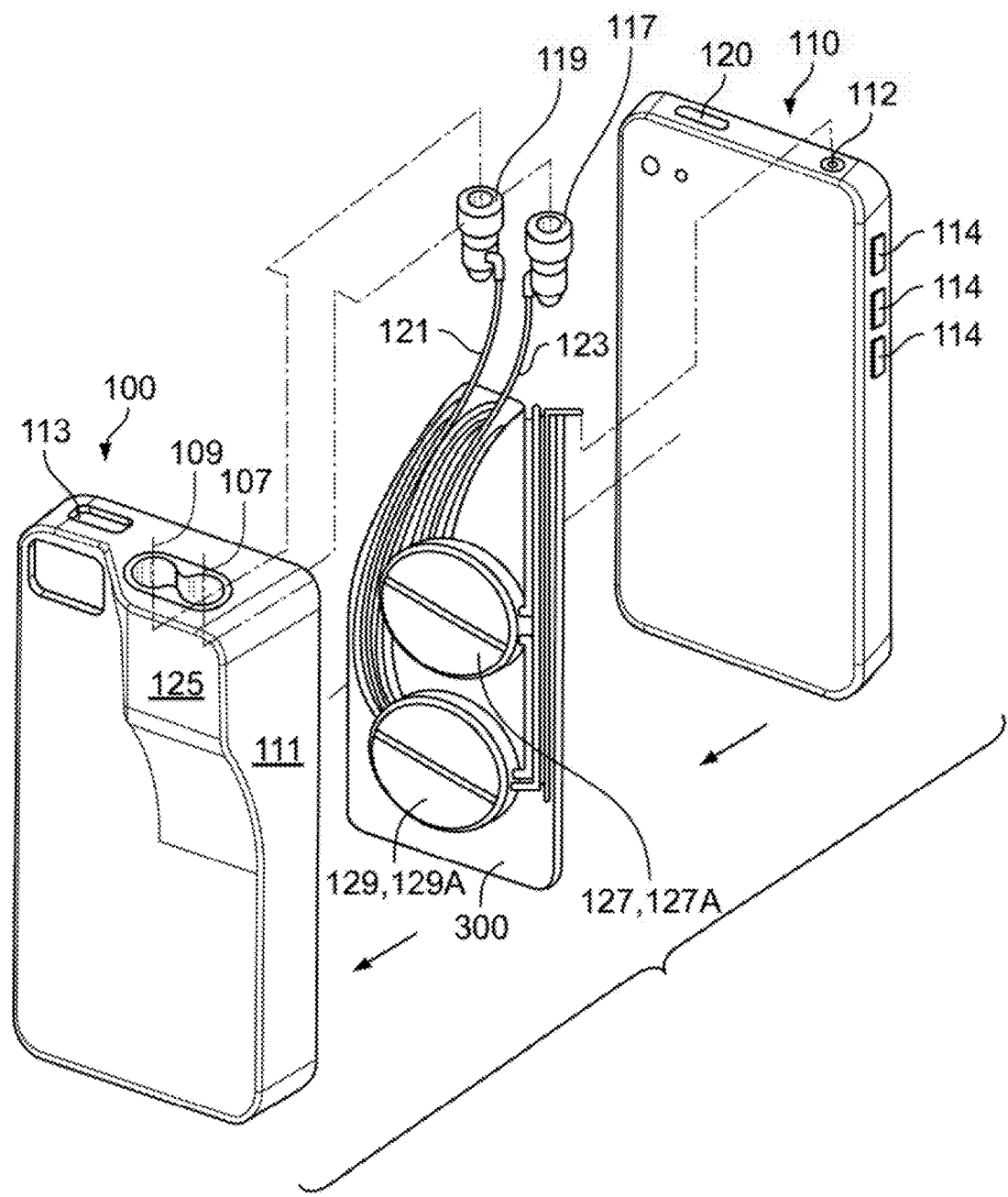
FIG. 4 is an exploded perspective view of the retractable storage system of FIG. 3, a removable panel for storing earphone cables and a handheld device for assembling together in accordance with an exemplary embodiment of the claimed invention.

In accordance with an exemplary embodiment of the claimed invention, the top area 400 of case 100 covering the earphone jack 112 area is configured with a slightly burgeon compartment or bounded region 125 for mounting earphone/earbud station 115 (FIGS. 3 and 4). In accordance with an aspect of the claimed invention, earphone or earbud station 115 can comprise one aperture or two cylindrical apertures, sized to hold a pair of earphones 117, 119 (e.g., a wireless earphones or earbuds) with friction, but may be monolithically formed with case 100 (not separate) and may be also co-continuous (not separate openings). Alternatively, the earphone stations 107, 109 can comprise one opening to receive a pair of earbuds or earphones 117, 119. The material of earbud station 115 may be made of either plastic or an elastomeric or the combination of materials for elasticity. Adaptor rings may be provided (shown but not numbered) for adjusting a general opening to a reduced size for perfect fitting of a particular earbud to the station 115. Earbud connecting cables 121, 123 are contained inside the carrier case housing 111 through apertures of earphone station 115 and reel in and out during use.

In reference to FIGS. 3 and 4, carrier case 100 includes a middle cassette or plug-in panel 300 that is configured with one, two or more chambers 127, 129 for containing earphone/earbud cables 121,123. In accordance with an exemplary embodiment of the claimed invention, retractable mechanisms 127A, 129A, such as spring reels or spools 610 can be replaceably inserted into the chambers 127, 129 for automatic retraction of the earphone cables 121, 123 after use. The retraction mechanism is individually indexable (retraction, partial retraction, hold in position etc.) and each retraction mechanism is individually operable (one ear bud or both). An additional exterior antenna receiver/transmitter chip (not shown) may also be fixedly mounted inside the chambers, or proximate to the shell and body to enhance a cell phone signal receiving/sending capacity. Alternatively, the pair of earphones 117, 119 can be connected to a single earphone cable, thereby requiring only one chamber 127 for containing a single earphone/earbud cable 121 and only one retractable mechanism 127A for automatic retraction of the earphone cable 121 after use.

Earphone/earbud cables 121, 123 are guided with channels to the respective chambers 127, 129 where the rest of the cable length is coiled inside the chambers 127, 129. Earphone/earbud plug head 105 is guided by one of the channels to the top to be in the proximity of an earphone jack of handheld device 110. Earphone/earbud earplugs or earpieces 117, 119 are housed in or fit into earphone station 115, when in use, optionally one or both, can be pulled from the station 115, and retracted back to the station 115 after use using a continuous pull or a ratchet as is known in the electrical-power-cord-retraction-art.

Figure 23:
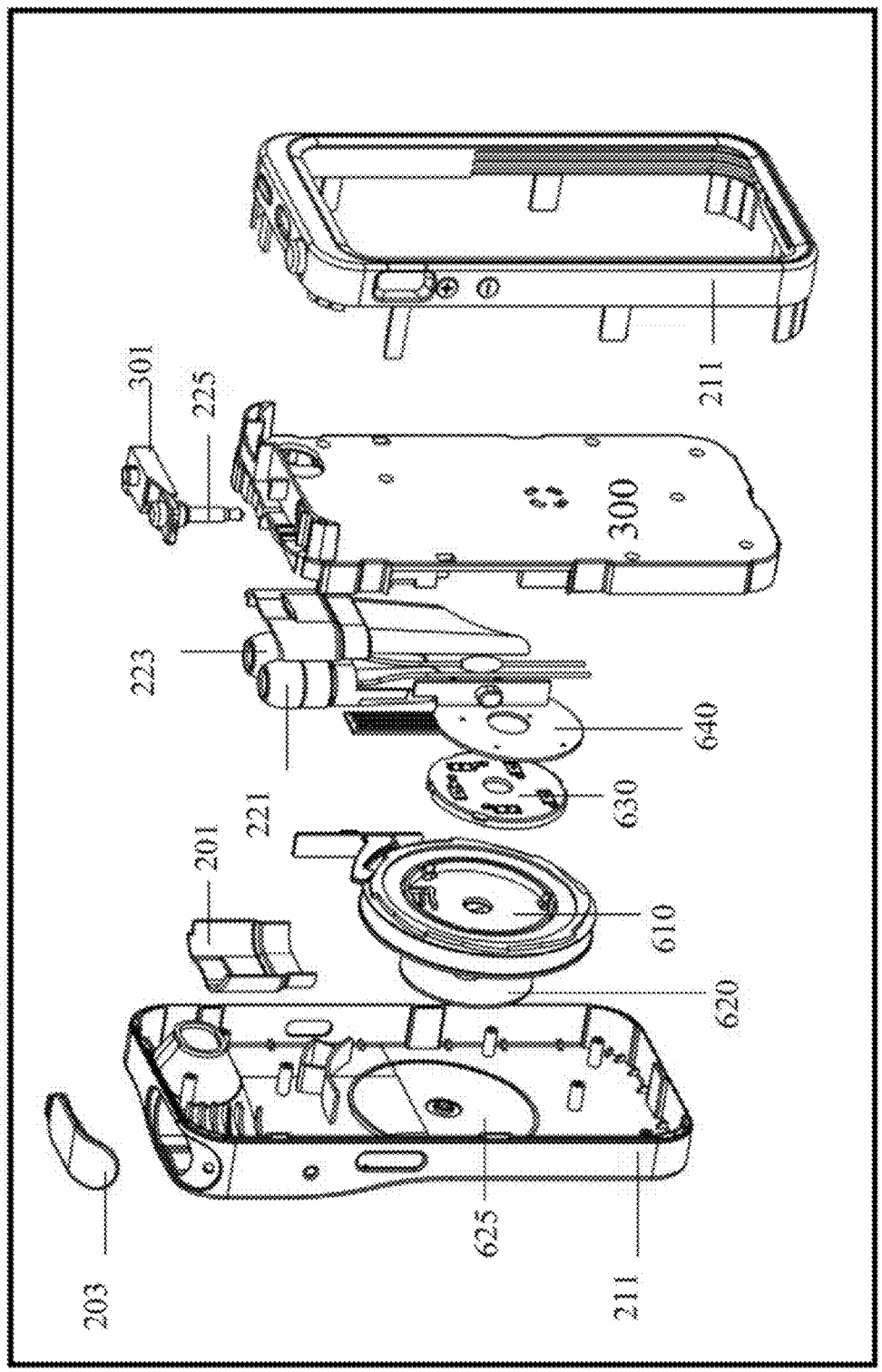
FIG. 23 is an exploded perspective view of a retractable storage system with a retractable mechanism for storing and retracting earphone cable in accordance with an exemplary embodiment of the claimed invention.
Figure 27:
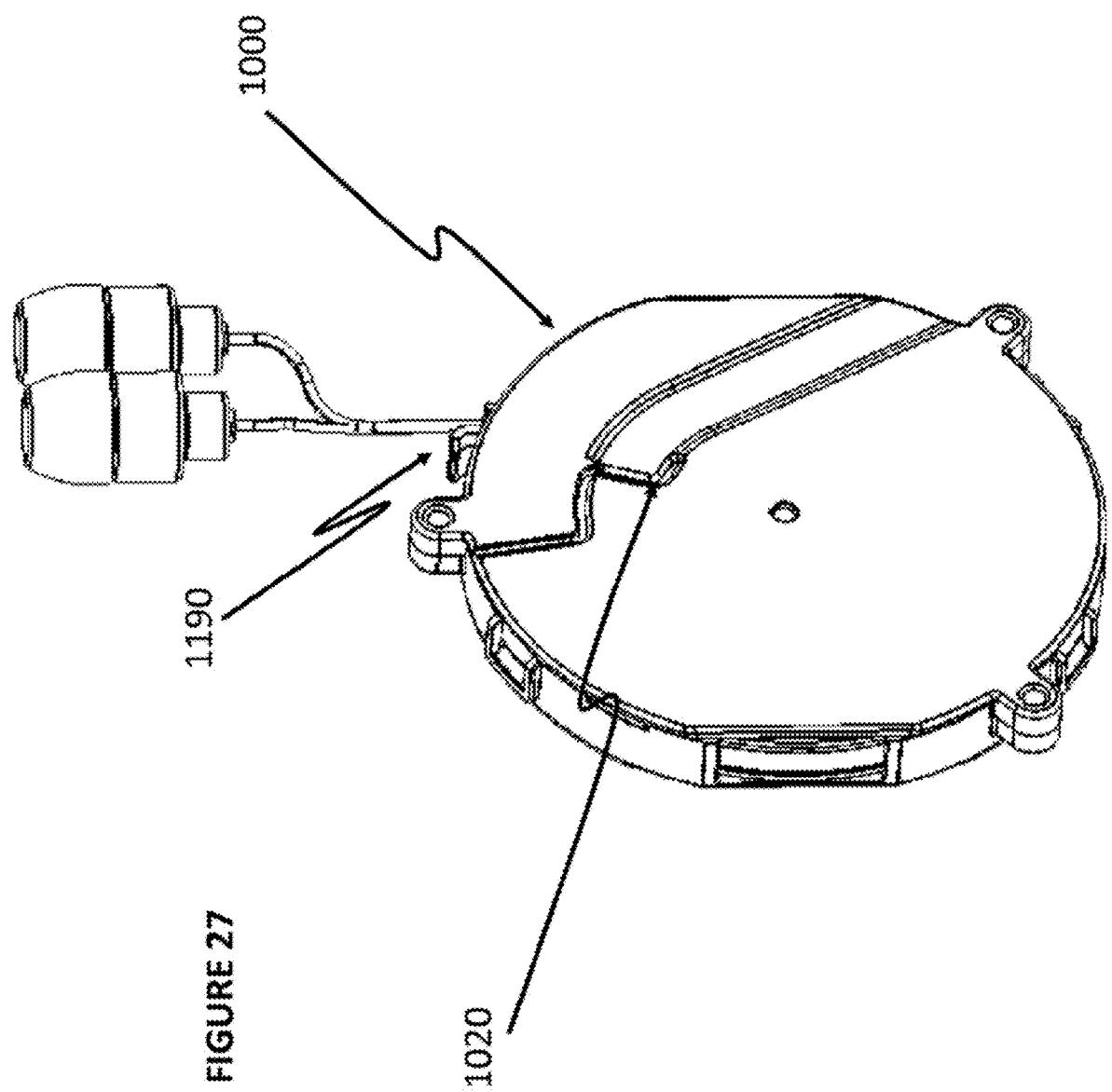
FIG. 27 is a perspective view of the cable retractor in accordance with an exemplary embodiment of the claimed invention.
Figure 30:
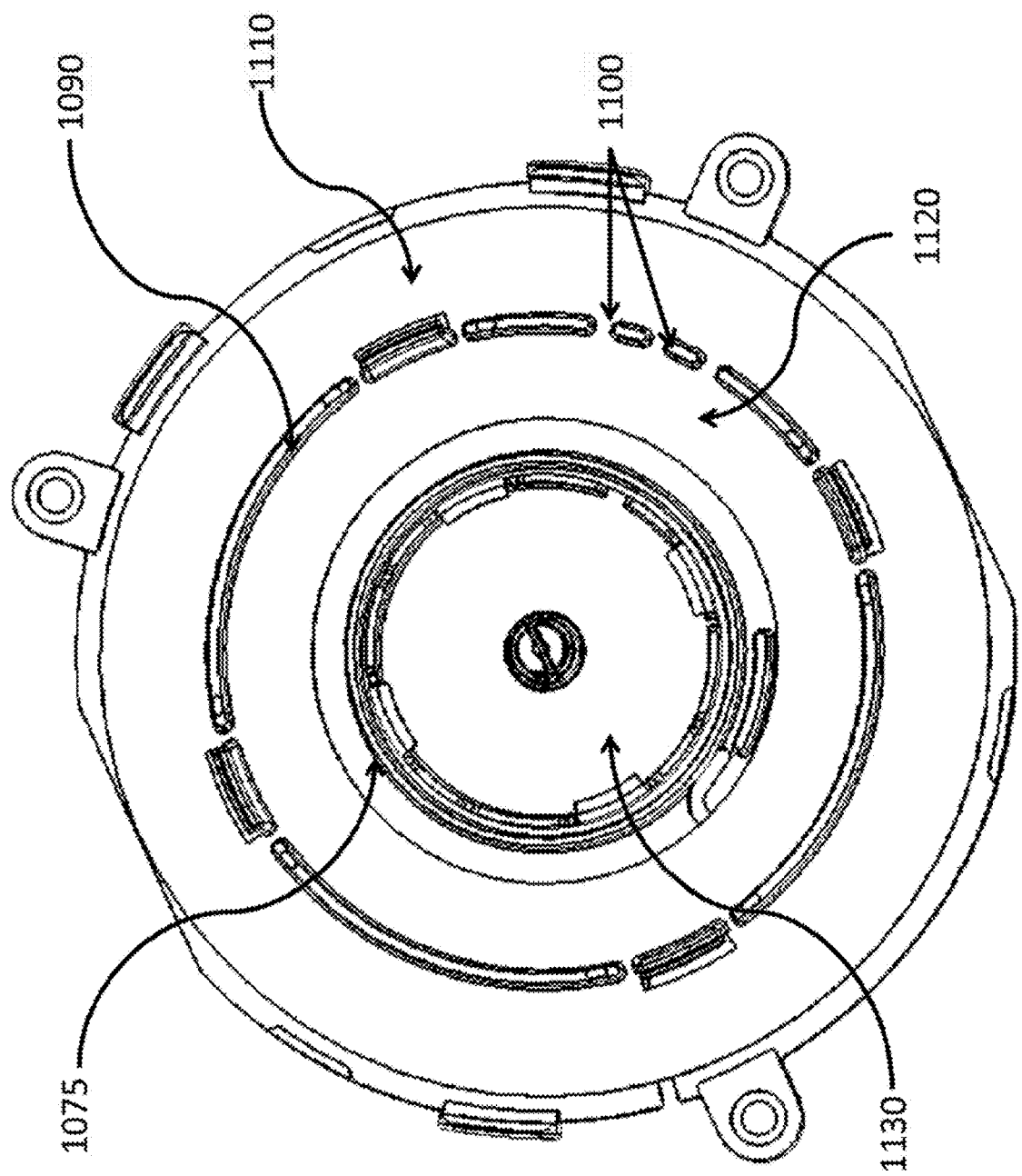
FIG. 30 is a top view of the inside of the reel of the cable retractor without the cable in accordance with an exemplary embodiment of the claimed invention.
Figure 31:
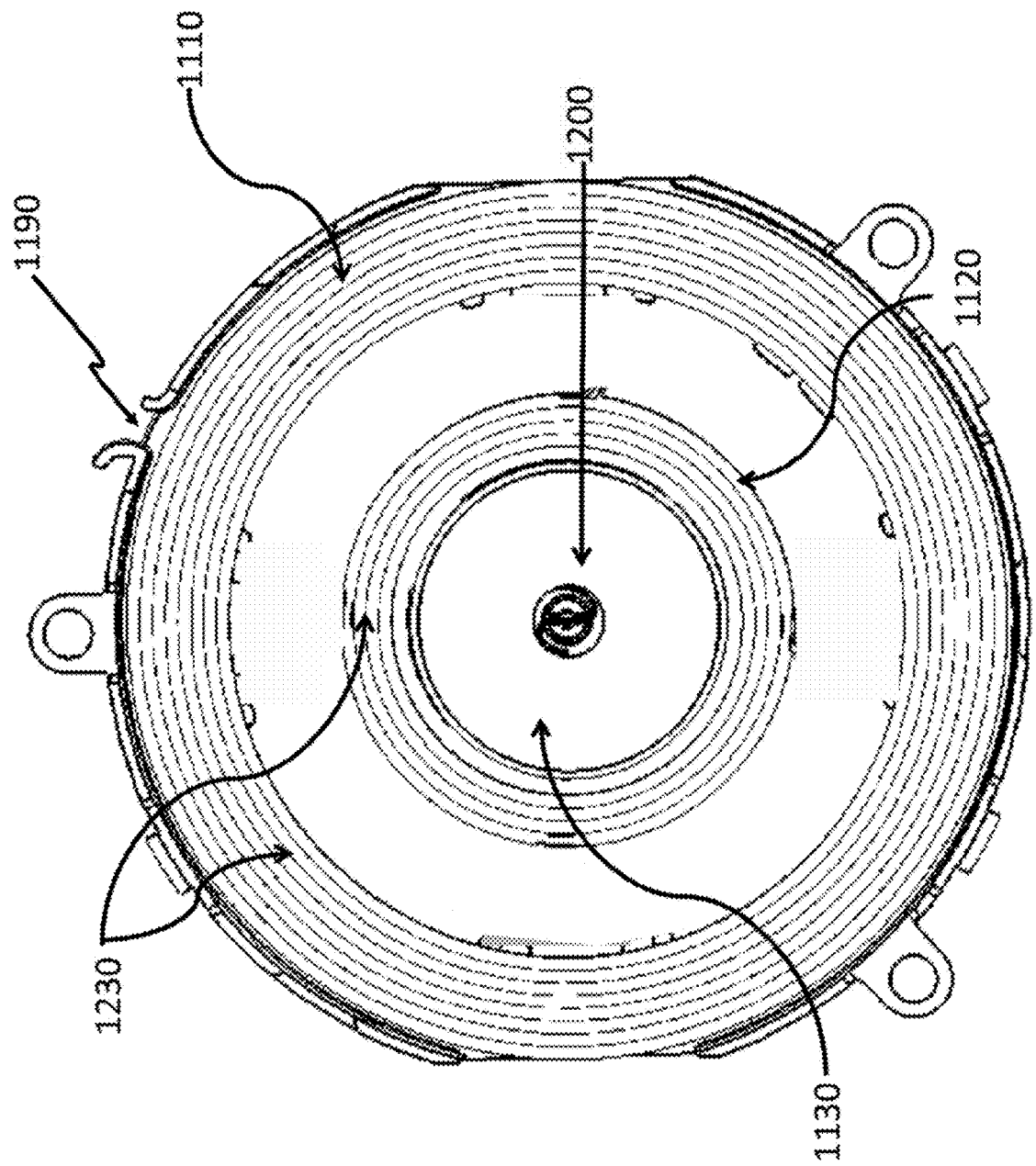
FIG. 31 is a top view of the inside of the reel of the cable retractor with the cable in accordance with an exemplary embodiment of the claimed invention.
Figure 32:
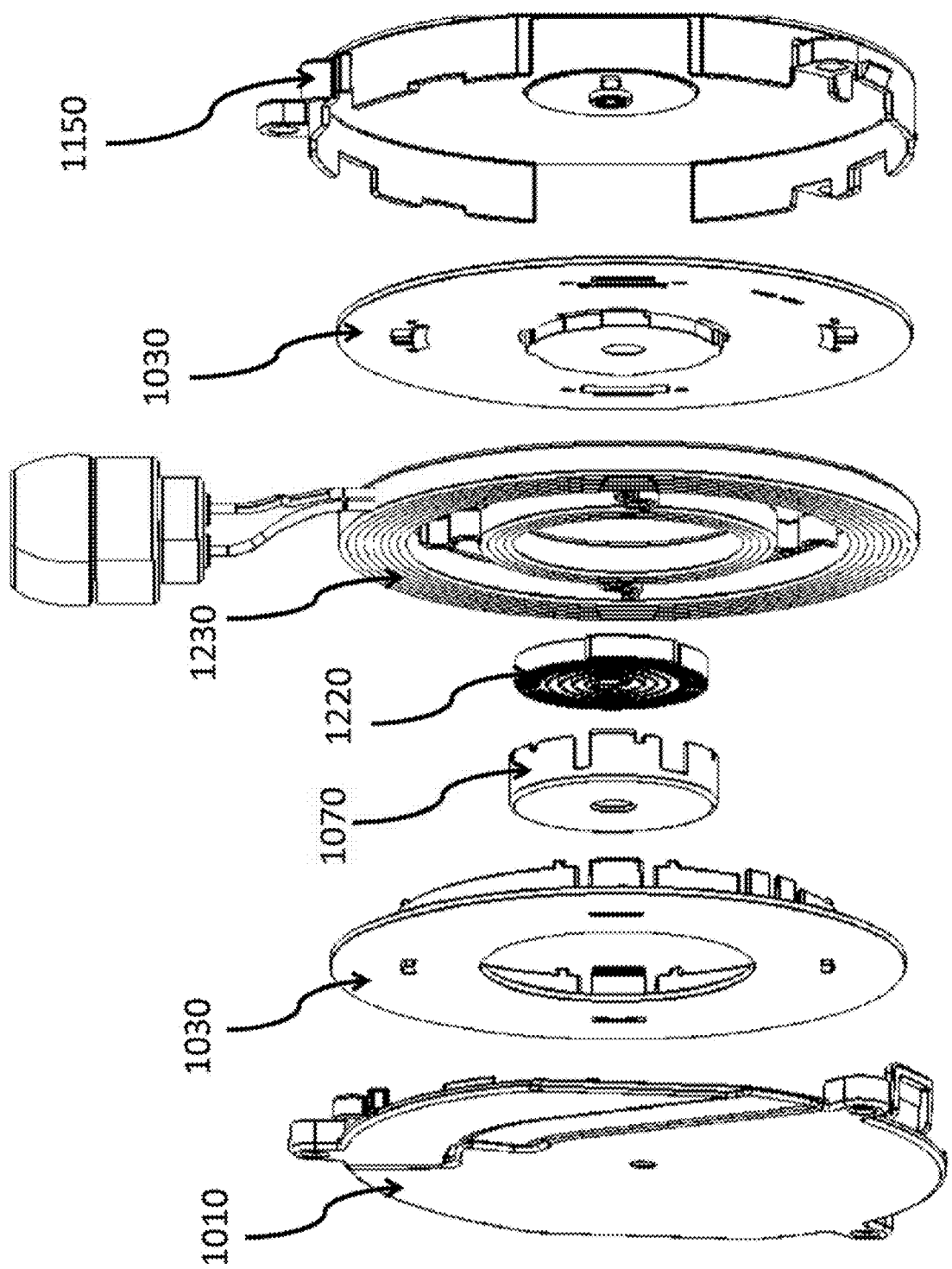
FIG. 32 is an exploded side perspective view of the cable retractor in accordance with an exemplary embodiment of the claimed invention.
Figure 33:
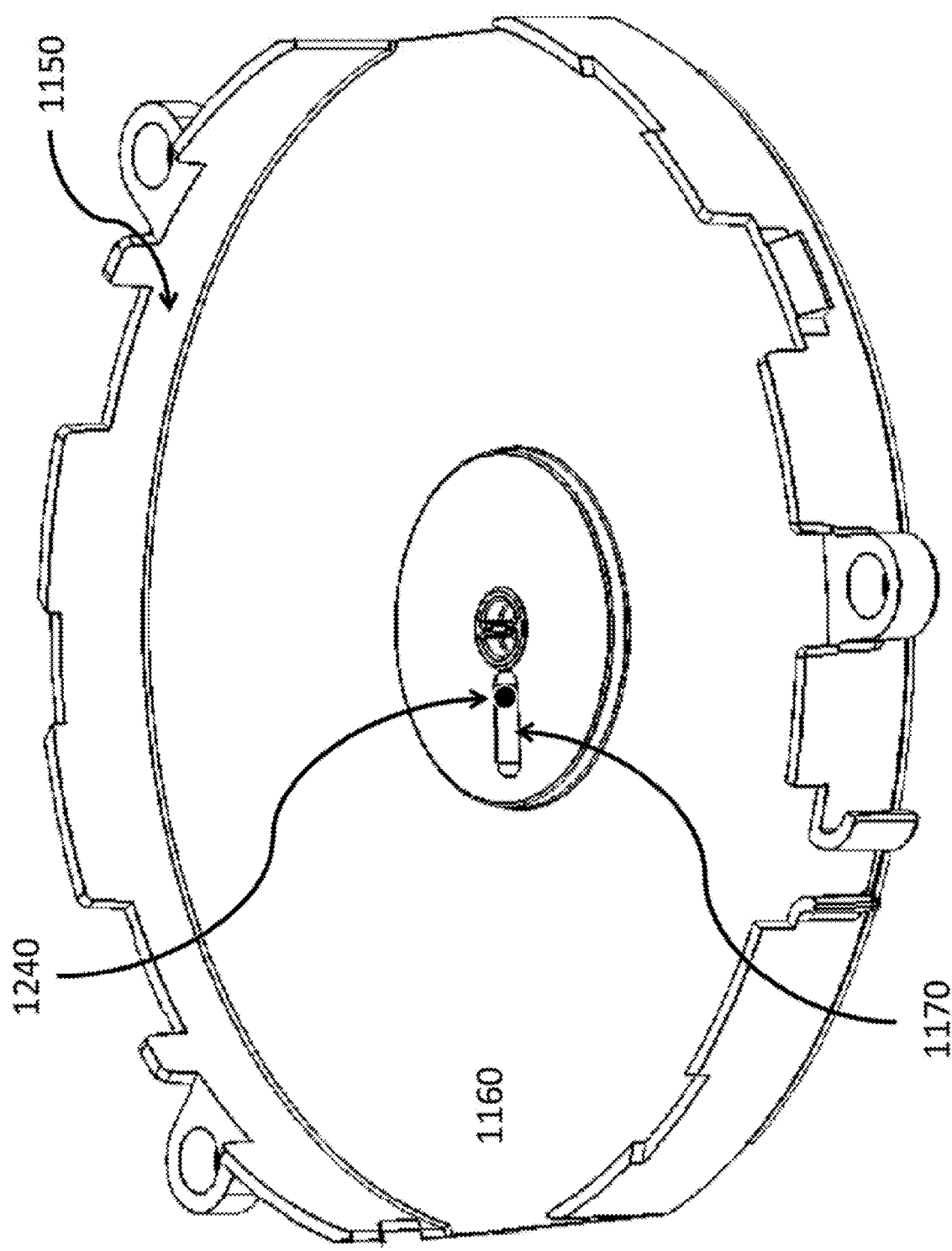
FIG. 33 is a top perspective view of the bottom housing of the cable retractor in accordance with an exemplary embodiment of the claimed invention.
Figure 34:
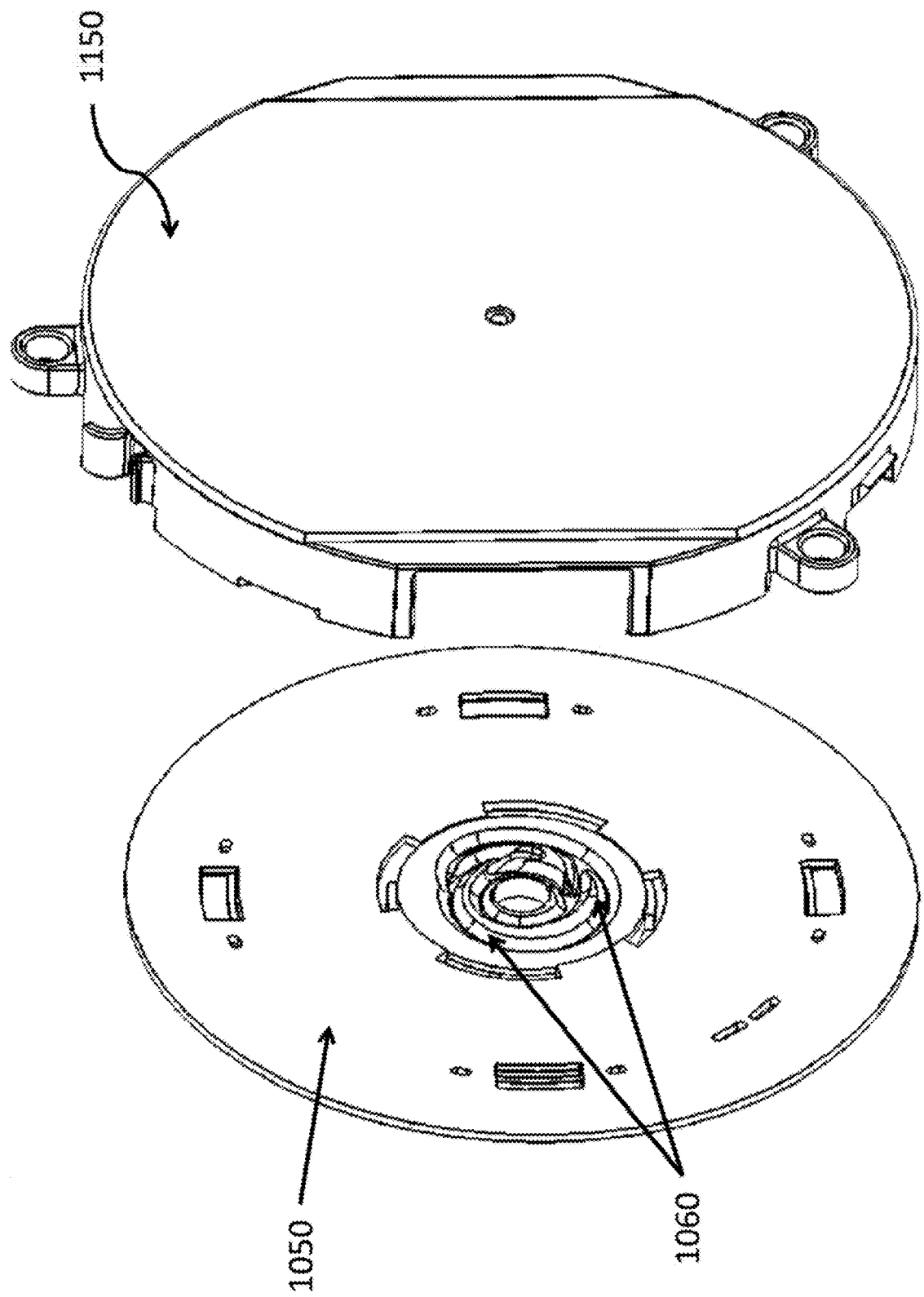
FIG. 34 is a side perspective views of the bottom of the reel and the bottom housing of the cable retractor in accordance with an exemplary embodiment of the claimed invention.
Figure 35:
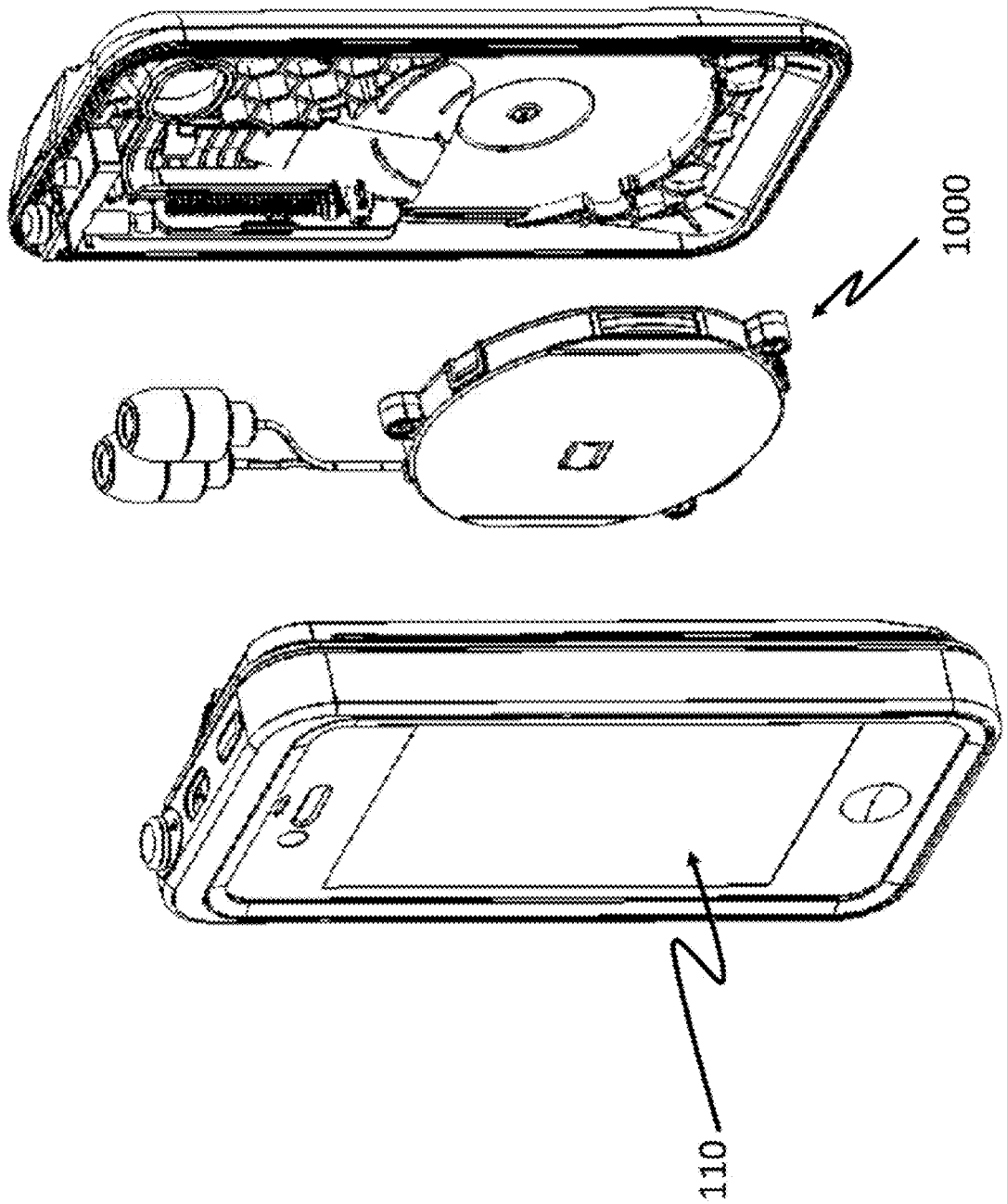
FIG. 35 is an exploded front side perspective view of the retractable storage system incorporating the cable retractor and the portable electronic device in accordance with an exemplary embodiment of the claimed invention.
Figure 36:
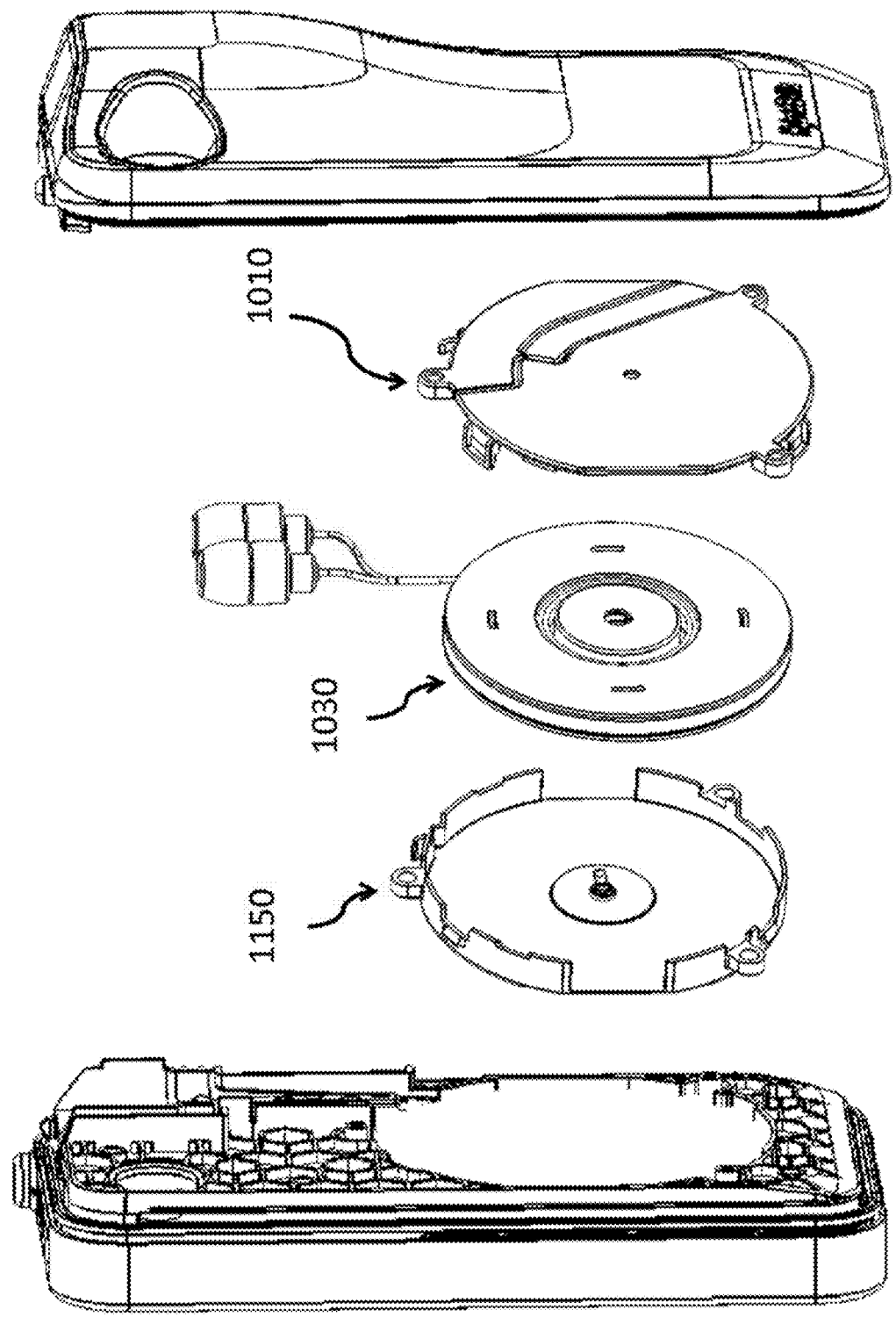
FIG. 36 is an exploded rear side perspective view of the retractable storage system incorporating the cable retractor in accordance with an exemplary embodiment of the claimed invention.

In accordance with an exemplary embodiment of the claimed invention, panel 300 is configured to be easily assembled with and into the exterior housing 111 and held by friction or a slight protrusion configured inside housing 111, and may be optionally sonically fixed (welded) or otherwise fixed in place. Similarly, the earbud station 201 can be assembled removably or in a fixed manner. As exemplary shown in FIG. 23, the carrier case 200 comprises a hinged cover 203 to open and close the aperture of the earbud station 201 or charging station 510.

Figure 18:
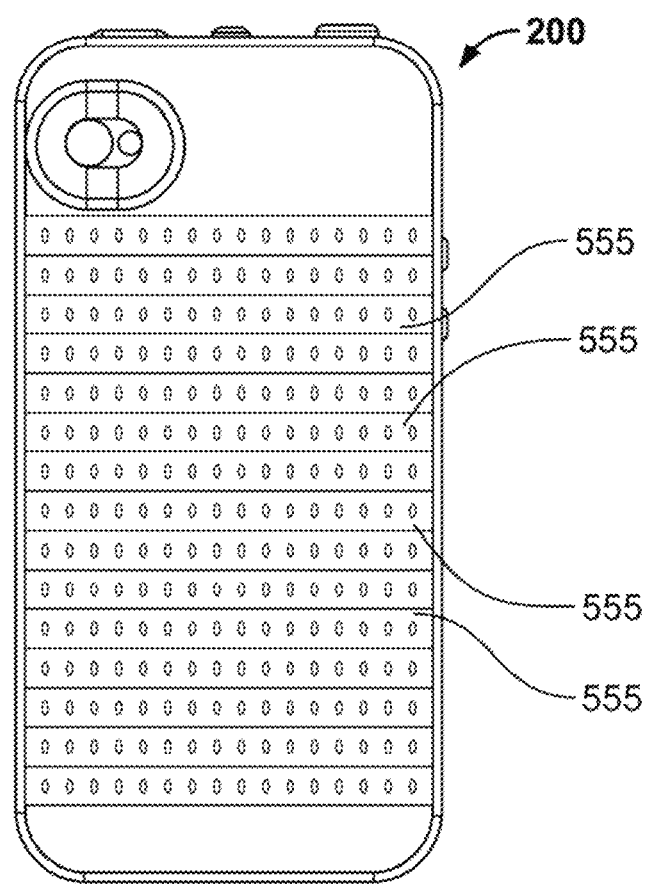
FIG. 18 is an exemplary back view of the retractable storage system with a plurality of colored LEDs in accordance with an exemplary embodiment of the claimed invention.

As will be understood by those of skill in the art, the outer housing thickness of 111 may also be formed with openings or transparent portions to show a brand region on the electronic device. Similarly, such openings or portions may be provided to receive retraction mechanisms 127A, 129A as a stylized configuration. In accordance with an exemplary embodiment of the claimed invention, as shown in FIG. 18, the carrier case 200 comprises multiple colored light emitting diodes (LEDs) 550 to display a logo, advertisement or aesthetically pleasing patterns on the back of the case. Preferably, the LED lights 550 are connected to electronic device via wire or wirelessly such that the electronic device can control and change the patterns, logo or advertisement displayed by the LEDs 550.

Figure 5:
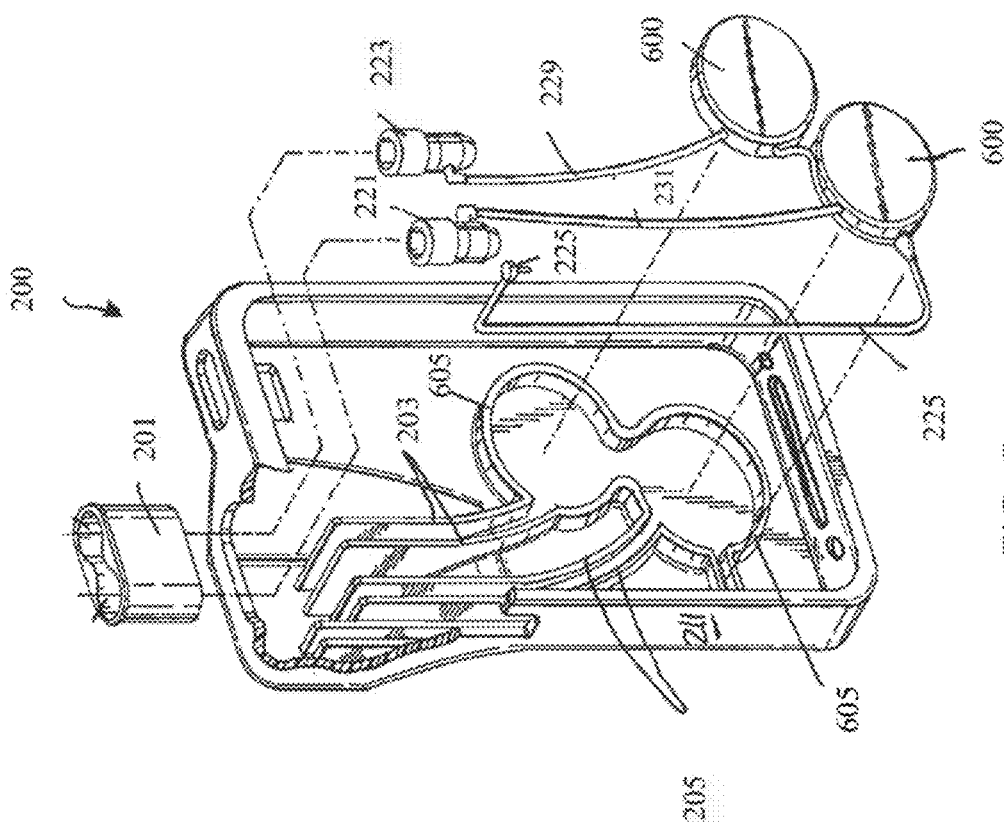
FIG. 5 is an exploded perspective view of a retractable storage system for storing earphone cables in accordance with an exemplary embodiment of the claimed invention.
Figure 8:
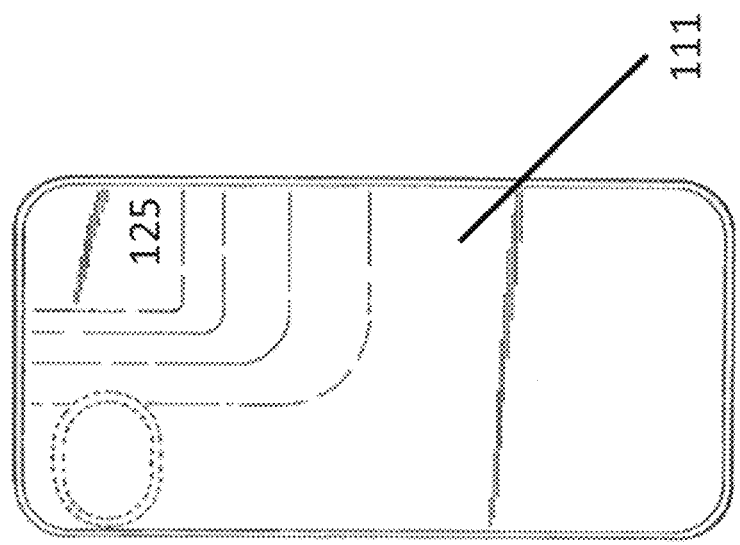
FIG. 8 is an exemplary back view of a retractable storage system in accordance with an exemplary embodiment of the claimed invention.
Figure 7:
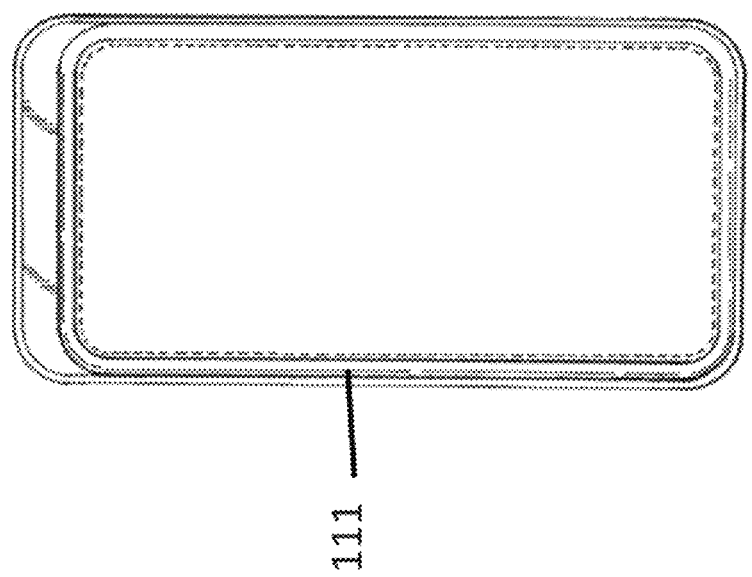
FIG. 7 is an exemplary front view of a retractable store system in accordance with an exemplary embodiment of the claimed invention.
Figure 11:
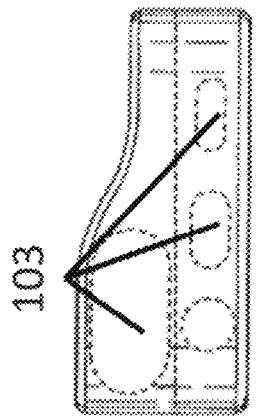
FIG. 11 is an exemplary top side view of a retractable storage system in accordance with an exemplary embodiment of the claimed invention.
Figure 12:
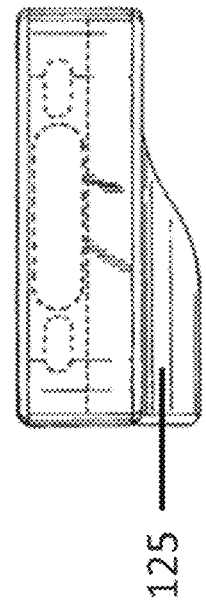
FIG. 12 is an exemplary bottom side view of a retractable storage system in accordance with an exemplary embodiment of the claimed invention.
Figure 10:
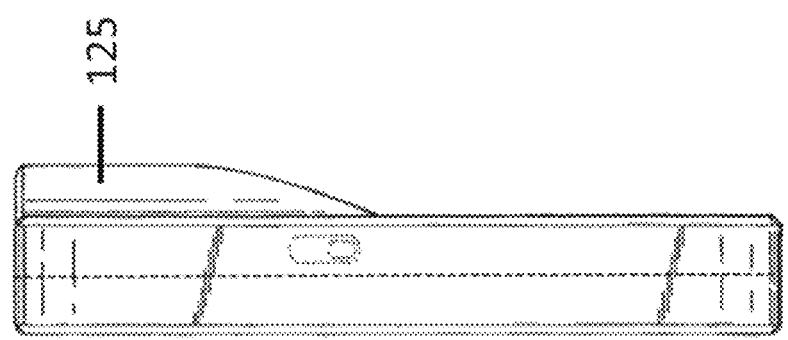
FIG. 10 is an exemplary left side view of a retractable storage system in accordance with an exemplary embodiment of the claimed invention.
Figure 9:
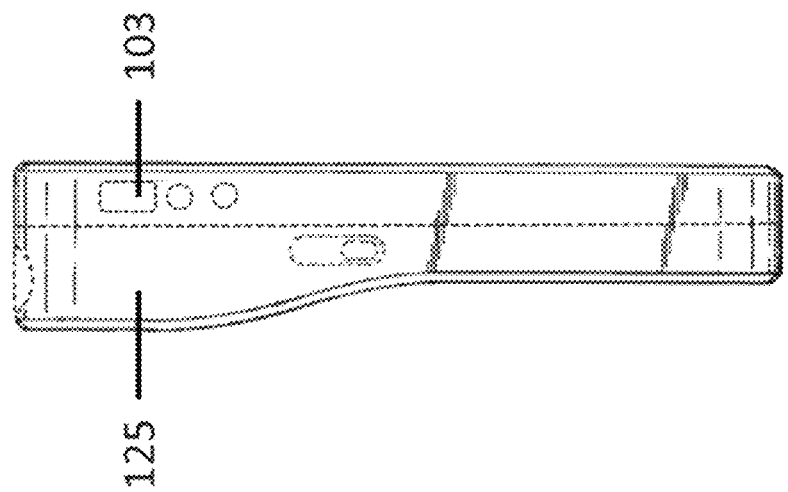
FIG. 9 is an exemplary right-side view of a retractable storage system in accordance with an exemplary embodiment of the claimed invention.

The back panel of housing 111 is configured with a slightly enlarged bounding region or compartment 125 for mounting earphone/earbud station 115. In accordance with an exemplary embodiment of the claimed invention, as shown in FIG. 5, earbud/earphone station 201 is structured to be an elongated tubular structure with two or more apertures 203, 205 shaped to match an earplug head and can be removably positioned or can be fixed in place. In accordance with an exemplary embodiment of the claimed invention, the station holder 201 can be monolithically molded into the backing of the case 100, 200. The apertures of the earbud station 201 can be configured slightly bigger than most of the earplug heads but puffed with rubber like material, to able to fit an O-ring or other adaptive structures for elasticity and tight fitness. Panel 300 may be replaced with other types of configurations suitable for the particular electronic device. It is appreciated that the panel 300 can include openings or regions that allow use of any electronic-device camera/video, aperture, or brand indicia.

Figure 6:
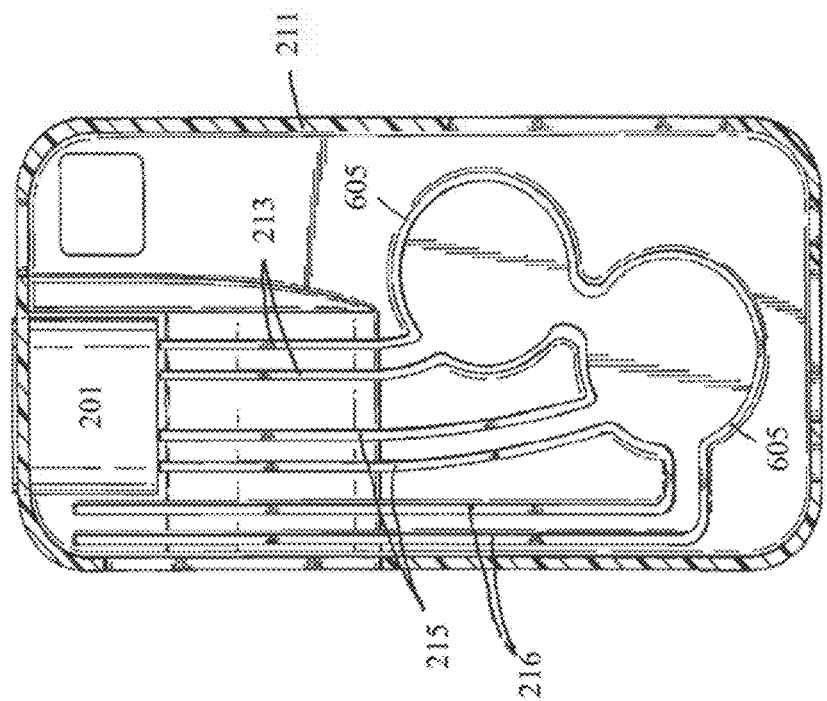
FIG. 6 is a partial sectional view of the retractable storage system of FIG. 5 in accordance with an exemplary embodiment of the claimed invention.

In accordance with an exemplary embodiment of the claimed invention, the chamber structure and channels can be monolithically, directly molded on the middle cassette or plug-in panel 300 or back panel of housing 211. In reference to FIGS. 5 and 6, the handheld device carrier case 200 comprises a housing 211 and one or more storage chambers 605 to removably house one or more accessories, such as earbud cables, wireless earbuds, headphone cables, e-cigarettes, cigars, cigarettes, lipsticks, lip balms, and like. In accordance with an exemplary embodiment of the claimed invention, the chambers 605 can house one or more retractable mechanism 600. Chamber structure 605 with one or more guiding channels 213, 215, 216 can be configured on the interior side of the back panel of housing 211 or on the plug-in panel 300. Earphone station 201 can be mounted at the top ends of the channels 213, 215. Channel 216 is configured for holding earphone plug head 225 to be plug into the earphone jack of a handheld device 110. Channels 213, 215 guide the earphone cables 229, 231 when they are pulled out for use and retracted into the respective retracting mechanism 600 for storage.

Figure 19:
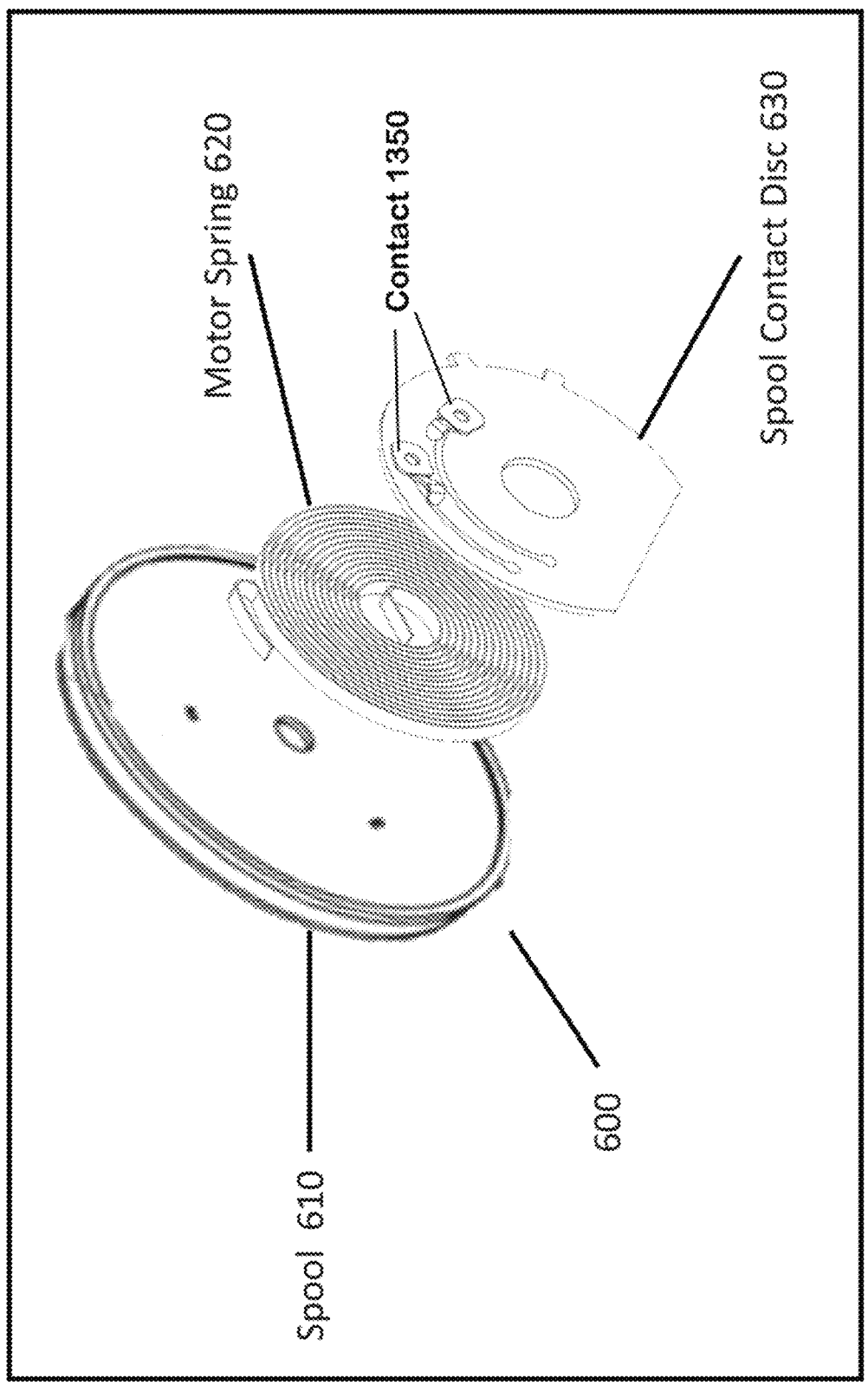
FIG. 19 is an exploded perspective view of a retractable mechanism for storing and retracting a cable in accordance with an exemplary embodiment of the claimed invention.
Figure 22:
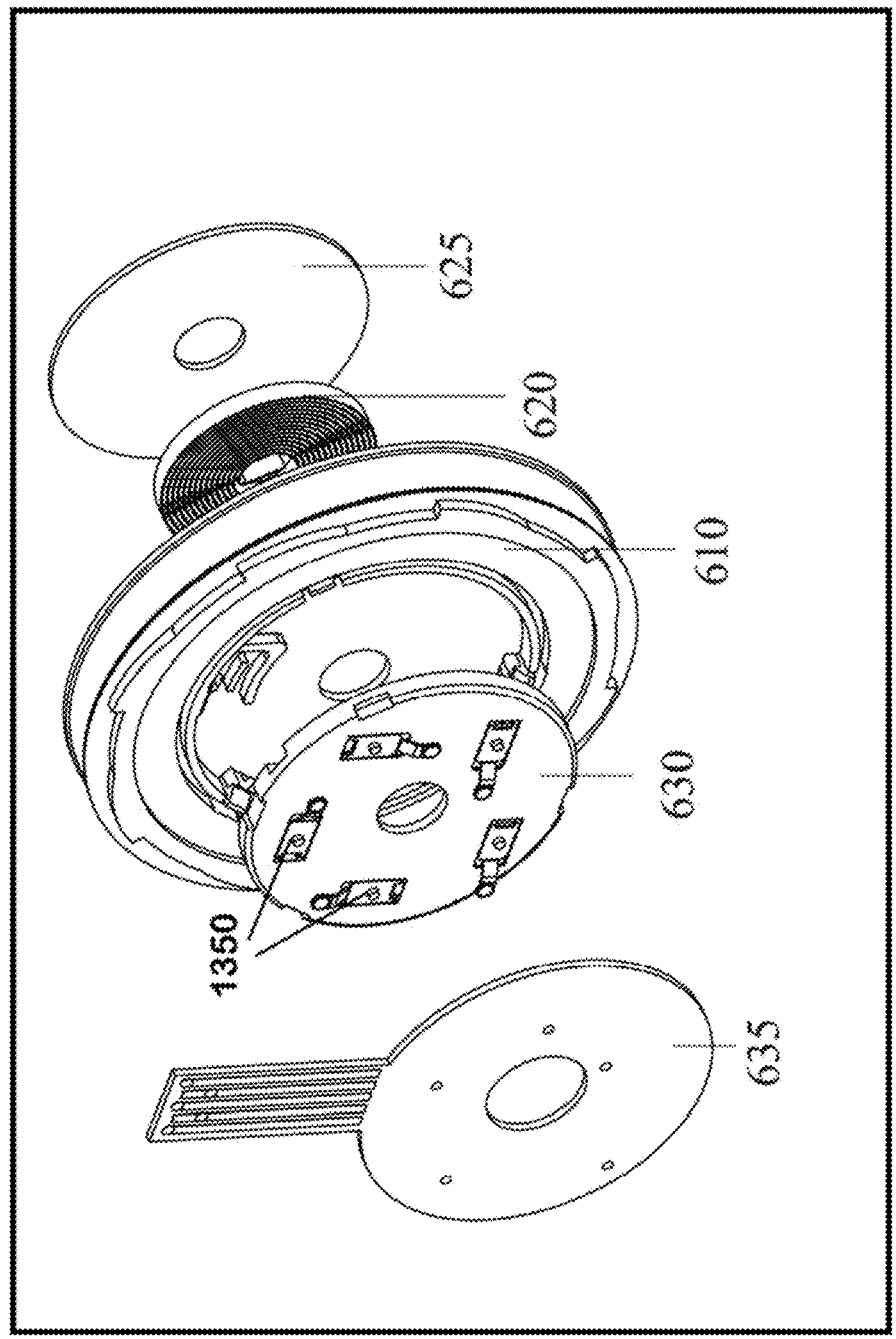
FIG. 22 is an exploded perspective view of a retractable mechanism for storing and retracting a cable in accordance with an exemplary embodiment of the claimed invention.

In accordance with an exemplary embodiment of the claimed invention, a spring box can be mounted inside each retractable mechanism 600 for automatic and independent retraction of the cables 229, 231 after use. As exemplary shown in FIG. 19, the retractable mechanism 600 comprises a spool 610 to store the cable, a motor spring 620 and a spool contact disc 630 to electrically connect the cables 231, 229 to an audio jack element or earphone plug 225 which connects to the handheld electronic device 110. To retract the cables 231, 229, the retractable mechanism 600 releases the motor spring 620 which rotates the spool 610 to roll or wrap the cables onto the spool. One or both cables 231, 229 are unwound from its respective spring-biased spool 610 by the user and the cables are wound on the spring biased spool 610 by the retractable mechanism 600 after use. Alternatively, as exemplary shown in FIGS. 22-23, the retractable mechanism 600 can comprise a washer 625 that abuts against the back panel of the housing 211, the motor spring 620, the spool 610, a spool contact disc 630 fasted or connected onto the spool 610 and a contact film 635, preferably a printed circuit board (PCB), which is fixed to the plug-in panel 300. The contacts on the spool contact disc 630 permits the cables 231, 229 on the rotating spool 610 to remain in electrical connection with the contact film 635. The contact film is electrically connected to the plug head 225.

In accordance with an exemplary embodiment of the claimed invention, the automatic retraction of the cables 229, 231 can be triggered by a gentle pull of the respective cable 229, 231 or by engaging a respective retraction or spool button 650, as exemplary shown in FIGS. 20 and 21. The retraction button 650 can be a push on/off button or a slidable retraction button moveable to the first and second positions. Each retracting mechanism 600 can be independently operated and controlled by the respective retraction button 650. As exemplary shown in FIG. 20A, the slidable retraction button 650 is moved to the second position (or moved towards the top end of the case) to engage the retractable mechanism 600 to retract the cables. As exemplary shown in FIG. 20B, the slidable retraction button 650 is moved to the first position (or moved towards the bottom end of the case) to prevent the retractable mechanism 600 from retracting the cables into the spool 610 but permitting the user to pull out more cable.

Figure 21B:
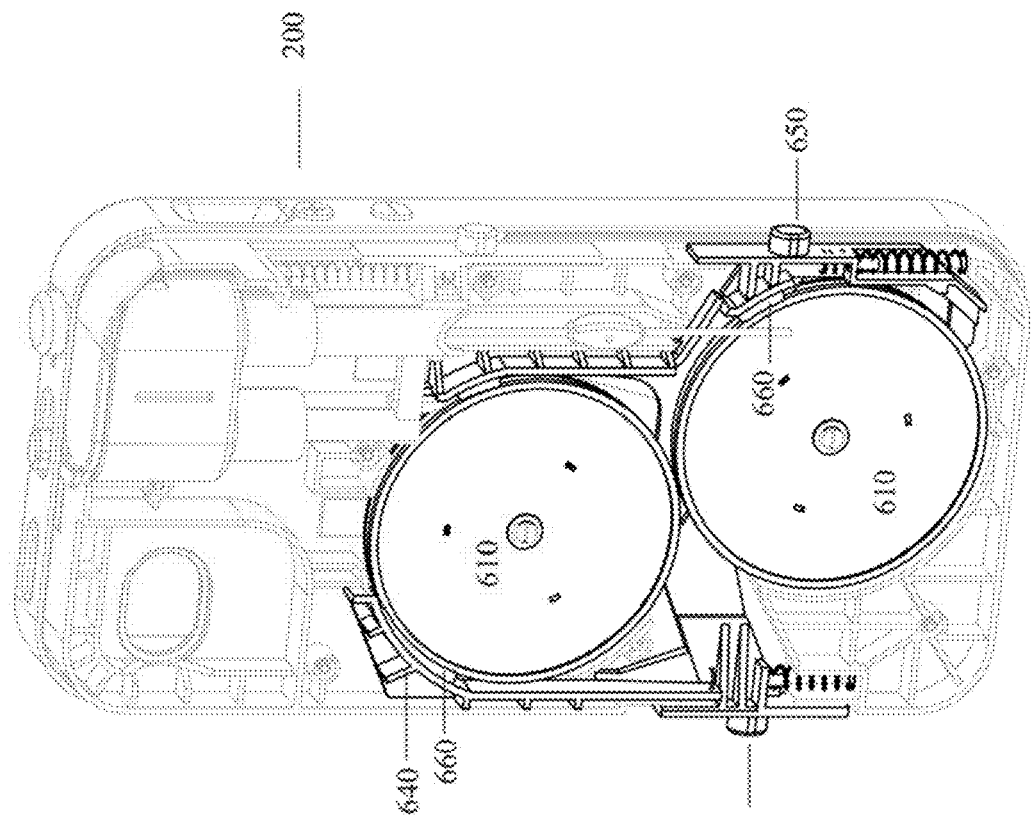
FIGS. 21A-B are perspective views of a retractable storage system with a retractable mechanism and a friction based braking system disengaged and engaged, respectively, for controlling the speed of the spring loaded spool in accordance with an exemplary embodiment of the claimed invention.
Figure 21A:
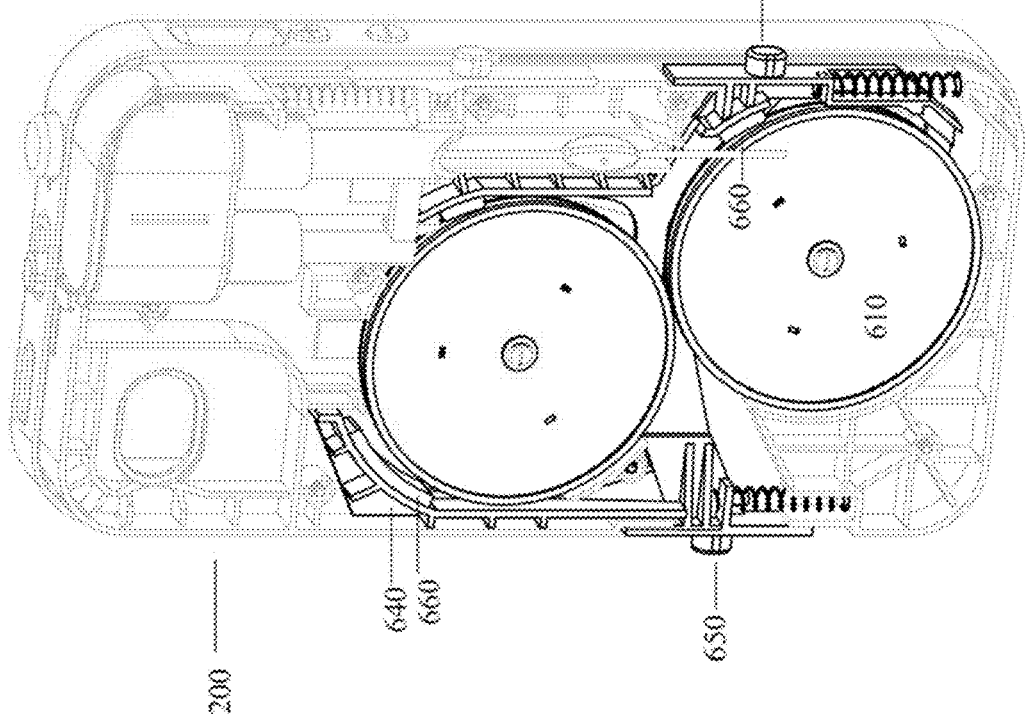

In accordance with an exemplary embodiment of the claimed invention, as exemplary shown in FIGS. 21A-B, the slidable retraction button 650 is spring loaded such that it remains in the first position until the retraction button 650 is moved to second position to retract the cables 229, 231 and returns automatically to the first position when the retraction button 650 is released. That is, the retraction button 650 must be held in the second position to retract the cables 229, 231, otherwise the retraction button 650 returns to the first position. The user moves the retraction button 600 to the second or "retract" position by sliding the button towards the bottom end of the case and holds the retraction button 650 to retract the respective cables 229, 231 onto their respective spool or reel 610, and the release of the retraction button 650 stops or disengages the retractable mechanism 600. That is, two cables 229, 231 can be pulled independently from its respective spool 610 to pull out a different cable length, e.g., 1 foot of cable 231 is pulled out and 2 foot of cable 229 is pulled out. Additionally, for example, cable 231 can be retracted independent of cable 229, such that the earbud 221 connected to cable 231 is completely retracted into the earphone/earbud station 201 while the earbud 223 connected to cable 229 remains outside of the earphone/earbud station 201.

In accordance with an exemplary embodiment of the claimed invention, the earbuds 221 and 223 can be attached to the same cable, thereby requiring only one retracting mechanism 600, as exemplary shown in FIGS. 20A-B and 24A-B. The earbuds 221, 223 docketed or stored in the earbud station 201 when not in use can be retrieved or ejected from the earbud station 201. In accordance with an exemplary embodiment of the claimed invention, the carrier case 200 comprises an accessory button 655 to slide out the earbuds 221, 223 from the earbud station 201, as exemplary shown in FIGS. 24A-B. The accessory button 655 is moved towards the earbud station 201 to slide out the earbuds 221, 223 and is moved away from the earbud station 201 to slide the earbuds 221, 223 into the earbud station 201. Alternatively, the accessory button 655 can be spring loaded, similar to the retraction button 650, so that the accessory button 655 remains in or returns to the first position (as exemplary shown in FIG. 24A) unless the accessory button 655 is moved to and held at the second position to eject or slide out the earbuds 221, 223 from the earbud station 201 (as exemplary shown in FIG. 24B).

In accordance with an exemplary embodiment of the claimed invention, as exemplary shown in FIGS. 21A-21B, each retractable mechanism 600 comprises a friction based braking system 640 to control and reduce the speed of the spring reel or spool 610 when the cables 229, 231 are being retracted into the retractable mechanism 600. The motor spring 620 of the spring-loaded retractable mechanism 600 can rotate the spring reel or spool 610 at drastic, uncontrollable speed upon release of the spring loaded mechanism 600 to retract the cable, thereby potentially stretching or even damaging the cables 229, 231. In accordance with an aspect of the claimed invention, the friction based braking system 640 comprises one or more damping pads 660 to slow down the spring reel or spool 610. For example, when the spring loaded retractable mechanism 600 is in retraction mode (the retraction button 650 is in the second or retract position, as exemplary shown in FIG. 21B), the damping pads 660 are engaged to apply pressure to the spool 610 to slow its rotational speed.

In accordance with an exemplary embodiment of the claimed invention, as exemplary shown in FIGS. 26A-B, the storage chamber 501, 605 and retraction mechanism 600 retracts and stores the headphone plug/cable 550 for use with a standard headphone (not shown). The retractable mechanism 600, preferably comprising the friction based braking system 640, automatically retracts the headphone plug/cable 550 after use. Similar to the earbud cables 229, 231, the automatic retraction of the headphone plug/cable 550 can be triggered by a gentle pull on the cable 550 or by engaging the retraction button 650. The headphone plug 550 docketed or stored in the earbud station 201 when not in use can be retrieved or ejected from the earbud station 201. Similar to the earbuds 221, 223, the station 201 is configured to accommodate the headphone plug 550 and the accessory button 655 slides the headphone plug 550 in and out of the station 201, as exemplary shown in FIGS. 26A-B. The accessory button 655 is moved towards the station 201 to slide out the headphone plug 550 and is moved away from the station 201 to slide the headphone plug 550 into the station 201. Alternatively, the accessory button 655 can be spring loaded such that the accessory button 655 remains in or returns to the first or "rest" position until the accessory button 655 is moved to second position to eject or slide out the headphone plug 550 from the station 201. The headphone plug 500 can be used with the headphone by inserting the pulled out headphone plug 550 into an audio port on the headphone or headset (not shown).

In accordance with an exemplary embodiment of the claimed invention, the cables 231, 229 can be magnetized such that two cables 231, 229 act as a single cable. A magnetic compound powder can be added to the molten rubber/plastic coating to the first cable 231 and a ferrous metal powder can be added to the molten rubber/plastic coating the second cable 229. Once cured and molded, these two separable cables 231, 229 are magnetically attracted to each other to form a single cable but allowing the user to peal apart into two cables. Depending on the application of the claimed invention, the magnetized cables 231, 229 can operate with a dual retractable mechanism 600 or a single retractable mechanism 600. In accordance with an exemplary embodiment of the claimed invention, the two magnetized cables 231, 229 are independently retracted by the respective dual retractable mechanism 600. Channels 213, 215 separates the two magnetized cables 231, 229 and guide the two magnetized cables 231, 229 when they are pulled out and retracted into the respective dual retractable mechanism 600. When two earbuds 221, 223 attached to the two magnetized cables 231, 229 are pulled out from the earphone station 201, the two magnetized cables 231, 229 are magnetically attracted to each other to form a single cable and the user can peel apart a section of the two magnetized cables 231, 229 to separate the earbuds 221, 223.

In accordance with an exemplary embodiment of the claimed invention, the two magnetized cables 231, 229 are magnetically attached to form a single cable and retracted into the same retractable mechanism. That is, one of the channel 213, 215 guides both magnetized cables 231, 229 when they are pulled out and retracted into the same retractable mechanism 600. When two earbuds 221, 223 attached to the two magnetized cables 231, 229 are pulled out, the user can separate the two magnetically attached cables 231, 229 into two separate cables 231, 229 of desired length.

Figure 17:
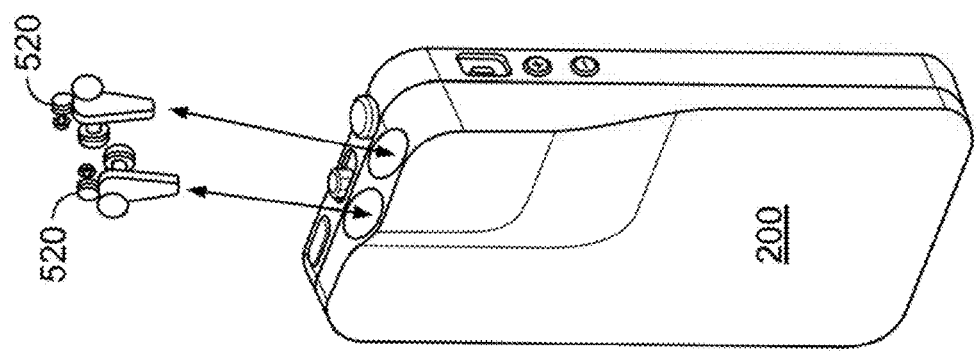
FIG. 17 is an exemplary perspective view of the retractable storage system for storing, charging and dispensing wireless earbuds in accordance with an exemplary embodiment of the claimed invention.
Figure 16:
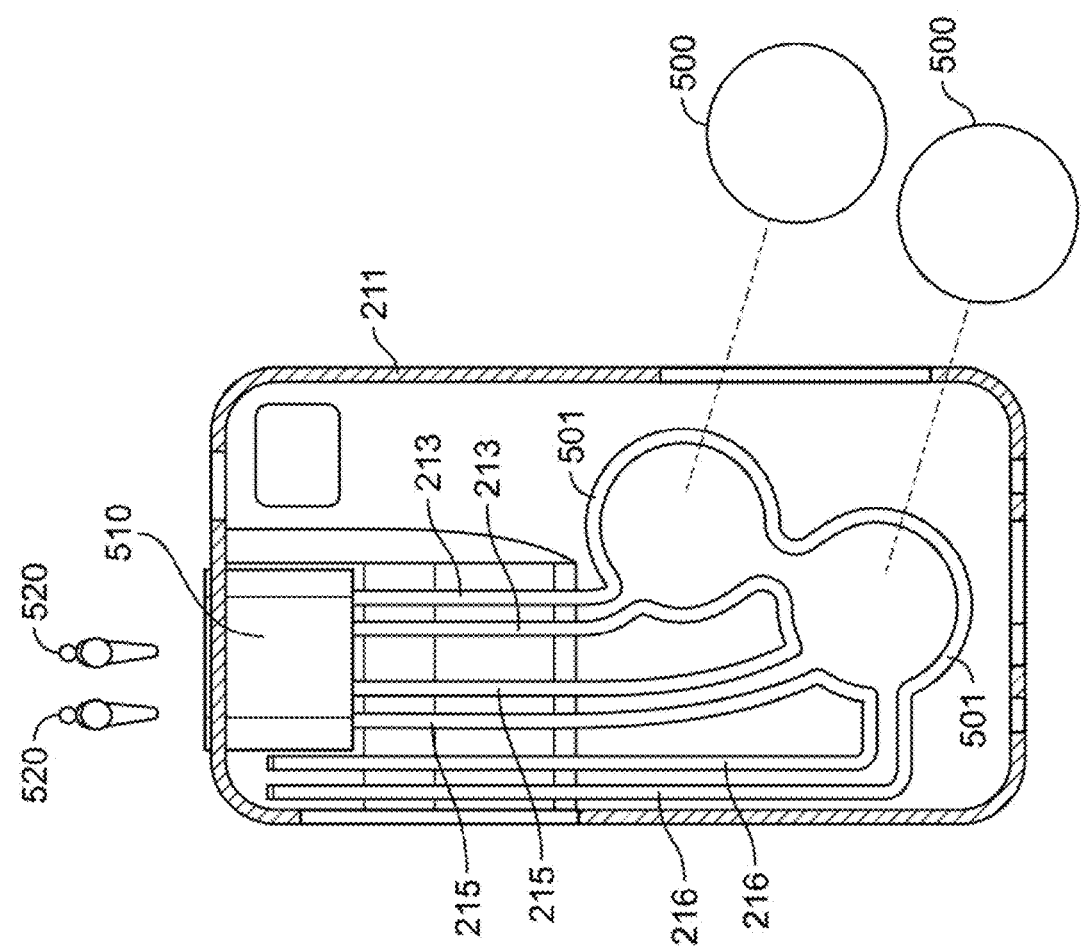
FIG. 16 is a partial section view of the retractable storage system with battery chambers in accordance with an exemplary embodiment of the claimed invention.

In accordance with an exemplary embodiment of the claimed invention, as shown in FIGS. 16-17, the back panel of carrier case 200 or one side of the plug-in panel 300 can comprise one or more storage chambers 501 to house one or more batteries 500 instead of the retractable mechanisms 600. Although the storage chambers 501 are shown as circular in FIG. 16, it is appreciated that the storage chamber 501 can be shaped to house a different shaped battery 500, such as a square or rectangular shaped battery 500. The battery 500 is operable to extend the battery life of the electronic device and/or charge the wireless earbuds 520, preferably Bluetooth™ earbuds 520, when it is placed in the charging station 510. The wireless earbuds 520 click in and out of the charging station 510. The wireless earbuds 520 communicates wirelessly, such as via Bluetooth, with the electronic device 110. Preferably, the accessory button 655 can be used to dispense or pushed out the wireless earbuds 520 from the charging station 510, as exemplary shown in FIGS. 24A-B with wired earbuds 221, 223. The battery chambers 501 are in electrical connection with the electronic device and the charging station 510. In accordance with an aspect of the claimed invention, the guides 213, 215 houses wires connecting the earbud station 510 and guide 216 can be used to house wires connecting the battery 500 to the electronic device. Accordingly, the claimed system provides protection, storage and battery management to wireless Bluetooth earphones and smartphones. Although two storage chambers 501 and two batteries 500 are shown in FIG. 16, it is appreciated that the carrier case 200 can comprise one storage chamber 501 to house one battery 500.

In accordance with an exemplary embodiment of the claimed invention, as exemplary shown in FIG. 25A-B, the back panel of carrier case 200 or one side of the plug-in panel 300 can be monolithically, directly molded with chambers and/or channels to house one or more accessories 530, such as lipsticks, lip protection balm, cigarettes, cigars or electronic cigarettes (or e-cigarettes). The ejection button 655 can be used to retrieve, push out or eject an accessory from the storage chambers 501. It is appreciated that although the storage chamber 501 is illustrated as being circular in FIG. 16, it can be molded into any shape to accommodate different shaped accessories, such as a tubular shaped storage chamber to store e-cigarette, cigar, cigarette, lip balm or lipstick, as exemplary shown in FIGS. 25A-B. As with the wireless earbuds 520, the charging station 510 charges the e-cigarette 530 using the internal battery 500 when it is stored in the storage chamber 501 and can be ejected from the storage chamber 501 by the retraction button 650, as exemplary shown in FIG. 25B.

In accordance with an exemplary embodiment of the claimed invention, an exterior antenna transmitter/receiver maybe fixedly mounted into the chamber structures 605 to enhance the signal reception of the handheld electronic device 110, such as a cellular or WI-FI reception for a cell phone.

In accordance with an exemplary embodiment of the claimed invention, as shown in FIG. 18, the carrier case 200 comprises multiple colored LED lights 550 to display a logo, advertisement or aesthetically pleasing patterns on the back of the case. Preferably, the LED lights 550 are connected to electronic device 110 via wire or wirelessly such that the electronic device can control and change the patterns, logo or advertisement displayed by the LED lights 550.

Other features exterior look may be configured as described in FIGS. 7-12 for matching a handheld device 110, with sufficient apertures configured on the sides for accessing the buttons of the device. These views are provided for non-limiting illustrative purposes. As will be noted in FIG. 13, the upper lip region is slightly larger to encompass the particular audio jack (3.5 mm type) in these versions, but should jack-access be on the bottom region, the larger region in the case would be optionally positioned to allow insertion and removal appropriate to the electronic device. Although, FIGS. 7-12 show the carrier case for use with a cell phone or smart phone, it is appreciated that the inventive carrier case can be applied to any hand held electronic device, such as a tablet, e-reader, MP3 device and a remote control device for controlling operating an electronic device, such as TVs, blu-ray players, video-streaming players, etc.

Regarding FIGS. 13-15, illustrative exemplary actuation systems 301, 302, 303 in accordance with embodiments of the claimed invention are provided. In actuation system 301 as exemplary shown in FIGS. 13A-B, an audio jack element or earphone plug (e.g., 105, or 225) can be removed and inserted using a wedge member 310 by the moving or sliding the plug button 315 towards the jack element 225 (as exemplary shown in FIG. 13A) to drive wedge 310 under and thus lift the jack element 225 out of the receiving hole 112 (e.g., an audio port) in the handheld electronic device 110. Thereafter, the plug button 315 is moved away from the jack element 225 (as exemplary shown in FIG. 13B) and the jack element 225 is pushed downwardly into the receiving hold 112 to reinstall the jack for desired use. In this way, a user can easily (and one-handedly) remove and reinsert the jack element 225 and thus activate and deactivate the earbud system.

As exemplary shown in FIG. 14, a lever member 314 has a projecting portion 315 through a case opening and a fixed position 316 allowing member 314 to operate as a pivot lever. Lever member 314 is configured to capture the jack element or earphone plug 105, 225 and control its movement relative to the insertion axis, and thus similarly lifting or removing the earphone plug 105, 225 in direction A from the receiving hole 112 of the electronic device and inserting the earphone plug 105, 225 in direction B into the receiving hole 112 of the electronic device.

As exemplary shown in FIG. 15, a pivot member 320 is captively pivotable within case 100, 200 to operably secure the jack member or earphone plug 105, 225 to the electronic device. The pivot member 320 is operable in pivot motion A to remove earphone plug 105, 225 from the receiving hole 112 of the electronic device and operable in pivot motion B to insert the earphone plug 105, 225 into the receiving hole 112 of the electronic device. Such pivoting may be threaded (both pivot and rising/lowering), or may be a pivot-wedge system (pivot-driving-a-wedge for lifting with press-return) without departing from the scope and spirit of the present invention. As will be understood by those of skill in the art, each of these alternative and operative mechanisms, or means, are insertion-removal means and are not limited to the present alternative illustrations, but instead include all related variations that accomplish a similar function.

In accordance with an exemplary embodiment of the claimed invention, a cable retractor 1000, as shown in FIGS. 27-36, 42A-D, and 43-47, can be used with a wide variety of portable electronic devices 110, including but not limited to phones, smart phones, gaming systems, portable media players, and the like.

Figure 56A:
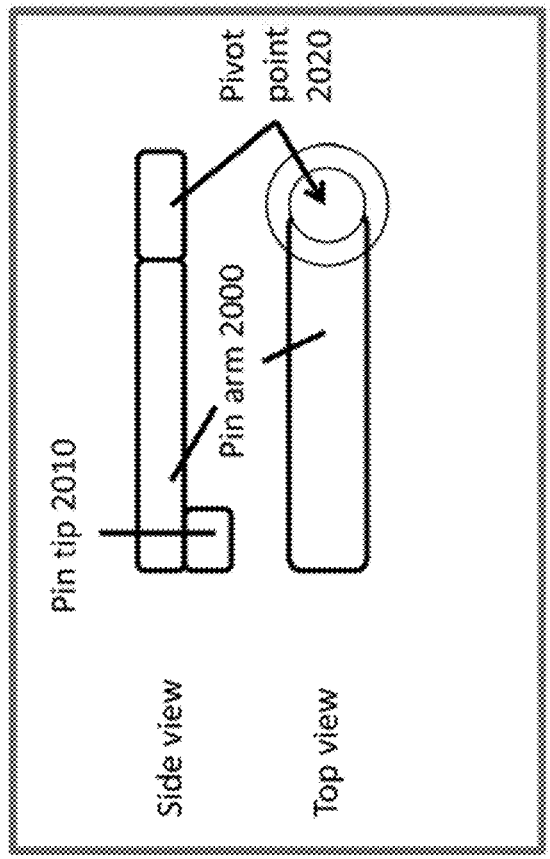
FIGS. 56A-B are perspective views of pin style cable retraction system in accordance with an exemplary embodiment of the claimed invention.
Figure 56B:
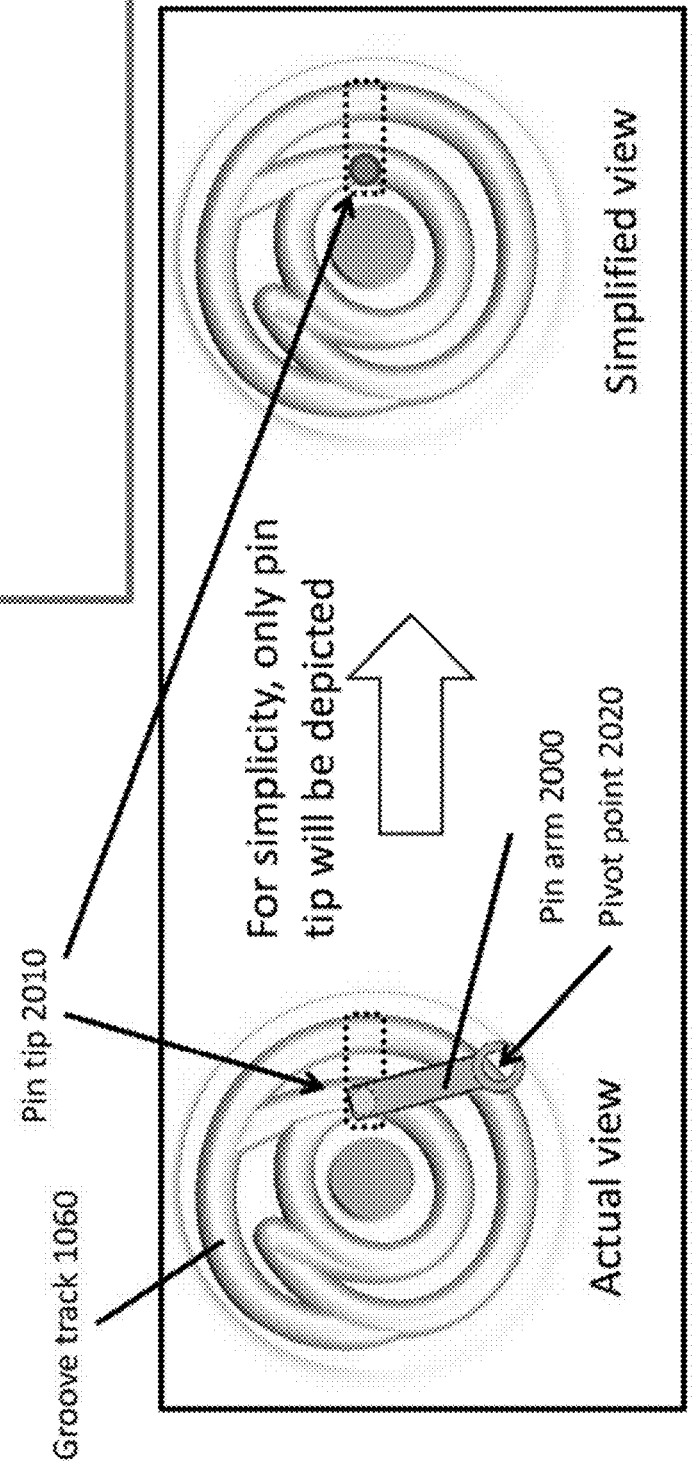

In accordance with an exemplary embodiment of the claimed invention, as shown in FIGS. 27-35, the cable retractor or cable retraction system 1000 generally comprises a top housing 1010 and a reel 1030. The reel 1030 comprises a first face 1040 and a second face 1050, a bottom housing 1150, a spring 1220, a cable 1230, and a ball bearing 1240. In accordance with an aspect of the claimed invention, as shown in FIG. 56A-B, the cable retractor 1000 comprises a pin arm 2000 (rod or latch arm 2000) and pin tip 2010 instead of the ball bearing 1240. The cable retractor 1000 is configured to retract a cable 1230 to store the cable and to allow extension of the cable 1230 when the cable is being used. In accordance with an exemplary embodiment of the claimed invention, the cable retractor 1000 can be removably mounted or coupled to a portable electronic device 110. Alternatively, the cable retractor 1000 can be removably incorporated into a protective case 100 for use with the portable electronic device 110.

In accordance with an exemplary embodiment of the claimed invention, as shown in FIGS. 56A-B, pin arm 2000 lies above the plane of the groove track 1060. The pin tip 2010 drops down into the plane and interacts with the groove track 1060. Pin arm 2000 rotates around its pivot point 2020 such that the pin tip 2010 moves radially towards or away from the grooves track center while always remaining within the groove track 1060. The pin tip 2010 functions similar to a ball bearing 1240 placed within a confined space, as described herein.

In accordance with an exemplary embodiment of the claimed invention, the bottom housing 1150 comprises a ball bearing or pin containment area 1170 and the second face 1050 of the reel 1030 comprises a groove track or ball bearing groove track 1060 which guides the ball bearing 1240 or the pin tip 2010 and pin arm 2000. The bottom housing 1150 and the reel 1030 are cooperatively configured for the reel 1030 to rotate relative to the bottom housing 1150 to wind and unwind the cable 1230. The top housing 1010 and the bottom housing 1150 cooperatively define a cavity 1180 in which reel 1030 is positioned therein, such that the cable 1230 is wound or unwound from the reel 1030 so as to be drawn into or out of the cavity 1180. The top housing 1010, the bottom housing 1150 and the reel 1030 are cooperatively sized, generally circular in shape for the reel 1030 to rotate within the cavity 1180.

In accordance an exemplary embodiment of the claimed invention, the relative movement, preferably rotational movement, of the groove track 1060 with respect to the ball bearing 1240 or the pin arm 2000 and pin tip 2010 is described in conjunction with FIGS. 42A-D and 43-47. During operation of the cable retractor 1000, the ball bearing 1240 or the pin tip 2010 and the groove track 1060 rotate relative to each other. For purpose of simplicity, the motion will be described herein as though the ball bearing 1240 or the pin tip 2010 is in motion while the groove track 1060 is stationary. In actual operation, as exemplary shown in FIGS. 42A-D, the groove track 1060 rotates while the ball bearing 1240 or the pin tip 2010 is relatively stationary. The groove track 1060 moves relative to the ball bearing 1240 or pin tip 2010 which only slides radially. That is, the groove track 1060 enables and disables the rotational movement of the cable retractor 1000. As noted herein, the rotational movement of the cable retractor 1000, specifically, the rotational movement between the groove track 1060 and the ball bearing 1240 or pin tip 2010, is activated and deactivated in response to the cable 1230 being pulled from the cable retractor 1000.

Figure 43C:
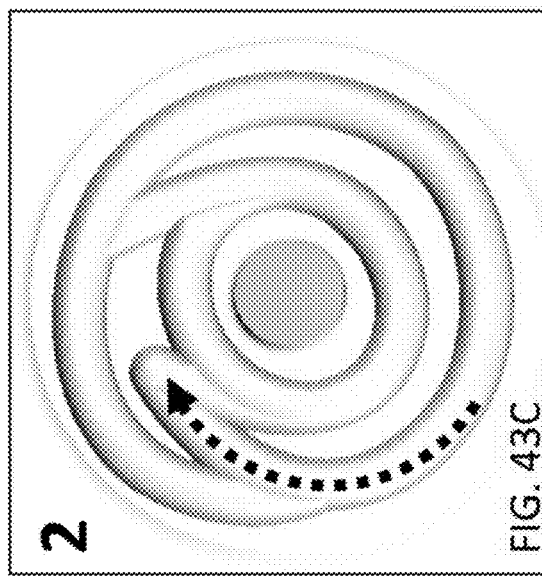
FIGS. 43A-F are views of the relative rotational movements of the ball bearing/pin tip and the groove track during various operational modes of the cable retractor in accordance with an exemplary embodiment of the claimed invention.
Figure 43F:
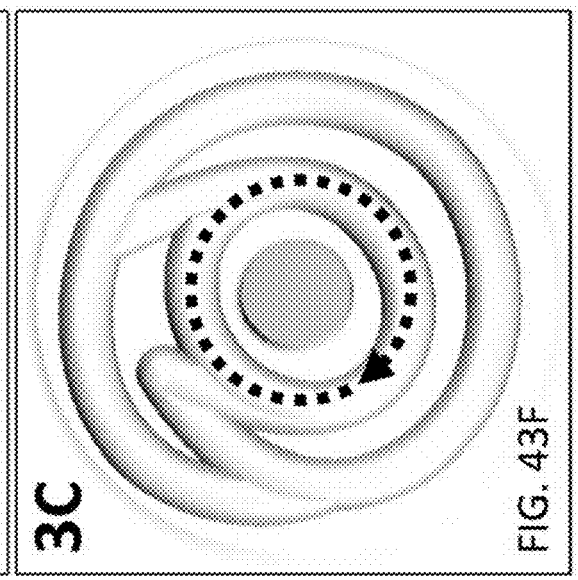
Figure 43B:
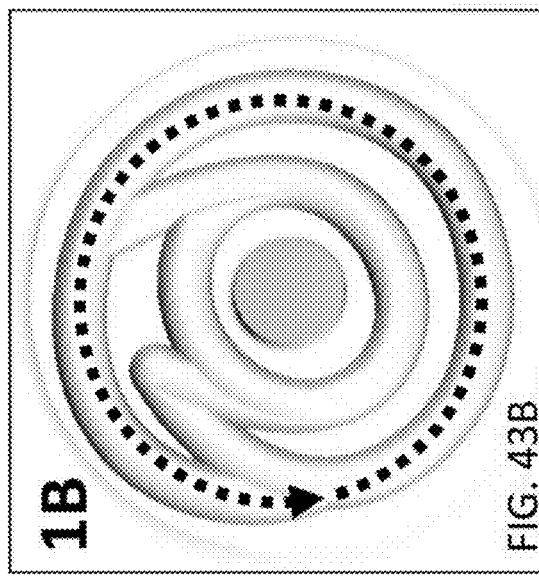
Figure 43E:
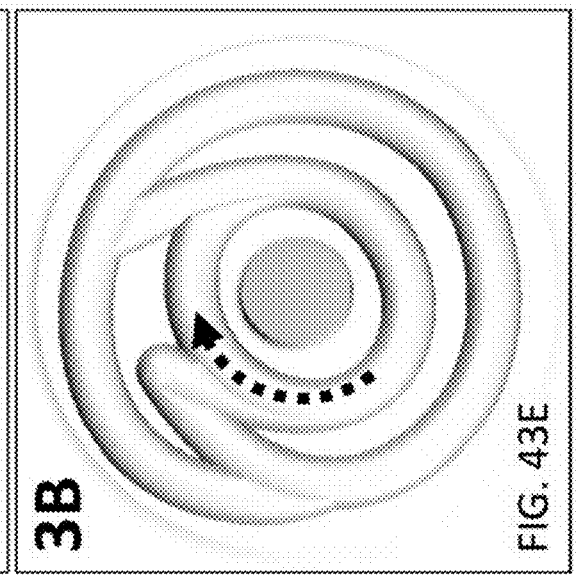
Figure 43A:
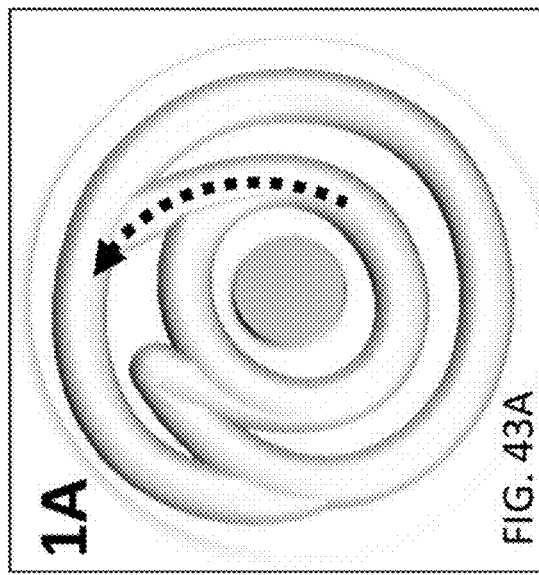
Figure 43D:
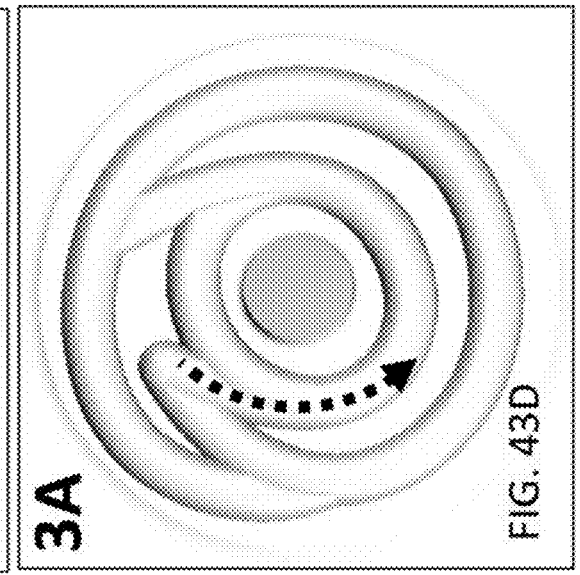
Figure 44:
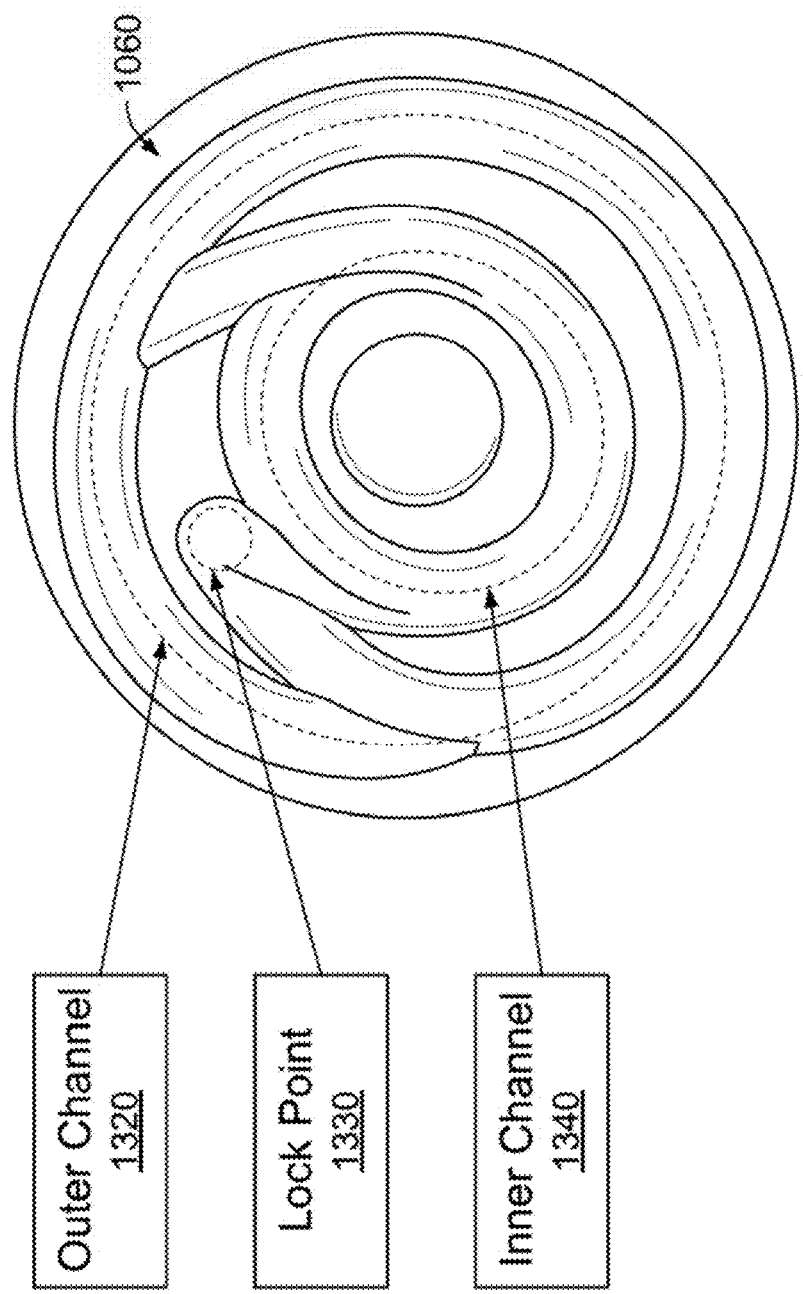
FIG. 44 is a view of the groove track of the cable retractor in accordance with an exemplary embodiment of the claimed invention.

In accordance with an exemplary embodiment of the claimed invention, as shown in FIG. 44, the groove track 1060 comprises an outer channel 1320, an inner channel 1340 and a lock point 1330. In accordance with an exemplary embodiment of the claimed invention, the various groove track and ball bearing modes (or various groove track and pin modes) of the cable retractor 1000 are shown in FIG. 43 and described in conjunction with FIG. 44. As noted herein, for purpose of simplicity, the groove track/ball bearing motion (or the groove track/pin motion) will be described herein as though the ball bearing 1240 or the pin tip 2010 is motion while the groove track 1060 is stationary.

In accordance with an exemplary embodiment of the claimed invention, the cable retraction operation Mode 1A is illustrated in FIG. 43A with the ball bearing 1240 or pin tip 2010 located in the inner channel 1340. In response to retraction of the cable 1230 from the cable retractor 1000 (when the user pulls the cable 1230 from the cable retractor 1000), the ball bearing 1240 or pin tip 2010 travels in a counter-clockwise direction and the groove track 1060 guides the ball bearing 1240 or pin tip 2010 into the outer channel 1320.

In accordance with an exemplary embodiment of the claimed invention, the cable retraction operation Mode 1B is illustrated in FIG. 43B with the ball bearing 1240 or pin tip 2010 located in the outer channel 1320. The ball bearing 1240 or pin tip 2010 moves in a counter-clockwise direction and remains in the outer channel 1320. The motion of the ball bearing 1240 or pin tip 2010 is unimpeded as the desired amount of the cable 1230 is retracted from the cable retractor 1000.

In accordance with an exemplary embodiment of the claimed invention, the cable retraction operation Mode 2 is illustrated in FIG. 43C. After the desired amount of the cable 1230 has been retracted from the cable retractor 1000 (when the user stops pulling the cable 1230 from the cable retractor 1000), the force of the spring 1220 causes the ball bearing 1240 or pin tip 2010 to briefly rotate in clockwise direction. In the clockwise direction, the groove track 1060 guides the ball bearing 1240 or pin tip 2010 out of the outer channel and into the lock point 1330. The cable retractor 1000 is now locked with the desired amount of the cable 1230 withdrawn or retracted from the cable retractor 1000.

In accordance with an exemplary embodiment of the claimed invention, the cable storage operation Mode 3A is illustrated in FIG. 43D. When the cable 1230 is ready to be stored or re-spooled onto the reel 1030, the user retracts the cable 1230 slightly (e.g., a short amount of the cable 1230 is retracted) to force the ball bearing 1240 or pin tip 2010 to travel slightly in a counter-clockwise direction, as exemplary shown in FIG. 43D. The groove track 1060 guides the ball bearing 1240 or pin tip 2010 into the inner channel 1340.

In accordance with an exemplary embodiment of the claimed invention, the cable storage operation Mode 3B is illustrated in FIG. 43E. After short retraction of the cable 1230 during the cable storage operation Mode 3A, the user releases the cable 1230 and the spring 1220 drives the ball bearing 1240 or pin tip 2010 in a clockwise direction, as exemplary shown in FIG. 43E. The groove track 1060 prevents the ball bearing 1240 or pin tip 2010 from returning to the lock point 1330.

In accordance with an exemplary embodiment of the claimed invention, the cable storage operation Mode 3C is illustrated in FIG. 43F. The groove track 1060 guides the ball bearing 1240 or pin tip 2010 in a clock-wise direction unimpeded within the inner channel 1340, as exemplary shown in FIG. 43F. This relative motion between the ball bearing 1240 (or pin tip 2010) and the groove track 1060 continues unimpeded as the spring 1220 re-spools and stores the cable 1230 onto the reel 1030.

In accordance with an exemplary embodiment of the clamed invention, the reel 1030 comprises an inner circular protrusion 1075 and outer circular protrusion 1090 to define a first area 1110, a second area 1120 and a third area 1130. The first area 1110 for storing the cable 1230 is positioned radially outward of the outer circular protrusion 1090 and is configured to store the bulk of the cable 1230. That is, the cable 1230 is wound around the outer circular protrusion 1090 of the reel 1030 for storage within the first or cable storage area 1110 generally in a single plane. That is, the cable 1230 is wound into one or more windings wherein each revolution of the cable 1230 generally does not overlap any other revolution of the cable 1230 in an axial direction and/or a single plane passes through each entire revolution of the cable 1230 in the winding.

The second area 1120 of the reel 1030 is positioned between the inner circular protrusion 1075 and the outer circular protrusion 1090. The second area 1120 is configured to store the excess portion of cable 1230. An aperture or slot 1100 on the outer circular protrusion 1090 are configured such that cable 1230 passes from the first area 1110 to the second area 1120, such that cable 1230 is wound radially outward of the outer circular protrusion 1090 in the first area 1110 and wound radially outward of the inner circular protrusion 1095 in the second area 1120. The second area 1120 acts an expansion area to house or store excess cable, thereby permitting the claimed independent cable retraction system 1000 to utilize a single seamless cable with no breaks, splices or cuts. In accordance with an exemplary embodiment of the claimed invention, the first and second area 1110, 1120 are generally coplanar with the third area 1130 for housing the spring 1220. It is appreciated that the coplanar relationship between the three areas 1110, 1120. 1130 of the reel 1030 advantageously operates to minimize the thickness of the cable retractor 1000.

In accordance with an exemplary embodiment of the claimed invention, a first end of the cable 1230 stored in the first area 1110 of the reel 1030 exits through a port 1190 cooperatively formed by the top housing 1010 and the bottom housing 1150. The first end of the cable 1230 is configured to be connected to an end piece, such as a pair of earbuds or a headphone plug. A second end of the cable 1230 exits the second area 1120 through an aperture or port 1020 on the top housing 1010. The second end of the cable 1230 is configured to be connected to an audio plug which connects to an audio port of the portable electronic device 110.

In accordance with an exemplary embodiment of the claimed invention, the top housing 1010, the bottom housing 1150 and the reel 1030 cooperatively define a central axis about which the reel 1030 rotates and about which the cable 1230 is wound. The bottom housing 1150 comprises a central rounded post 1200, which is received by a central aperture 1140 of the reel 1030.

In accordance with an exemplary embodiment of the claimed invention, the second face 1050 of the reel 1030 and an inner face 1160 of the bottom housing 1150 are configured for the second face 1050 of the reel 1030 to slide or rotate against the generally planar inner face 1160 of the bottom housing 1150.

In accordance with an exemplary embodiment of the claimed invention, the inner circular protrusion 1075 is configured to define the third area 1130 radially inward thereof for storing the spring 1220. The spring 1220 (e.g., a coiled clock or power spring) is positioned with the third area 1130 and is configured to cause rotation of the reel 1030 relative to the bottom housing 1150. An inner end of the spring 1220 is coupled to the central post 1200 of the bottom housing 1150 and an outer end of the spring 1220 is coupled to the reel 1030. Preferably, the central post 1200 has a slot 1210 for receiving the inner end of the spring 1220. In accordance with an exemplary embodiment of the claimed invention, the inner circular protrusion 1075 has one or more apertures or cutouts 1080 for receiving the outer end of the spring 1220. When the reel 1030 is rotated relative to the bottom housing member 1150, the spring 1220 applies a counter-torque to the reel 1030 to cause rotation thereof.

In accordance with an exemplary embodiment of the claimed invention, the reel 1030 is configured to couple to the cable 1230, such that rotation of the reel 1030 causes the cable 1230 to be drawn into the first area 1110 of the reel 1030 to be wound around the central axis of rotation as defined by the central post 1200. In accordance with an exemplary embodiment of the claimed invention, the cable 1230 is coupled to the reel 1030 by way of the aperture 1100 in the outer circular protrusion 1090, preferably a guided aperture or an aperture with a coupling to tightly hold the cable 1230 placed therein.

Figure 37:
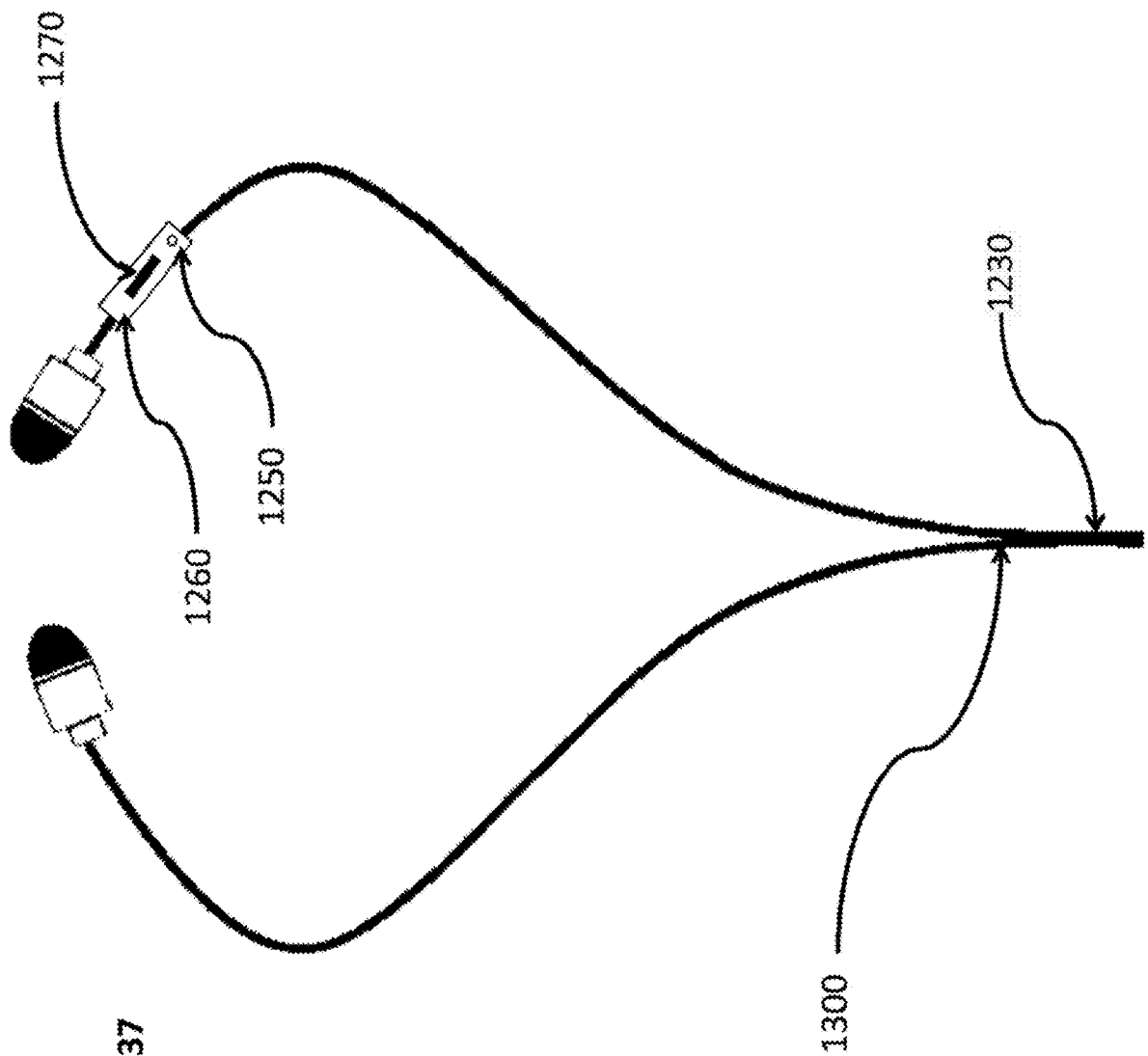
FIG. 37 is a view of the peelable/splitable cable in accordance with an exemplary embodiment of the claimed invention.
Figure 39:
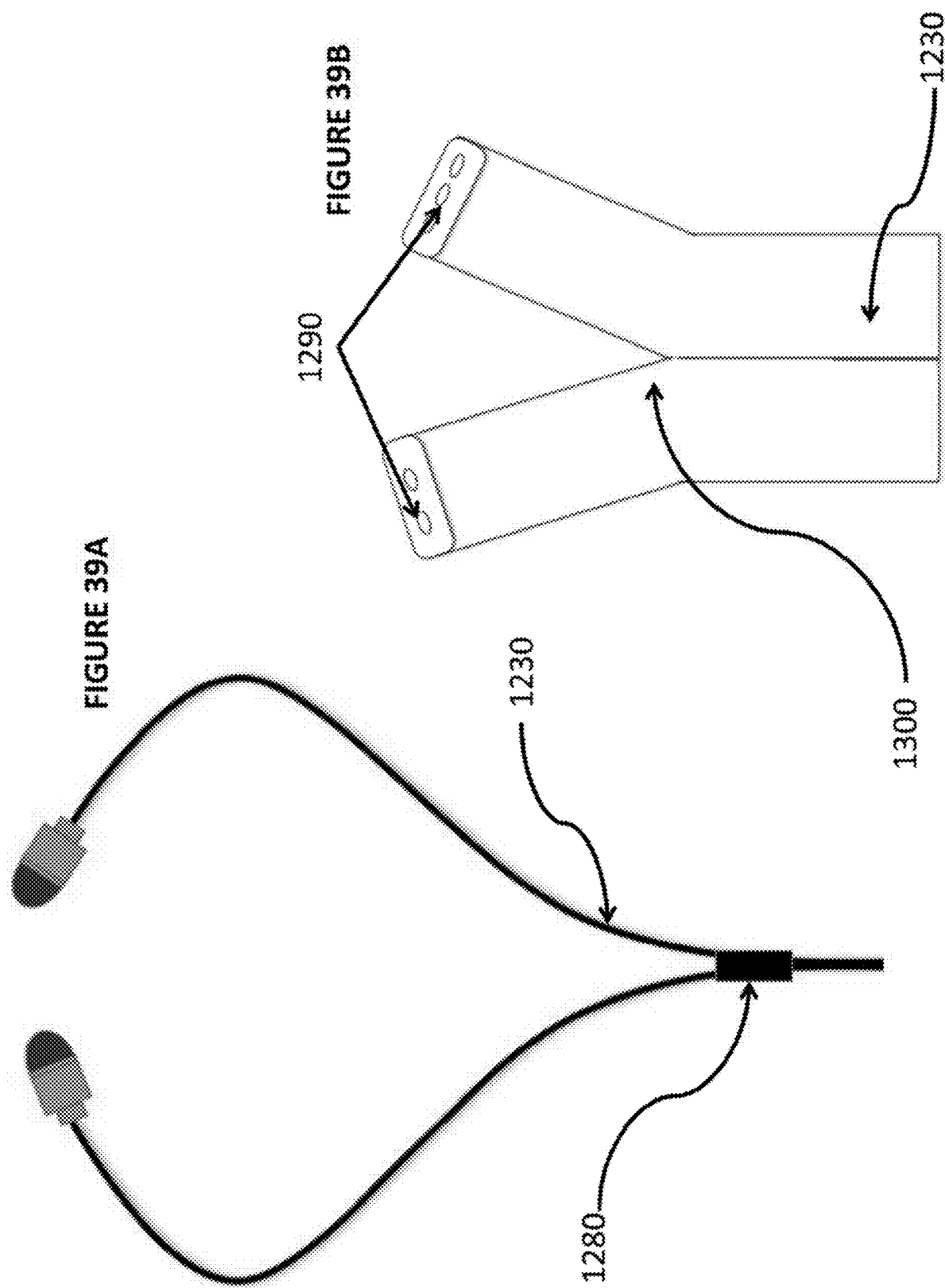
FIG. 39A-B are views of the peelable/splitable cable with the cable y-split reinforcing component in accordance with an exemplary embodiment of the claimed invention.
Figure 40:
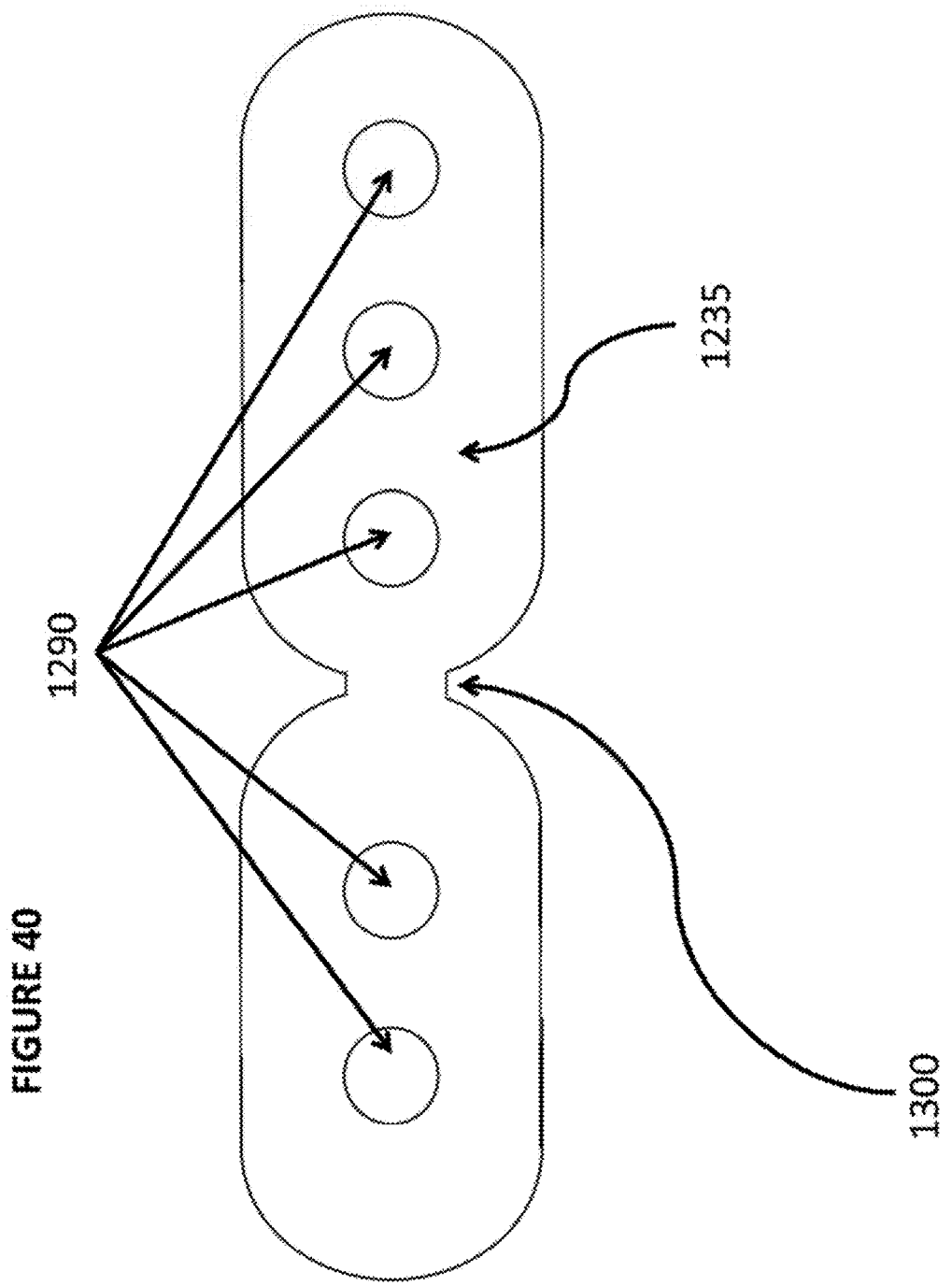
FIG. 40 is an exploded view of the cable conductors of the peelable/splitable cable in accordance with an exemplary embodiment of the claimed invention.

Turning now to FIGS. 37, 39A-B, there is illustrated a peelable/splitable cable 1300 in accordance with an exemplary embodiment of the claimed invention. The claimed peelable/splitable cable 1300 allows for a low-profile cable design which contributes to the low or thin profile of the cable retractor 1000. It is appreciated that without the claimed peelable/splitable cable, the cable for used in the cable retractor 1000 would require a large "y-split" feature instead of the cable y-split reinforcing component 1280, as shown in FIG. 39A.

As shown in FIGS. 39B-41, in accordance with an exemplary embodiment of the claimed invention, the cable conductors 1290 are constructed co-planar on a single plane within the cable jacket material 1235, thereby allowing a low-profile cable design which helps the profile of the overall system, i.e., the cable retractor 1000.

Figure 41:
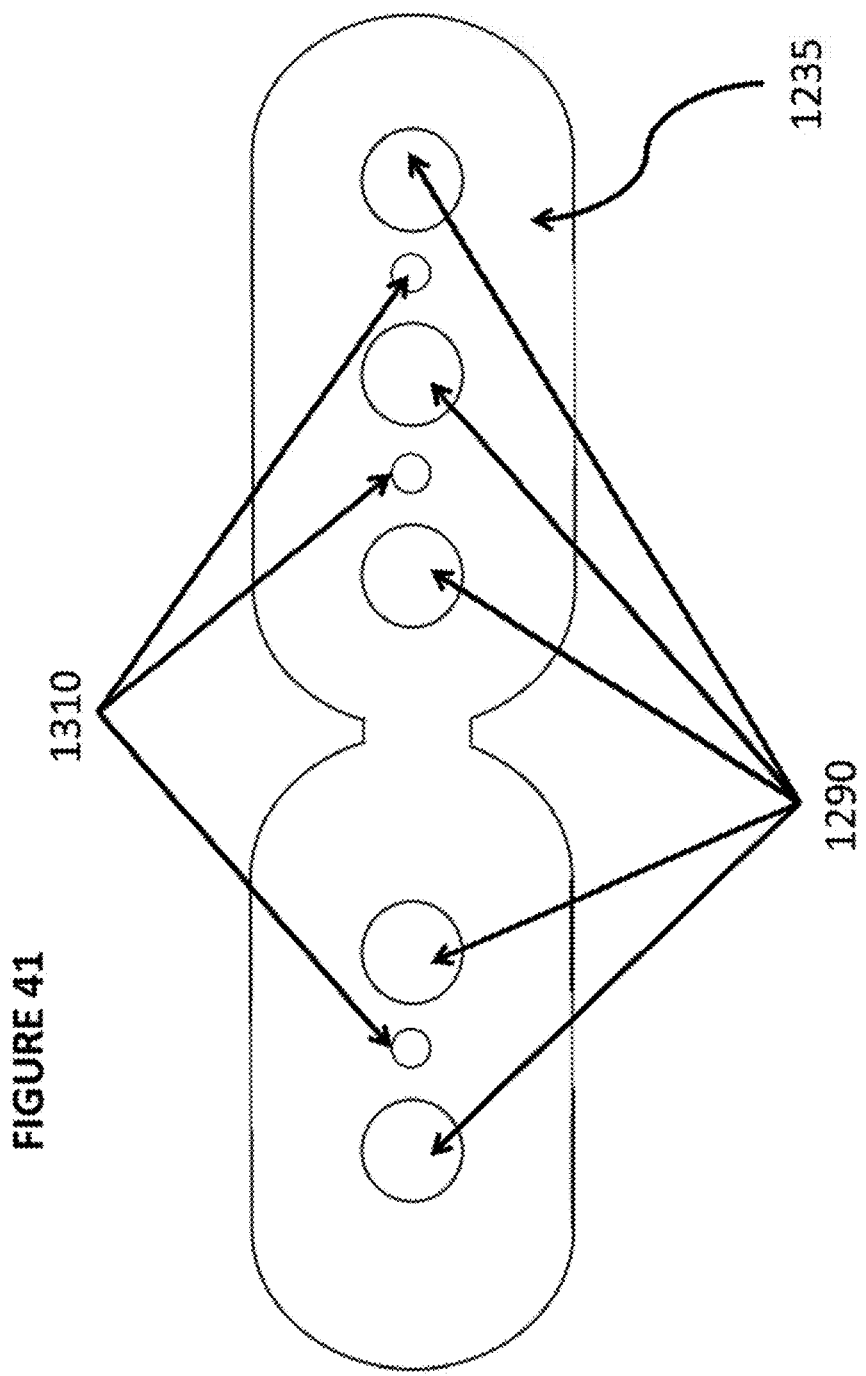
FIG. 41 is an exploded view of the cable conductors of the peelable/splitable cable with the cable tensile strength component in accordance with an exemplary embodiment of the claimed invention.
Figure 42A:
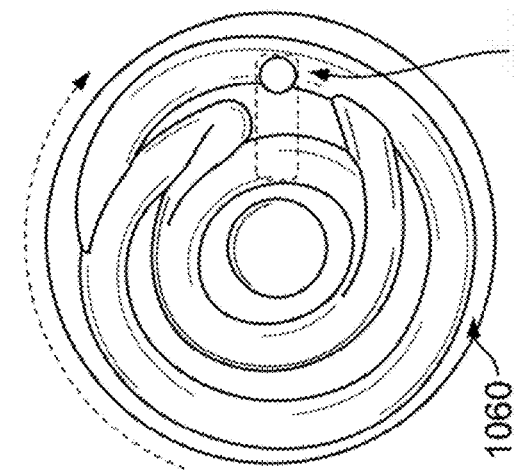
FIGS. 42A-D are views of the relative rotational movements of the ball bearing/pin tip and the groove track of the cable retractor in accordance with an exemplary embodiment of the claimed invention.
Figure 42B:
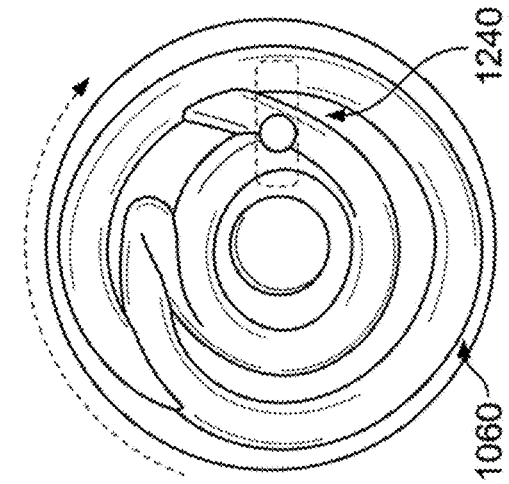
Figure 42C:
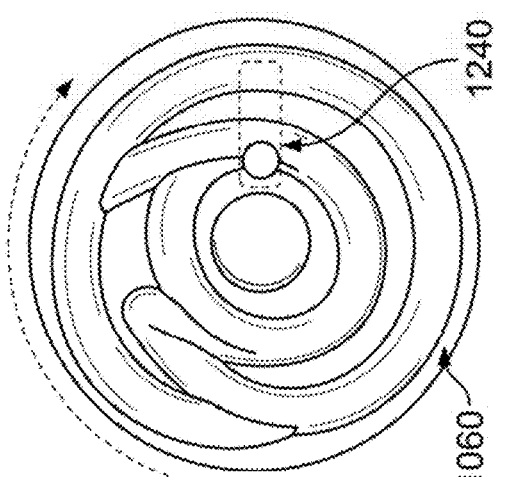
Figure 42D:
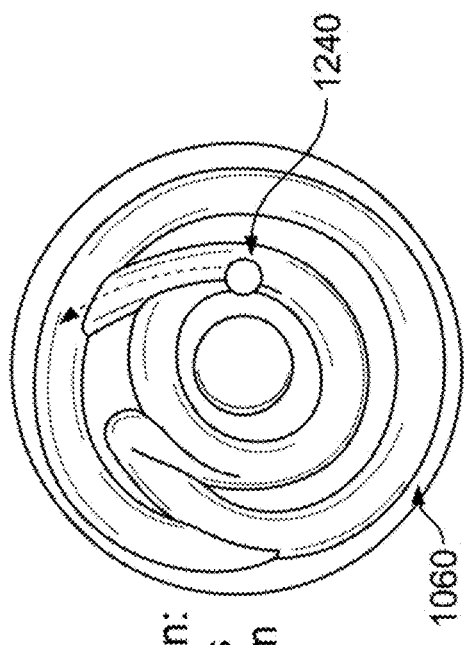

In accordance with an exemplary embodiment of the claimed invention, as shown in FIG. 41, the cable reinforcing component or cable tensile strength component 1310 adds tensile strength to the cable 1230 and minimizes the stretching and breaking of the cable 1230.

Figure 38:
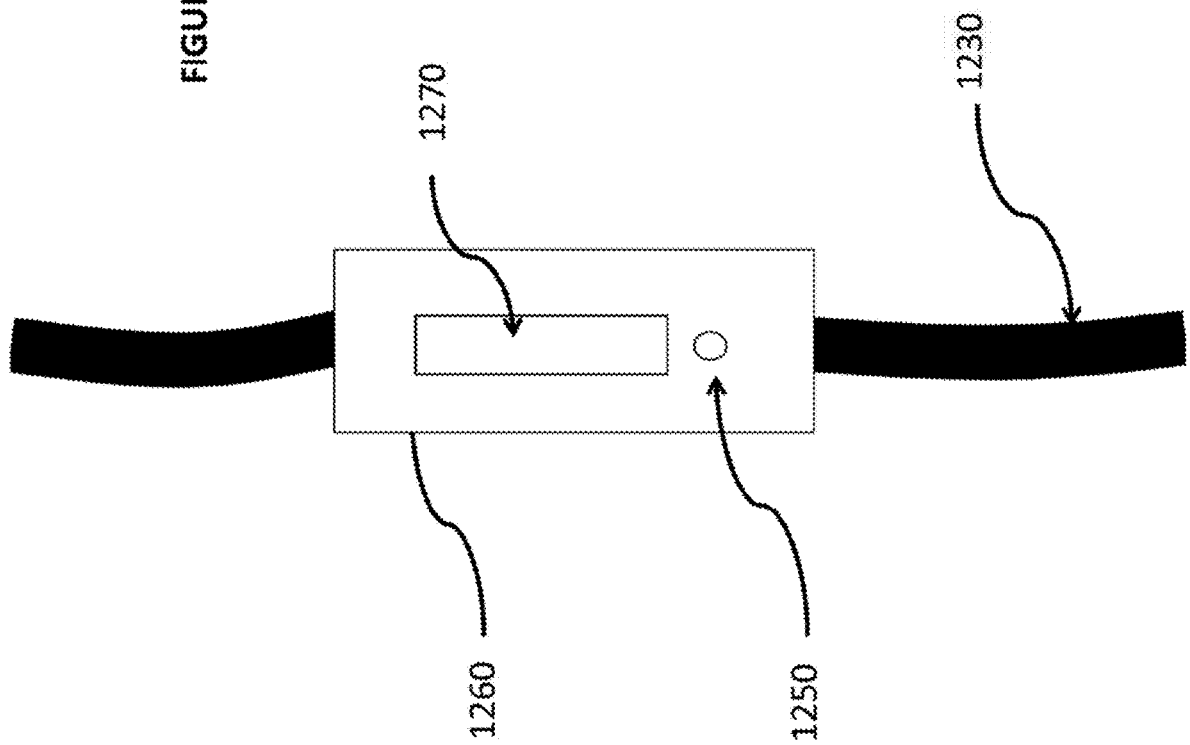
FIG. 38 is a view of the microphone housing of the peelable/splitable cable in accordance with an exemplary embodiment of the claimed invention.

As shown in FIGS. 37-38, in accordance with an exemplary embodiment of the claimed invention, the cable 1230 comprises a microphone housing 1260 with a microphone 1250. The microphone 1250 adds interactive functionality to the cable 1230 and the media control button 1270 provides operational control over music, videos, volume, calls as well as control over various other software element of the portable electronic device 110.

Figure 45:
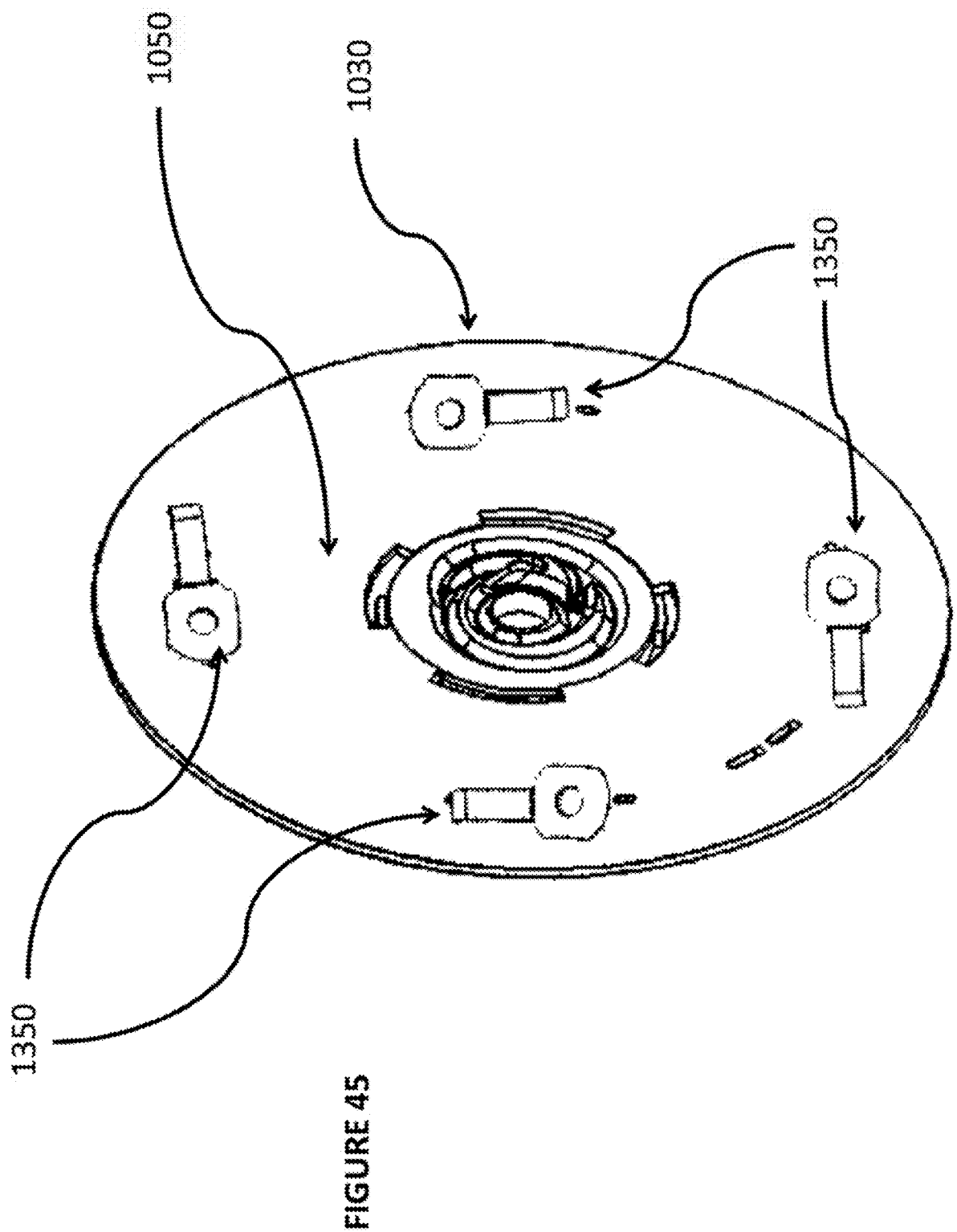
FIG. 45 is a view of the second face of the reel of the cable retractor with the contacts in accordance with an exemplary embodiment of the claimed invention.
Figure 46:
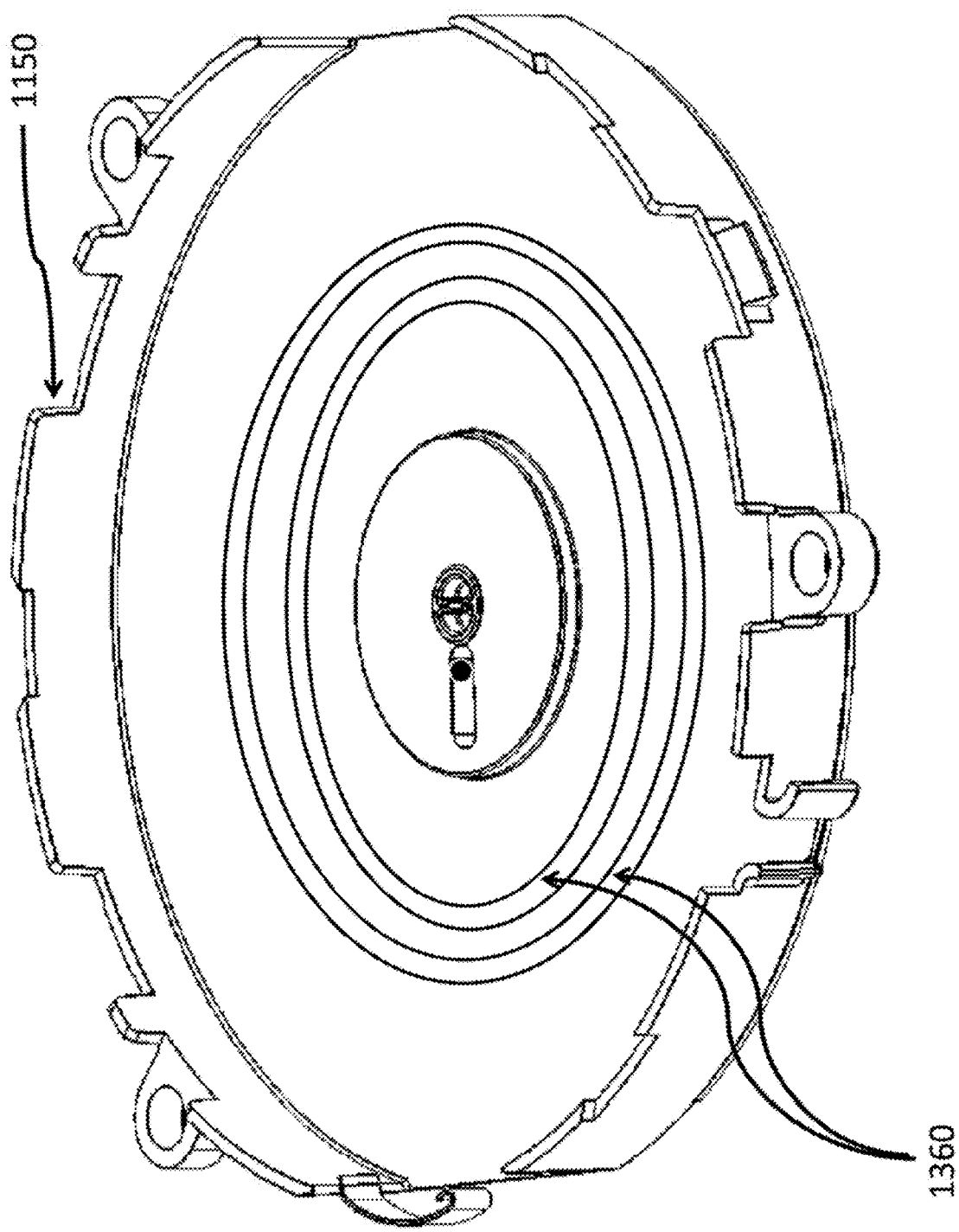
FIG. 46 is a perspective view of the bottom housing of the cable retractor with the slip rings in accordance with an exemplary embodiment of the claimed invention.

In accordance with an exemplary embodiment of the claimed invention, as shown in FIGS. 45-46, the cable retractor 1000 comprises electrical contacts or slips rings 1350. The electrical contacts 1350 and/or the slip rings 1360 can be arranged/mounted around the central round post or arbor 1200, on the spool 610, the reel 1030, on the top housing or cover 1010, or the bottom housing or cover 1150 of the cable retractor 1000. It is appreciated that the electrical contacts 1350 and/or the slip rings 1360 can be located anywhere on the housing of the cable retractor 1000. Also, it is appreciated that the electrical contacts 1350 and/or slip rings can be mounted in multiple areas of the cable retractor 1000, and in multiple shapes and sizes.

In accordance with an exemplary embodiment of the claimed invention, as shown in FIGS. 45-46, the electrical contacts 1350 on the second face 1050 of the reel 1030 is in electrical connection with the slip rings 1360 on the bottom housing 1150 of the cable retractor 1000 to transmit electrical signal between each other. This enables the cable retractor 1000 utilize a reel 1030 with just one area to store the cable 1230, thereby minimizing the overall size of the cable retractor 1000. In accordance with an exemplary embodiment of the claimed invention, the electrical contacts 1350 on the reel 1030 and the slip rings 1360 on the bottom housing 1150 electrically connects the two sections of the cable 1230 to an audio jack element or earphone plug 225, which connects to the portable or handheld electronic device 110. The first section of the cable 1230 resides with or within the cable retractor 1000 and the second section of the cable 1230 resides outside the cable retractor 1000 but within the protective housing 100. The electrical contacts 1350 and/or the slip rings 1360 permits the first section of the cable 1230 within the cable retractor 1000 to remain in electrical connection with second section of the cable 1230 within the protective case 100, thereby providing electrical connection from the end piece (e.g., earphones or ear buds 117, 119) to the plug head 225 and to the handheld electronic device 110.

In accordance with an exemplary embodiment of the claimed invention, the end piece (e.g., earphones or ear buds 117, 119) is located in a first section of the cable 1230 and the plug head 225 is located in a second section of the cable 1230. The electrical contacts 1350 and/or the slip rings 1360 moves or rotate the first section of the cable 1230 independent of the second section of the cable 1230 while maintaining an electrical connection between the two sections of the cable 1230.

In accordance with an exemplary embodiment of the claimed invention, the retractable storage system 100, 200 is a weatherproof housing system 1400 for a portable handheld electronic device 110. As exemplary shown in FIGS. 47A-B, the weatherproof housing system 1400 comprises a first housing member 1410 that couples to a second housing member 1420. One or more storage chambers 501, 605 are structured on the first housing member 1410 for storing an accessory item, connecting with one or more channels 213, 215, 216 wherein the channels lead to an accessory station 201, 510. The first housing member 1410 is operably shaped and sized to bound the handheld electronic device 110 and enable wrapping around the handheld device 110. First housing member 1410 can also comprise one or more channels to receive a sealing element 1430, such as a compressible gasket.

The second housing member 1420 comprises a plurality of side walls operably shaped and sized to bound the handheld electronic device 110 and enable wrapping around the handheld device 110. The second housing member 1420 can either be coupled directly to the first housing member 1410 or the second housing member 1420 can comprise an optional removable back wall, similar to the plug-in panel 300, that can couple to the first housing member 1410. The second housing member 1420 can also comprise a front transparent membrane or protective screen cover 1440 positioned over the front screen of the electronic device 110 which allows the user to interface, access, use and view the features of electronic device 110 through this transparent membrane or protective screen cover 1440. The second housing member 1420 can also comprise an open access area to the front screen of the portable handheld electronic device 110 to enable direct interface and usage with the electronic device 110. Second housing member 1420 can also include one or more channels to receive a sealing element 1430, such as a compressible gasket.

In accordance with an exemplary embodiment of the claimed invention, as shown in FIGS. 48A-E, the weatherproof housing system 1400 comprises a removable or permanent sealing element 1430, such as a gasket, rubber edge, tubing, TPE, flush compressed surfaces, adhesive, molding, elastic material, compressible foam, a combination of compressible foam and rubber material and the like to create a hermetic, airtight, waterproof, weatherproof seal or bond. The removable or permanent sealing element 1430 can protect the handheld electronic device 110 and the weatherproof housing system 1400 from damage, such as water, any liquid, moisture, air, dirt, snow, mud, rain, dust, debris and the like. In accordance with an exemplary embodiment of the claimed invention, the sealing element 1430 can be utilized in areas of the weatherproof housing system 1400 and electronic device 110 including but not limited to the interface between the first housing member 1410 and second housing member 1420, ports of the electronic device 110, accessory station aperture of the weatherproof housing system 1400, button areas of the weatherproof housing system 1400, the front open access area of the second housing member 1420 and any interface between components of the weatherproof housing system 1400 or between a component of the weatherproof housing system 1400 and the handheld electronic device 110. In accordance with an exemplary embodiment of the claimed invention, the weatherproof housing system 1400 further comprises a coupling element 1450 to couple the sealing element 1430 between components of the weatherproof housing system 1400 or between components of the weatherproof housing system 1400 and the handheld electronic device 110, including but not limited to a hinged door to fasten down the seal, a clasping mechanism, a snap-down or snap-in element, a male and female coupling element, such as tongue and groove, peg and hole.

In accordance with an exemplary embodiment of the claimed invention, the first housing member 1410 and second housing member 1420 are configured such that they can be coupled together to form one single unit or the first housing member 1410 can be removed so that the second housing member 1420 can be used as a stand-alone weather proof protective housing.

As shown in FIG. 48B, the second housing member 1420 or first housing member 1410 can contain one or more control elements 1460 to operate a corresponding control of the electronic device 110. In accordance with an exemplary embodiment of the claimed invention, each of one or more control element can have a molded overlay that seals the control element.

In accordance with an exemplary embodiment of the claimed invention, as shown in FIG. 48F, the second housing member 1420 or first housing member 1410 can contain a sound membrane material 1470 located around the acoustic apertures or sound ports of the electronic device 110 including but not limited to speaker and microphone ports. The sound membrane material 1470 is configured to allow the transmission of sound to and from the electronic device 110, through the weatherproof housing system 1400 and remain impermeable to liquid such as water.

In accordance with an exemplary embodiment of the claimed invention, the retractable storage system 100, 200 provides an electronic engagement/disengagement of an accessory item. The electronic disengagement of an accessory item allows the user to electronically disengage an accessory item 117, 119, 221, 223, 520, 550 connected to the portable handheld electronic device 110 without the need to physically disengage the accessory item from the portable handheld electronic device. In accordance with an aspect of the claimed invention, the plug or port electronic engagement/disengagement can be implemented using the software of the electronic device, an application of the electronic device, or third-party software to activate or deactivate at least one port or audio port of a portable handheld electronic device 110. As delineated herein, examples of accessory items suitable for electronic engagement/disengagement include but are not limited to: earbuds, headphones, speakers, a plughead, an audio plug, a charging plug, or any plug that transmits and receives data. For example, if the accessory item 530 is wired headphones, the claimed electronic disengagement allows the user to deactivate the headphones and thereby utilize the internal speakers or audio components of the portable handheld electronic device without physically disengaging the headphone plug 550 from the audio port 112 of the portable handheld electronic device.

In accordance with an exemplary embodiment of the claimed invention, the retractable storage system 100, 200 comprises a self-powered electric generating and battery charging system 1500 mounted on a portable handheld electronic device 110. The self-powered electric generating and battery charging system 1500 generates electricity by means of a physical interaction with a user via various methods, including but not limited to kinetic motion, linear induction, crank powered, windup powered and powered by general movement. The electricity produced by the system 1500 can be used to charge components 1530, such as battery, a capacitor or a super capacitor.

Figure 49:
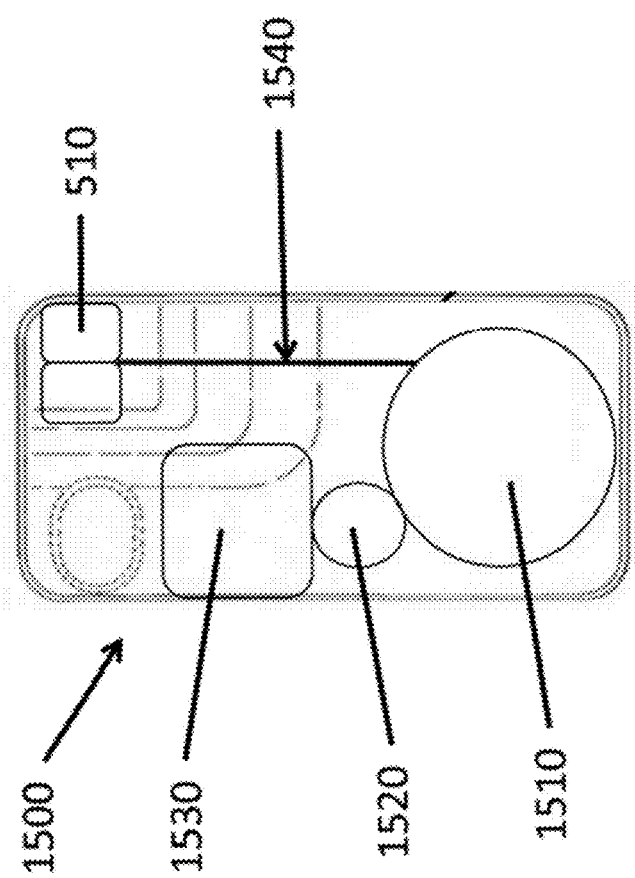
FIG. 49 is a view of self-powered electric generating and battery charging system in accordance with an exemplary embodiment of the claimed invention.

In accordance with an exemplary embodiment of the claimed invention, as shown in FIG. 49, the self-powered electric generating and battery charging system 1500 for generating and storing electricity comprises a retraction system or cable retractor 1510 that generates electricity by using the kinetic energy generated by retracting a cable 1540. When the cable 1540 retracts, the retraction system 1510 interacts with at least one electric generating component 1520 and charges a battery, a capacitor or a super capacitor 1530.

In accordance with an exemplary embodiment of the claimed invention, the cable retraction system 1510 is operably connected to the at least one electric generating component 1520, such as a DC generator, AC generator, self-excitation generator, linear electric generator, piezoelectric generator and the like, by including but not limited to gears, belts, magnets, pulleys and the like. The self-powered electric generating and battery charging system 1500 can charge or maintain power to components including but not limited to: an accessory item, such as a wireless earbuds 520, the handheld electronic device 110, or an external battery 500.

Figure 50:
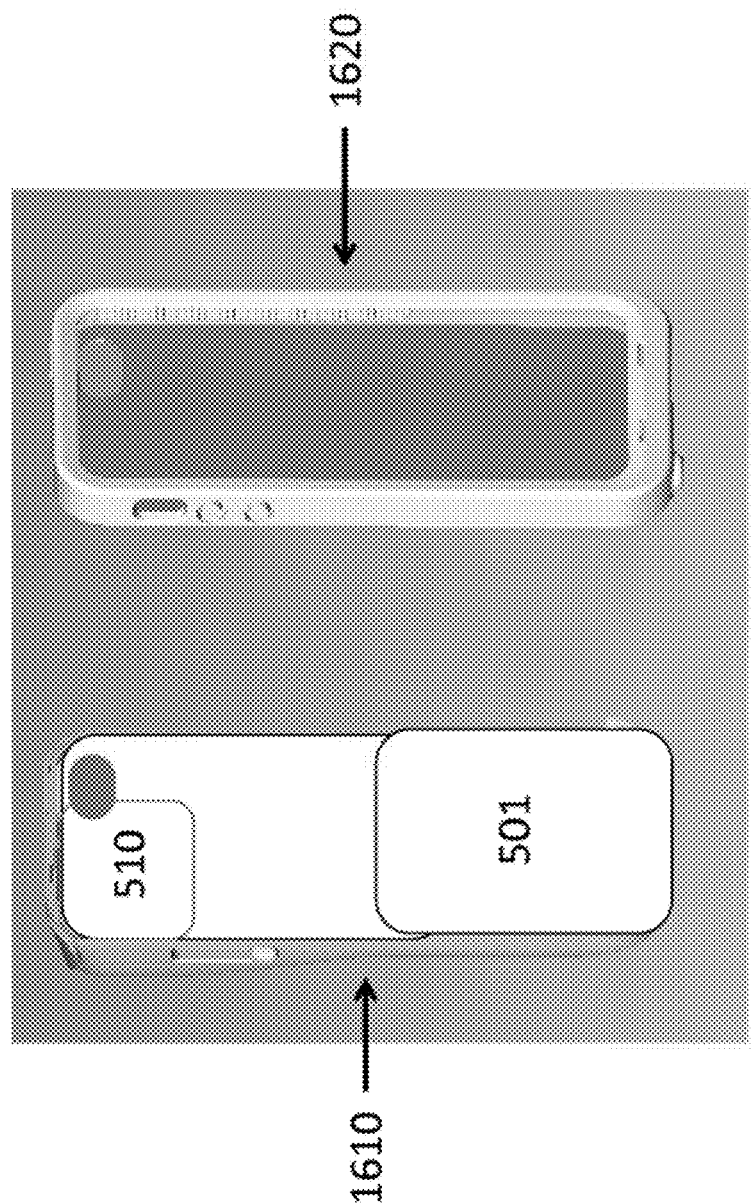
FIG. 50 is a view of a retractable storage system with removable back housing in accordance with an exemplary embodiment of the claimed invention.

In accordance with an exemplary embodiment of the claimed invention, as shown in FIG. 50, the retractable storage system 100, 200 comprises first protective housing member 1610 (similar to the plug-in panel 300). The first protective housing member 1610 is preferably manufactured separately from the second protective housing member 1620. The first protective housing member 1610 is removably mounted to the second protective housing member 1620. One or more storage chambers 501 are structured on the first protective housing member 1610 for storing an accessory item and connecting with one or more channels 213, 215. The channels 213, 215 leading to an accessory station 115, 201, 510.

In accordance with an exemplary embodiment of the claimed invention, the second protective housing member 1620 comprises an optional back wall and plurality of side walls forming a bounding member operative shaped and sized to bound the handheld device 110 and enable wrapping around the handheld device 110. The first protective housing member 1610 and second protective housing member 1620 are configured such that they can be coupled together to form one single unit or one of the protective housing member, e.g., the first protective housing member 1610, can be removed so that the remaining protective housing, e.g., the second protective housing member 1620, can be used as a stand-alone protective housing.

Figure 51:
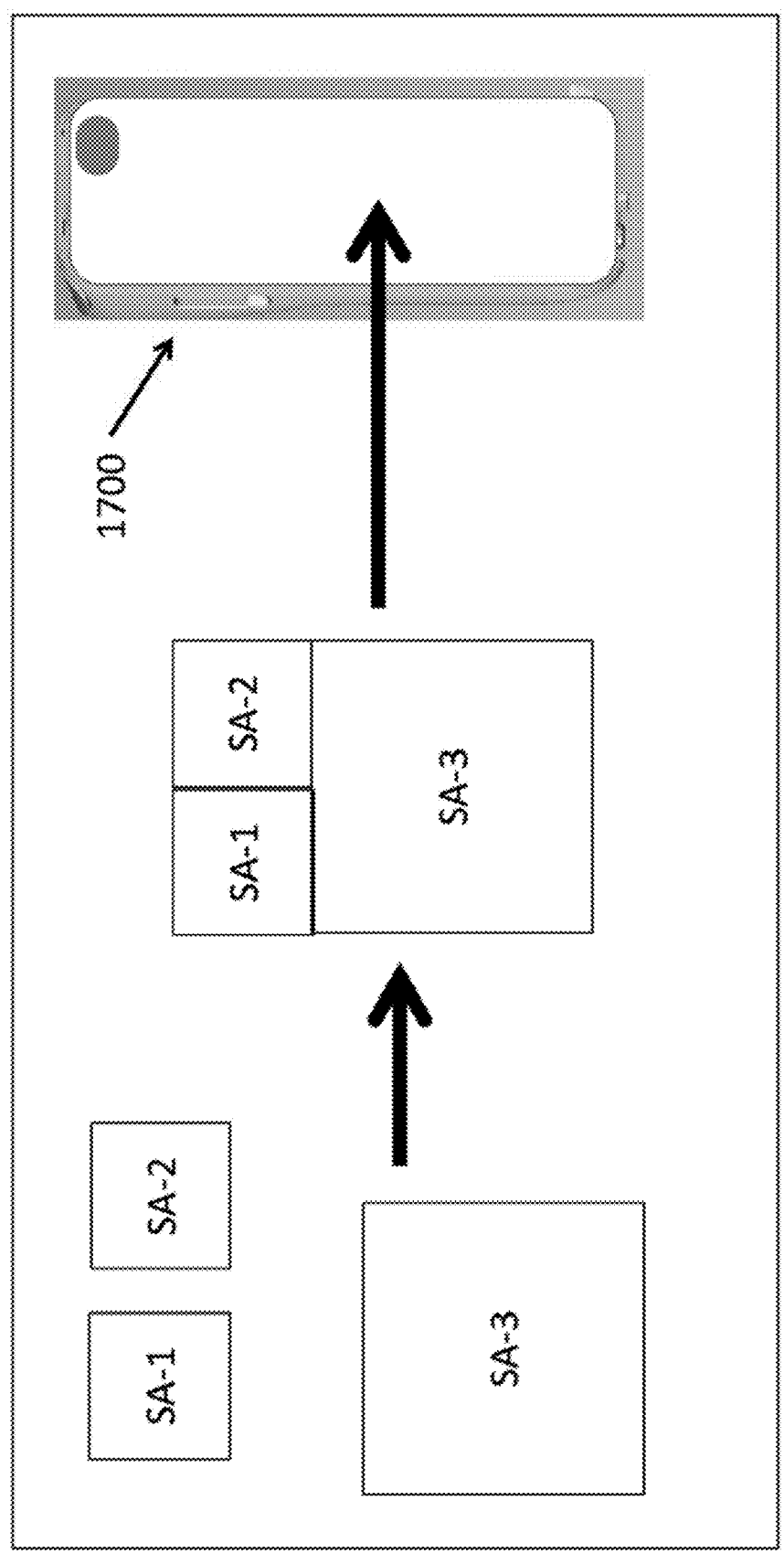
FIG. 51 is views of a retractable storage system with independent subassemblies that form a single mounting structure in accordance with an exemplary embodiment of the claimed invention.

In accordance with an exemplary embodiment of the claimed invention, as shown in FIG. 51, independent sub-assemblies (SA) are secured together to form a single unit that is secured into the housing member 1700. The independent subassemblies can be components, such as storage chamber 501, accessory station 115, 201, 510, battery 500, etc. The numerous benefits of this embodiment include, but are not limited to, (a) interchangeability of sub-assemblies allowing for customizable and non-fixed designs, (b) ease of manufacturing as smaller, easier to manufacture components are assembled/connected to form larger components which easily mount directly into or onto the housing member 1700, (c) elimination of the requirement for a separate mounting panel onto which components are assembled (that is, the sub-assemblies themselves connect to form the "panel" which mounts into the housing member 1700 resulting in reduced thickness and cost).

Figure 52C:
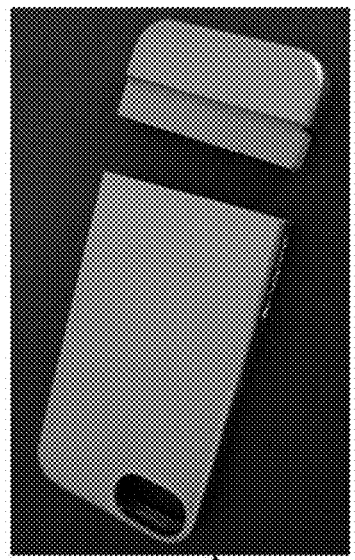
FIGS. 52A-C are views of a retractable storage system with two housing sections in accordance with an exemplary embodiment of the claimed invention.
Figure 52A:
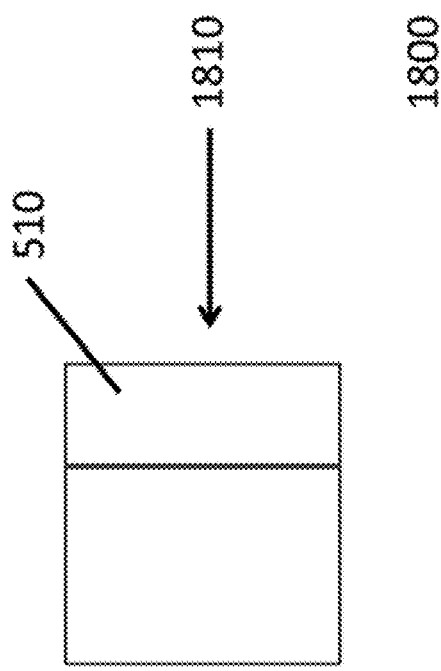
Figure 52B:
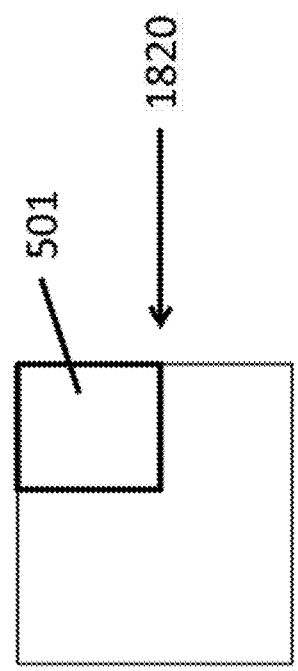

In accordance with an exemplary embodiment of the claimed invention, as shown in FIGS. 52A-C, the housing of a unified protective housing and accessory storage system 1800 comprises two sections: a top housing member 1810 and a bottom housing member 1820. The top housing member 1810 comprises a protective housing member having a back wall and plurality of side walls forming the upper portion of a bounding member 1800 operative shaped and sized to bound the handheld device 110 and enable wrapping around the handheld device 110. Further, the top housing member 1810 can comprise at least one accessory station 510 or storage chamber 501. The bottom housing member 1820 comprises a protective housing member having a back wall and plurality of side walls forming the lower portion of the bounding member 1800. Further, the bottom housing member 1820 can comprise at least one accessory station 510 or storage chamber 501.

Each housing member 1810, 1820 is configured such that the two housing members 1810, 1820 couple together to completely bound the handheld device 110 as well as operatively connect the respective storage chamber(s) 501 and accessory station(s) 510 to provide the unified protective housing and accessory storage system 1800.

In accordance with an exemplary embodiment of the claimed invention, the retractable storage system 1900 comprises interchangeable modules. The protective housing member 1910 comprises a back wall and plurality of side walls forming a bounding member operative shaped and sized to bound the handheld device 110 and enable wrapping around the handheld device 110. As exemplary shown in FIGS. 53A-55A, the protective housing member 1910 comprises one or more securing elements 1920 to secure modular components/accessories 1930 which are stored in or on the protective housing member 1910. As exemplary shown in FIGS. 53B-55B, the modular components/accessories 1930 further comprising securing elements 1940, which are compatible with the securing elements 1910 of the protective housing member 1910. As shown in FIGS. 53A-55B, examples of the securing elements 1920, 1940 include, but are not limited to, male and female element (e.g., tongue and groove, rack and drawer, peg and hole, etc.), magnetic, hook and loop fasteners, snaps, buttons, screws, glue, grid framework and the like.

In accordance with an exemplary embodiment of the claimed invention, the retractable storage system 1900 comprises a protective housing member 1910 having a back wall and plurality of side walls forming a bounding member operative shaped and sized to bound the handheld device 110 and enable wrapping around the handheld device 110. The protective housing member 1910 further comprises an enlarged compartment for storing an accessory item. In accordance with an exemplary embodiment of the claimed invention, the protective housing member 1910 can be casted from a single piece of plastic, produced from a single mold, or constructed such that the compartment is an integral part of the protective housing member 1910. Benefits of this embodiment include, but are not limited to, reduced assembly complexity, time, and cost.

In accordance with an exemplary embodiment of the claimed invention, as shown in FIGS. 57A-C, a protective housing 2110 for a handheld electronic device 110 comprises one or more enlarged compartments 2110 for storing an accessory item 530 and an aperture 2120 providing an access to or removal of the accessory item 530 stored in the enlarged compartment 2110. The protective housing 2100 further comprises a door, lid, cover, or any movable barrier 2130 compatible with the aperture 2120. The door 2130 can be closed to secure and protect the accessory item 530 stored within the enlarged compartment 2110. The door, when open, can be stored within the protective housing utilizing a door slot, opening, compartment, or chamber 2140. The purpose of the door slot 2140 includes, but is not limited to preventing the door 2130 from interfering with the use of the accessory item 530, protecting the door 2130 from loss or damage, improving user experience, and aesthetics. The door 2130 can be utilized to secure the accessory item 530 in a partially removed state. For example, if the accessory item 530 is wired headphones, the door 2130 can be shut on the cable 229, 231 to pinch or secure the cable 229, 231 at the users desired length as well as prevent debris from entering the protective housing 2100 or the enlarged compartment 2110 when the headphones are in use.

In accordance with an exemplary embodiment of the claimed invention, as shown in FIG. 57C, the door 2130 comprises one or more enlarged anchor points 2150 on the door 2130. The anchor 2160 prevents inadvertent removal of the door 2130 from the door slot 2140, but allows intentional removal and reinstallation of the door 2130. Purposes of such removal and reinstallation of the door 2130 include, but are not limited to: cleaning, repair, replacement with a substitute door, and collectability. In accordance with an exemplary embodiment of the claimed invention, one of the anchors 2160 is structured such that when the door 2130 is pulled from the door slot 2140, the anchor 2160 mechanically stops at the predetermined position to be pivoted over the aperture 2120 to close and secure the door 2130.

In accordance with an exemplary embodiment of the claimed invention, as shown in FIG. 57C, the door 2130 further comprises a snap, ribbed edge or securing element 2170 which mates with a compatible securing element 2180 on the protective housing 2100 to secure the door 2130 over the aperture 2120 and to prevent inadvertent opening of the door 2130.

In accordance with an exemplary embodiment of the claimed invention, as shown in FIGS. 58A-E, the cable retractor or cable retraction system 1000 is mounted within the interior of vehicles. The cable retractor 1000 comprises at least one motor spring 620 and cable 229, 231 operably mounted into or on a compartment, seat or area within the interior of a vehicle, such as an airplane 2210, a train or subway 2220, a car, truck or bus 2230, a ship or boat 2270, or a submersible vessel 2280. The cable retractor 1000 can be used to store and retract at least one cable 229, 231 with at least one end piece. End pieces of the cable can include but are not limited to at least one of the following components: earbuds, headphones, speakers, a plughead, an audio plug, a charging plug, or any plug that transmits and receives data.

In accordance with an exemplary embodiment of the claimed invention, as shown in FIG. 58C, the cable retraction system 1000 can be mounted into the dashboard, ceiling, floor, tables, center console, side walls, doors, arm rest or seat 2240 of a vehicle 2230, such as a car, truck or bus, for use by the driver or passenger of the vehicle 2230. As shown in FIG. 58B, the cable retraction system 1000 can be mounted into the ceiling, tables, floor, side walls, support rail, arm rest or seat 2250 of a train or subway 2220 for use by the passenger of the train or subway 2220. As shown in FIG. 58A, the cable retraction system 1000 can be mounted into the fuselage, ceiling, tables, floor, side walls, arm rest or seat 2260 of an airplane 2210, such as commercial or private passenger airplane, for use by the passengers, crew, or pilot of the airplane 2210.

In accordance with an exemplary embodiment of the claimed invention, as shown in FIGS. 59A-F, the cable retractor or cable retraction system 1000 is mounted into or on a protective helmet. The cable retractor 1000 comprises at least one motor spring 620 and cable 229, 231 operably mounted into or on a protective helmet, including but not limited to a motorcycle, dirtbike or ATV helmet 2310, a ski or snowboard helmet 2320, a bicycle or skateboard helmet 2330, a sport helmet 2340, such as a football, hockey or baseball helmet, a police, firemen or military helmet 2350 or a construction helmet 2360. The cable retraction system 1000 can be used to store and retract at least one cable 229, 231 with at least one end piece. End pieces of the cable 229, 231 can include but are not limited to at least one of the following components: earbuds, headphones, speakers, a plughead, an audio plug, a charging plug, or any plug that transmits and receives data.

In accordance with an exemplary embodiment of the claimed invention, as shown in FIGS. 60A-E, the cable retractor or cable retraction system 1000 is mounted into or on an article of clothing. The cable retractor 1000 comprises at least one motor spring 620 and cable 229, 231 operably mounted into or on an article of clothing, including but not limited to jackets, ski or snowboard jackets 2410, shirts 2420, pants or shorts 2430, sweaters or vests 2440, hats, caps or visors 2450. The cable retraction system 1000 can be used to store and retract at least one cable 229, 231 with at least one end piece. End pieces of the cable 229, 231 can include but are not limited to at least one of the following components: earbuds, headphones, speakers, a plughead, an audio plug, a charging plug, or any plug that transmits and receives data.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the embodiments of the claimed invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A waterproof storage system comprising:
a protective housing member configured to mate with a handheld electronic device;
the protective housing member comprising at least one charging station;
said at least one charging station is configured to form between a surface of the protective housing member and a surface of at least one accessory item of the handheld electronic device;
wherein the protective housing comprises a first housing part and a second housing part;
wherein at least one sealing element positioned between the first housing part and second housing part provides a waterproof seal to protect components of the waterproof storage system; and
wherein said at least one charging station is configured to charge said at least one accessory item.

2. The waterproof storage system of claim 1, wherein the protective housing member comprises one or more storage chambers configured to store and protect at least one of the following components: at least one power component and an integrated circuit.

3. The waterproof storage system of claim 2, wherein said at least one power component is configured to charge at least one of the handheld electronic device and said at least one accessory item.

4. The waterproof storage system of claim 1, wherein the charging station is powered by a component of said protective housing member or by a component of the handheld electronic device.

5. The waterproof storage system of claim 2, wherein said one or more one storage chambers is formed between a removable panel and the protective housing member.

6. The waterproof storage system of claim 1, further comprising an IC chip configured to control transmission of at least one of electrical power and data signals among the protective housing member, the handheld electronic device and said at least one accessory item.

7. The waterproof storage system of claim 1, wherein the protective housing member comprises at least one of the following: a wireless transmitter and an IC chip.

8. The waterproof storage system of claim 7, wherein the wireless transmitter is configured to facilitate a wireless connection between wireless components of the handheld electronic device and the protective housing member.

9. The waterroof storage system of claim 8, wherein a wireless signal is transferred to said at least one accessory item when said at least one accessory item is proximate to said accessory station.

\* \* \* \* \*